US008134681B2

(12) United States Patent
Okita

(10) Patent No.: US 8,134,681 B2
(45) Date of Patent: Mar. 13, 2012

(54) ADJUSTMENT METHOD, SUBSTRATE PROCESSING METHOD, SUBSTRATE PROCESSING APPARATUS, EXPOSURE APPARATUS, INSPECTION APPARATUS, MEASUREMENT AND/OR INSPECTION SYSTEM, PROCESSING APPARATUS, COMPUTER SYSTEM, PROGRAM AND INFORMATION RECORDING MEDIUM

(75) Inventor: Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 1179 days.

(21) Appl. No.: 11/706,377

(22) Filed: Feb. 15, 2007

(65) Prior Publication Data

US 2007/0219736 A1    Sep. 20, 2007

Related U.S. Application Data

(60) Provisional application No. 60/872,504, filed on Dec. 4, 2006.

(30) Foreign Application Priority Data

Feb. 17, 2006  (JP) ................................. 2006-041219

(51) Int. Cl.
  *G03B 27/32* (2006.01)
  *G03B 27/52* (2006.01)
  *G03B 27/42* (2006.01)
  *G03B 27/54* (2006.01)
(52) U.S. Cl. ................ 355/27; 355/30; 355/53; 355/77; 430/311; 396/611
(58) Field of Classification Search .................... 355/27, 355/30, 53; 396/611; 430/311; 702/81; 700/109, 110, 121; 356/237.4, 237.5
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 4,780,617 A | 10/1988 | Umatate et al. |

(Continued)

FOREIGN PATENT DOCUMENTS

DE        221 563 A1    9/1983

(Continued)

OTHER PUBLICATIONS

May 22, 2007 Written Opinion of the International Search Authority for PCT/JP2007/052815 (with translation).

(Continued)

*Primary Examiner* — Edward Glick
*Assistant Examiner* — Deoram Persaud
(74) *Attorney, Agent, or Firm* — Oliff & Berridge, PLC

(57) ABSTRACT

When a host issues an analysis order that specifically instructs the analytical contents to an analytical apparatus (step 401), the analytical apparatus collects two types of measurement and/or inspection results from a measurement and/or inspection instrument (steps 403 to 409), and in step 411, the analytical apparatus analyzes the measurement and/or inspection results and optimizes processing conditions of a series of processes related to wafer W. In step 411, data related to a processing state of a processing apparatus is acquired from the processing apparatus as needed. In step 413, the measurement and/or inspection results and the optimization results are accumulated in a database, and the optimization results are transmitted to various processing apparatuses (including the measurement and/or inspection instrument). After that, the analytical apparatus sends a processing end notice to the host (step 417).

37 Claims, 39 Drawing Sheets

U.S. PATENT DOCUMENTS

| | | | |
|---|---|---|---|
| 5,610,683 | A | 3/1997 | Takahashi |
| 5,715,039 | A | 2/1998 | Fukuda et al. |
| 5,825,043 | A | 10/1998 | Suwa |
| 5,969,441 | A | 10/1999 | Loopstra et al. |
| 6,509,201 | B1 | 1/2003 | Wright |
| 6,590,634 | B1 | 7/2003 | Nishi et al. |
| 6,778,257 | B2 | 8/2004 | Bleeker et al. |
| 6,943,569 | B1 | 9/2005 | Pressley et al. |
| 2003/0060917 | A1 | 3/2003 | Bun et al. |
| 2004/0165159 | A1 | 8/2004 | Lof et al. |
| 2005/0015165 | A1 | 1/2005 | Naya et al. |
| 2005/0271382 | A1* | 12/2005 | Ogata et al. .................. 396/611 |
| 2006/0250602 | A1 | 11/2006 | Sato et al. |
| 2006/0265099 | A1 | 11/2006 | Naya et al. |
| 2007/0058146 | A1* | 3/2007 | Yamaguchi ..................... 355/53 |

FOREIGN PATENT DOCUMENTS

| | | |
|---|---|---|
| DE | 224 448 AT | 3/1984 |
| JP | A-58-202448 | 11/1983 |
| JP | A-59-019912 | 2/1984 |
| JP | A-61-44429 | 3/1986 |
| JP | A-62-065326 | 3/1987 |
| JP | A-63-157419 | 6/1988 |
| JP | A-04-305915 | 10/1992 |
| JP | A-04-305917 | 10/1992 |
| JP | A-05-062877 | 3/1993 |
| JP | A-06-124873 | 5/1994 |
| JP | A-07-220990 | 8/1995 |
| JP | A-8-316125 | 11/1996 |
| JP | A-08-316125 | 11/1996 |
| JP | A 10-038812 | 2/1998 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-176727 | 7/1999 |
| JP | A-2000-58436 | 2/2000 |
| JP | A-2000-505958 | 5/2000 |
| JP | A 2001-167996 | 6/2001 |
| JP | A-2001-338870 | 12/2001 |
| JP | A 2003-100597 | 4/2003 |
| JP | A 2003-100598 | 4/2003 |
| JP | A 2005-033013 | 2/2005 |
| JP | A 2005-136364 | 5/2005 |
| JP | A 2005-252246 | 9/2005 |
| JP | A 2005-259830 | 9/2005 |
| WO | WO 99/49504 | 9/1999 |
| WO | WO 01/35168 | 5/2001 |
| WO | WO 2004/019128 A2 | 3/2004 |

OTHER PUBLICATIONS

Sep. 26, 2011 extended European search report in European Patent Application No. 07714345.1.

* cited by examiner

Fig. 8A
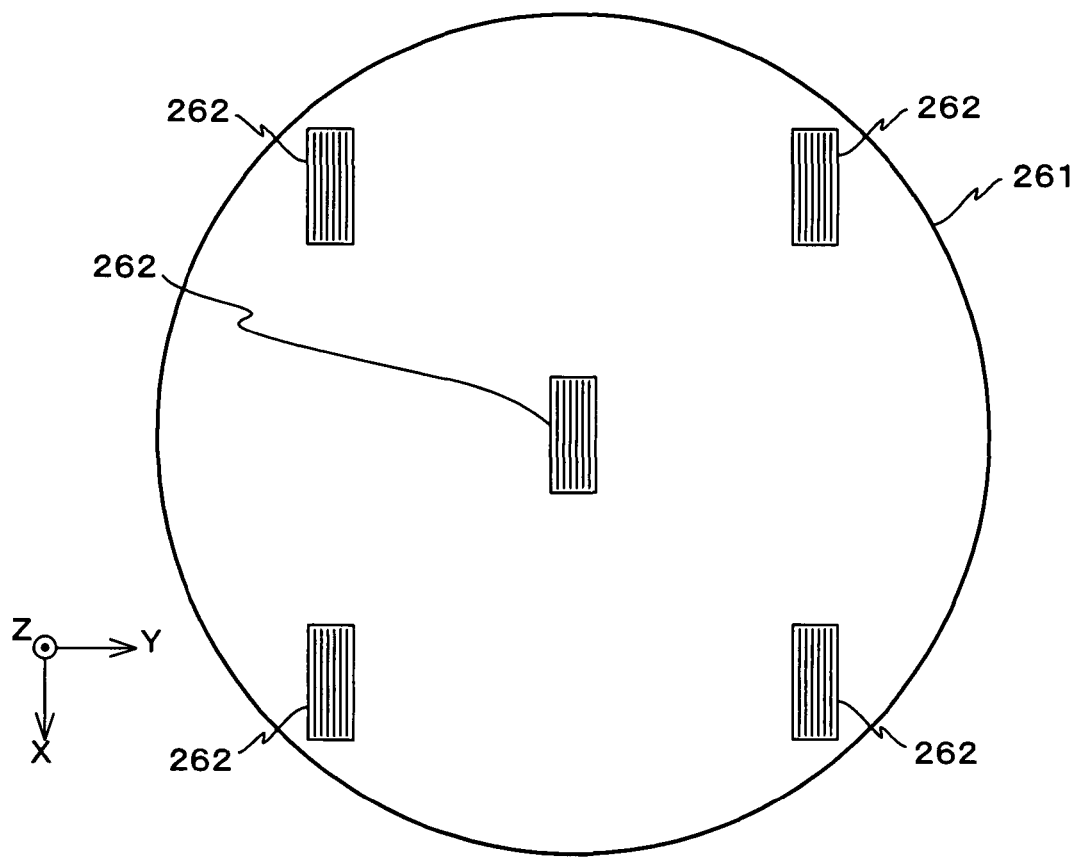
Fig. 8B
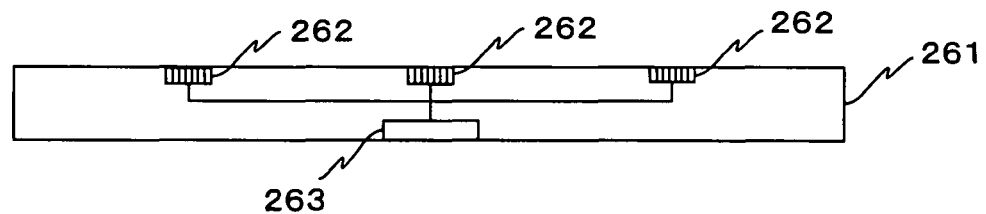
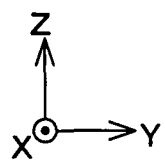

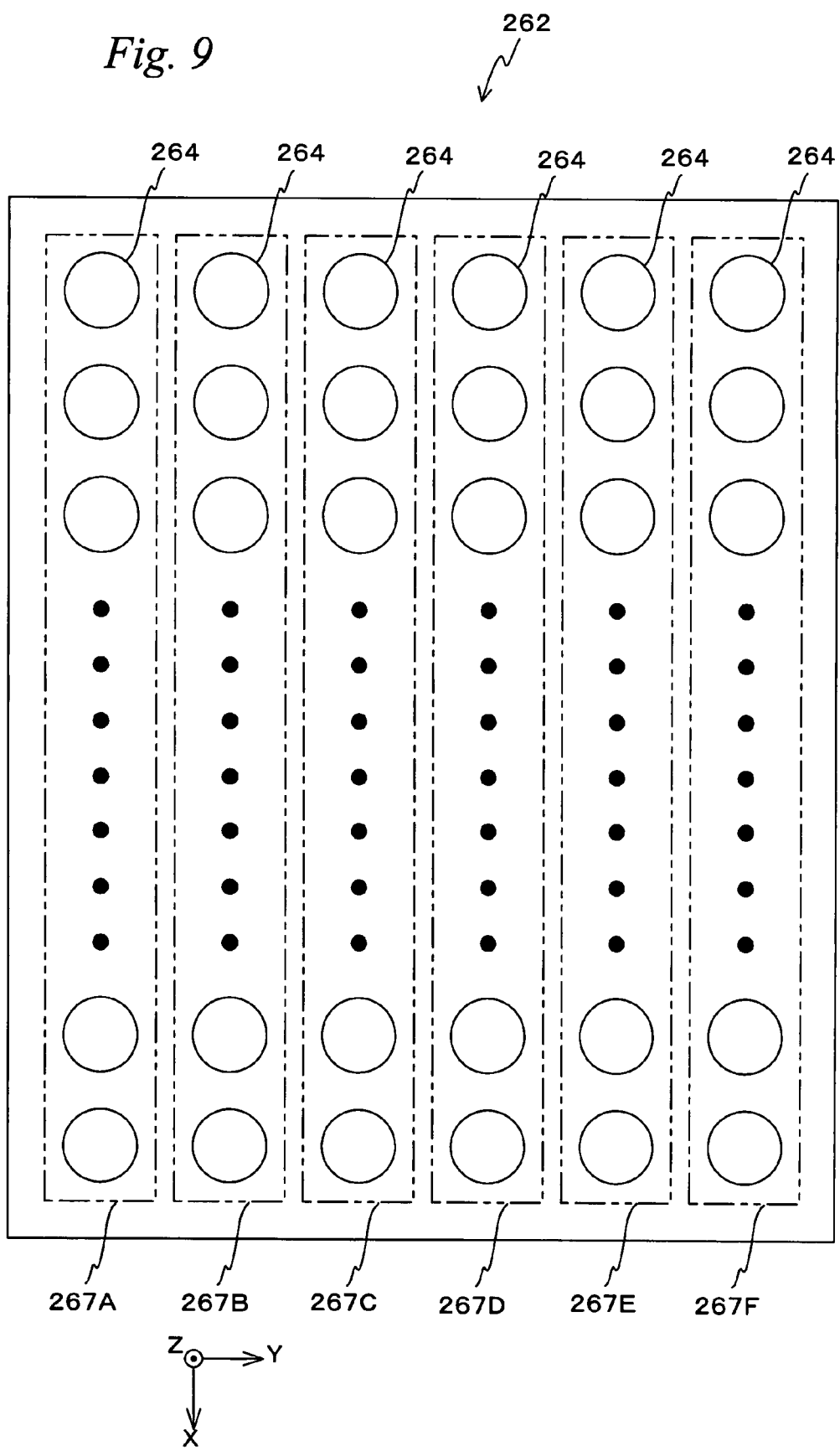

Fig. 11
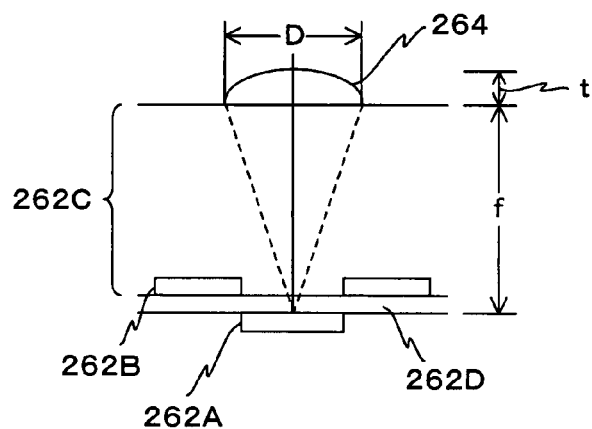
Fig. 12
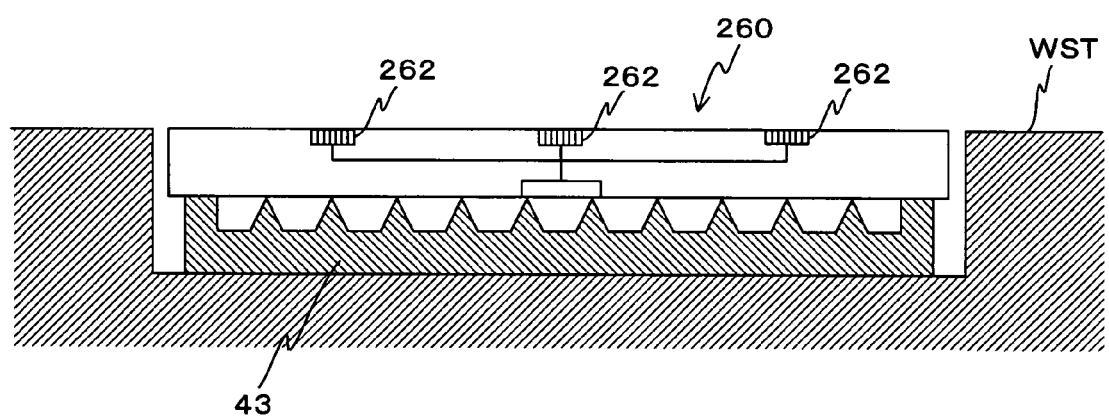
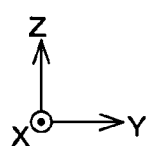

Fig. 28

| MAIN ITEM | SUBITEM (ESSENTIAL) | SUBITEM (FOR LIQUID IMMERSION EXPOSURE) | SUBITEM (SELECTION) |
|---|---|---|---|
| FILM FORMATION /RESIST COATING PROCESSING & WAFER MEASUREMENT/ INSPECTION PROCESSING (A) | ANTIREFLECTION FILM COATING | | |
| | | | ANTIREFLECTION FILM THICKNESS MEASUREMENT |
| | | | ANTIREFLECTION FILM APPEARANCE INSPECTION |
| | RESIST COATING | | |
| | | | RESIST FILM THICKNESS MEASUREMENT |
| | | | RESIST FILM APPEARANCE INSPECTION |
| | | TOPCOAT FILM COATING | |
| | | | TOPCOAT FILM THICKNESS MEASUREMENT |
| | | | TOPCOAT FILM APPEARANCE INSPECTION |
| WAFER MEASUREMENT/ INSPECTION PROCESSING (B) | | | ALIGNMENT PRE-MEASUREMENT |
| | | | FOCUS PRE-MEASUREMENT |
| | | | APPEARANCE INSPECTION |
| EXPOSURE PROCESSING | ALIGNMENT | | |
| | EXPOSURE | | |
| | | | LIQUID IMMERSION MONITORING |
| | | LIQUID REMOVAL | |
| WAFER MEASUREMENT/ INSPECTION PROCESSING (C) | | | APPEARANCE INSPECTION |
| PEB PROCESSING | | | |
| WAFER MEASUREMENT/ INSPECTION PROCESSING (D) | | | APPEARANCE INSPECTION |
| DEVELOPMENT PROCESSING | | | |
| WAFER MEASUREMENT/ INSPECTION PROCESSING (E) | | | PATTERN DEFECT INSPECTION |
| | | | PATTERN LINE WIDTH MEASUREMENT |
| | | | OVERLAY ERROR MEASUREMENT |
| ETCHING PROCESSING | | | |
| WAFER MEASUREMENT/ INSPECTION PROCESSING (F) | | | PATTERN DEFECT INSPECTION |
| | | | PATTERN LINE WIDTH MEASUREMENT |
| | | | OVERLAY ERROR MEASUREMENT |
| IMPURITY DIFFUSION PROCESSING/ WIRING PROCESSING | | | |
| | | | |
| PROBING PROCESSING | | | |
| REPAIR PROCESSING | | | |
| DICING PROCESSING | | | |
| PACKAGING PROCESSING | | | |
| BONDING PROCESSING | | | |

ADJUSTMENT METHOD, SUBSTRATE PROCESSING METHOD, SUBSTRATE PROCESSING APPARATUS, EXPOSURE APPARATUS, INSPECTION APPARATUS, MEASUREMENT AND/OR INSPECTION SYSTEM, PROCESSING APPARATUS, COMPUTER SYSTEM, PROGRAM AND INFORMATION RECORDING MEDIUM

CROSS-REFERENCE TO RELATED APPLICATIONS

This non-provisional application claims the benefit of Provisional Application No. 60/872,504 filed Dec. 4, 2006, the disclosure of which is hereby incorporated herein by reference in its entirety.

BACKGROUND OF THE INVENTION

1. Field of the Invention

The present invention relates to adjustment methods, substrate processing methods, substrate processing apparatuses, exposure apparatuses, inspection apparatuses, measurement and/or inspection systems, processing apparatuses, computer systems, programs and information recording media, and more particularly, an adjustment method in which processing conditions of a series of a plurality of substrate processings that include a measurement and/or inspection processing are adjusted, a substrate processing method in which a plurality of substrate processings that include an exposure processing of forming a pattern on a substrate and an inspection processing of inspecting a substrate are performed, a substrate processing apparatus that uses the adjustment method or the substrate processing method, an exposure apparatus and an inspection apparatus, a measurement and/or inspection system that implements at least one of a measurement processing and an inspection processing to a substrate that is subject to an exposure processing, a processing apparatus that executes a specific processing to a substrate that is subject to a liquid immersion exposure processing, a computer system that controls a processing process of the specific processing, a program that makes a computer execute a plurality of substrate processings that include an exposure processing of forming a pattern on a substrate and an inspection processing of inspecting a substrate, and a computer-readable information recording medium in which the program is recorded.

2. Description of the Background Art

A semiconductor device, a liquid crystal display device, an imaging device such as CCD (Charge Coupled Device), or a microdevice (electron device) such as a thin film magnetic head is manufactured by repeating a series of a plurality of substrate processings such as a film formation/resist coating processing, an exposure processing, a postbake (PEB) processing, a development processing and an etching processing to a substrate such as a wafer. In the series of substrate processings, when the individual substrate processing ends, a measurement and/or inspection processing to a substrate is performed and whether a state of the substrate is favorable or not is checked, for the purpose of improving the yield. A measurement and/or inspection processing of a film on a substrate after the film formation/resist coating processing, a defect inspection of a pattern formed on a substrate after the development processing or the etching processing, and the like are the examples. Measurement and/or inspection results of such a measurement and/or inspection processing are used for adjustment of various processing apparatuses that performs a substrate processing, such as a film forming apparatus, a coater/developer (C/D), an exposure apparatus, and an etching apparatus, in addition to judgment of quality of the substrate.

Adjustment of device manufacturing apparatuses based on a single measurement and/or inspection result has been conventionally preformed by, for example, adjusting the film forming apparatus or the coater in the case abnormality of a film is recognized in the measurement and/or inspection processing of the film on a substrate after the film formation/resist coating processing, or adjusting the exposure apparatus in the case abnormality is recognized in a pattern on a substrate after the exposure processing.

Recently, since the processing contents of a series of a plurality of substrate processings have been further complicated due to, for example, multilayered films formed on a substrate to cope with a finer device pattern, it is gradually becoming difficult to efficiently remove the cause of the abnormality based on a single measurement and/or inspection result.

Meanwhile, in the recent exposure apparatuses, the higher resolution has been required to cope with a finer device pattern, and an exposure apparatus that uses liquid immersion exposure techniques (liquid immersion exposure apparatus) that realizes the higher resolution and the wider depth of focus has begun to be introduced. By the introduction of the liquid immersion exposure, transfer of a finer device pattern can be performed than before. At present, in order to efficiently operate the liquid immersion exposure apparatus and the conventional exposure apparatus (dry exposure apparatus), the liquid immersion exposure apparatus is used for exposure of a layer that requires critical pattern transfer accuracy, for example, exposure in a contact hole process or a gate formation process (isolated line), and the conventional exposure apparatus is used for exposure of a layer that requires a relatively relaxed pattern transfer accuracy.

In general, the required accuracy becomes higher for a pattern that is formed on a substrate by liquid immersion exposure. Further, since liquid that remains on a substrate (remaining liquid) affects the processings such as the postbake, the development and the etching after exposure, it is necessary to remove the liquid completely and confirm that there is no remaining liquid. In this manner, an inspection such as an inspection of the remaining liquid that is different from a measurement and/or inspection for a substrate to which exposure is performed in the conventional exposure apparatus is preferably performed to a substrate to which liquid immersion exposure is performed. Under the present situation, however, the measurement and/or inspection processings under the similar measurement and/or inspection conditions are constantly performed to both of a substrate to which dry exposure is performed and a substrate to which liquid immersion exposure is performed because of the standalone configuration of a measurement and/or inspection instrument or the like.

SUMMARY OF THE INVENTION

The present invention has been made under such circumstances, and according to a first aspect of the present invention, there is provided an adjustment method in which a processing condition of a series of a plurality of substrate processings that include a measurement and/or inspection processing is adjusted the method comprising: a collection process of collecting information on at least two types of measurement and/or inspection results related to at least one substrate; an optimization process of optimizing a processing condition of at least part of the plurality of substrate processings based on the collected information on at least two types of measurement and/or inspection results; and a transmission process of transmitting information on the optimized processing condition to an apparatus that performs a relevant processing.

With this method, information on at least two types of measurement and/or inspection results of measurement and/or inspection processings that are included in a series of a plurality of substrate processings is collected, and based on the collected information on two types of measurement and/or inspection results, optimization of a processing condition of at least part of the plurality of substrate processings is performed. Then, information on the optimized processing condition is transmitted to an apparatus that performs a relevant processing. Therefore, more efficient optimization of the processing condition can be performed than the case when the processing condition is optimized using only one type of measurement and/or inspection result.

According to a second aspect of the present invention, there is provided a first substrate processing method, comprising: an adjustment process of adjusting a processing condition of a substrate processing using the adjustment method of the present invention. With this method, a processing condition of a substrate processing can appropriately be adjusted using the adjustment method of the present invention.

According to a third aspect of the present invention, there is provided a second substrate processing method in which a plurality of substrate processings that include an exposure processing of forming a pattern on a substrate by exposing the substrate and an inspection processing of inspecting the substrate afterward are performed, the method comprising: an acquisition process of acquiring information as to whether the exposure processing has been performed by liquid immersion exposure or dry exposure; and an adjustment process of adjusting a processing condition of a substrate processing using the adjustment method of the present invention, in the case the exposure processing is judged to have been performed by liquid immersion exposure based on the acquired information. With this method, a substrate condition of a substrate processing can appropriately be adjusted depending on whether the exposure processing has been performed by liquid immersion exposure or dry exposure.

According to a fourth aspect of the present invention, there is provided a third substrate processing method in which a plurality of substrate processings that include an exposure processing of forming a pattern on a substrate by exposing the substrate and an inspection processing of inspecting the substrate afterward are performed, the method comprising: an acquisition process of acquiring information as to whether the exposure processing is performed by liquid immersion exposure or dry exposure; an adjustment process of adjusting a processing content of at least part of the plurality of substrate processings in accordance with the acquired information; and a transmission process of transmitting the adjustment result to an apparatus that performs a relevant processing.

With this method, a processing content of at least part of the plurality of substrate processings is adjusted in accordance with information as to whether the exposure processing is performed by liquid immersion exposure or dry exposure. Then, the adjustment result is transmitted to an apparatus that performs a relevant processing. Therefore, by appropriately adjusting the processing condition in accordance with the exposure method that is performed to a substrate, the yield can be improved.

According to a fifth aspect of the present invention, there is provided a substrate processing apparatus that performs a substrate processing according to transmitted information using any one of four methods that are the adjustment method of the present invention and the first, second and third substrate processing methods of the present invention. With this apparatus, since a substrate processing can be performed under the processing condition that is optimized using any one of four methods that are the adjustment method of the present invention and the first to third substrate processing methods of the present invention, the yield can be improved.

According to a sixth aspect of the present invention, there is provided an exposure apparatus that performs exposure to a substrate according to transmitted information using the third substrate processing method of the present invention. With this apparatus, since exposure can be preformed under the processing condition that is optimized using the third substrate processing method of the present invention, the yield can be improved.

According to a seventh aspect of the present invention, there is provided a measurement and/or inspection apparatus that performs measurement and/or inspection of a substrate according to transmitted information using the third substrate processing method of the present invention. With this apparatus, since a measurement and/or inspection processing can be performed under the processing condition that is optimized using the third substrate processing method of the present invention, the yield can be improved.

According to an eighth aspect of the present invention, there is provided a first program that makes a computer execute a plurality of substrate processings that include an exposure processing of forming a pattern on a substrate by exposing the substrate and an inspection processing of inspecting the substrate afterward, the program making the computer execute: an acquisition procedure of acquiring information as to whether the exposure processing is performed by liquid immersion exposure or dry exposure; an adjustment procedure of adjusting a processing content of at least part of the plurality of substrate processings in accordance with the acquired information; and a transmission procedure of transmitting the adjustment result to an apparatus that performs a relevant processing.

With this program, since a processing content of at least part of the plurality of substrate processing is adjusted in accordance with information as to whether the exposure processing is performed by liquid immersion exposure or dry exposure, the processing condition can appropriately be adjusted in accordance with the exposure that is performed to a substrate and the yield can be improved.

According to a ninth aspect of the present invention, there is provided a first computer-readable information recording medium in which the first program of the present invention is recorded. Accordingly, by setting the first information recording medium in a computer and installing the first program inside the first information recording medium, the computer can be made to execute the first program of the present invention, which makes it possible to make the processing content of the substrate processing be appropriate.

According to a tenth aspect of the present invention, there is provided a second program that makes a computer system execute a processing process of a specific processing in which the specific processing that is unnecessary for a substrate that is subject to a dry exposure processing of irradiating exposure light on the substrate without liquid is executed to a substrate that is subject to a liquid immersion exposure processing of exposing the substrate with exposure light via liquid, the program making the computer system execute: a procedure of changing whether or not to execute the specific processing in the processing process to a substrate based on information that shows whether the substrate is subject to the liquid immersion exposure processing or the dry exposure processing.

With this program, with respect to only a substrate subject to the liquid immersion exposure processing, the processing process of a specific processing that is required for the substrate (processing peculiar to liquid immersion) can be executed.

According to an eleventh aspect of the present invention, there is provided a second computer-readable information recording medium in which a program that makes a computer system execute a processing process of a specific processing in which the specific processing that is unnecessary for a substrate that is subject to a dry exposure processing of irradiating exposure light to the substrate without liquid is executed to a substrate that is subject to a liquid immersion exposure processing of exposing the substrate with exposure light via liquid is recorded, wherein the program is a program that makes the computer system execute a procedure of changing whether or not to execute the specific processing in the processing process to a substrate based on information that shows whether the substrate is subject to the liquid immersion exposure processing or the dry exposure processing.

Accordingly, by setting the second information recording medium in a computer and installing the program inside the information recording medium (which is substantially the same as the second program of the present invention), the computer can be made to execute the second program of the present invention, and thus, with respect to only a substrate subject to the liquid immersion exposure processing, the processing process of the specific processing that is required for the substrate (processing peculiar to liquid immersion) can be executed.

According to a twelfth aspect of the present invention, there is provided a measurement and/or inspection system that implements at least one of a measurement processing and an inspection processing to a substrate that is subject to any one of a liquid immersion exposure processing of exposing the substrate with exposure light via liquid and a dry exposure processing of irradiating exposure light on the substrate without liquid, the system comprising: a specific measurement and/or inspection section that executes a specific measurement and/or inspection processing that is unnecessary for a substrate that is subject to the dry exposure processing to a substrate that is subject to the liquid immersion exposure processing, wherein whether or not the specific measurement and/or inspection section executes the specific measurement and/or inspection processing is changed, in accordance with information that shows whether a substrate is subject to the liquid immersion exposure processing or the dry exposure processing.

With this system, with respect to only a substrate subject to the liquid immersion exposure processing, a specific measurement and/or inspection processing that is required for the substrate (measurement and/or inspection processing peculiar to liquid immersion) can be executed.

According to a thirteenth aspect of the present invention, there is provided a processing apparatus that executes a specific processing that is unnecessary for a substrate that is subject to a dry exposure processing of irradiating exposure light to the substrate without liquid to a substrate that is subject to a liquid immersion exposure processing of exposing the substrate with exposure light via liquid, wherein whether or not to execute the specific processing to a substrate is changed in accordance with information that shows whether the substrate is subject to the liquid immersion exposure processing or the dry exposure processing.

With this apparatus, with respect to only a substrate subject to the liquid immersion exposure processing, a specific processing that is required for the substrate (processing peculiar to liquid immersion) can be executed.

According to a fourteenth aspect of the present invention, there is provided a computer system that controls a processing process of a specific processing in which the specific processing that is unnecessary for a substrate that is subject to a dry exposure processing of irradiating exposure light to the substrate without liquid is executed to a substrate that is subject to a liquid immersion exposure processing of exposing the substrate with exposure light via liquid, wherein whether or not to execute the specific processing in the processing process to a substrate is changed in accordance with information that shows whether the substrate is subject to the liquid immersion exposure processing or the dry exposure processing.

With this computer system, with respect to only a substrate subject to the liquid immersion exposure processing, a specific processing that is required for the substrate (processing peculiar to liquid immersion) can be executed.

BRIEF DESCRIPTION OF THE DRAWINGS

FIG. 8A and FIG. 8B are views each used to explain a liquid immersion monitor;

FIG. 9 is a view used to explain a CCD sensor module of the liquid immersion monitor;

FIG. 11 is a view used to explain the line sensor in FIG. 10;

FIG. 12 is a view used to explain the liquid immersion monitor installed on a substrate holder;

FIG. 28 is a table showing an individual processing in the process;

BEST MODE FOR CARRYING OUT THE INVENTION

An embodiment of the present invention will be described below, referring to FIGS. 1 to 46.

[Device Manufacturing System]

Figure 1:
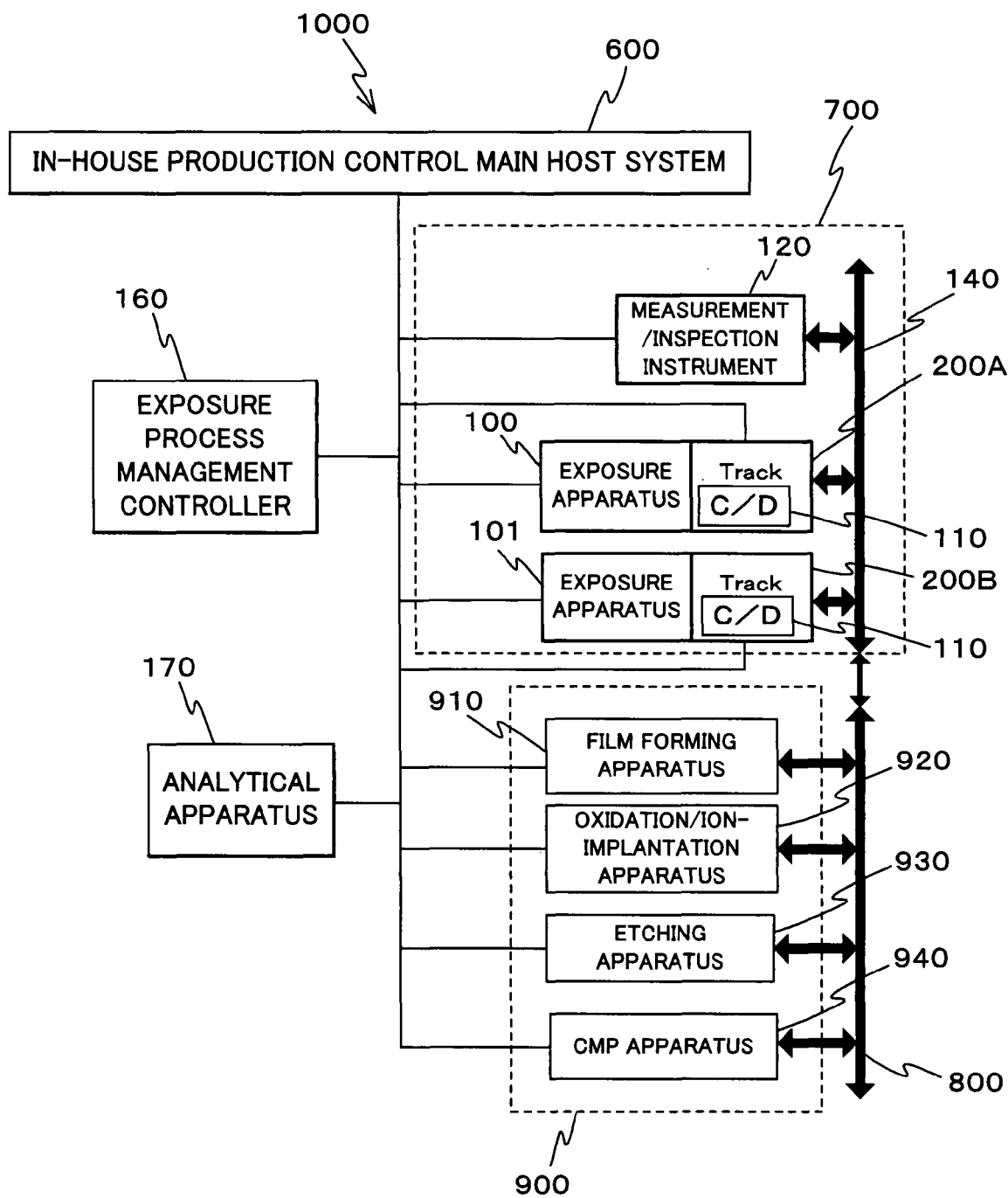
FIG. 1 is a view showing a schematic configuration of a device manufacturing system related to an embodiment of the present invention.

FIG. 1 shows the schematic configuration of a device manufacturing system 1000 related to an embodiment of the present invention. Device manufacturing system 1000 is, for example, a system that is constructed in a semiconductor plant, and is a system that manufactures semiconductor devices by processing wafers as substrates. As is shown in FIG. 1, device manufacturing system 1000 is equipped with an in-house production control main host system 600, an exposure cell 700, a carrier line 800, a device manufacturing apparatus group 900, an exposure process management controller 160, and an analytical apparatus 170.

[In-house Production Control Main Host System]

In-house production control main host system (hereinafter referred to as a "host") 600 is a main host computer that grasps the state of the entire (respective constituents of) device manufacturing system 1000 and performs the overall control of exposure cell 700, carrier line 800, device manufacturing apparatus group 900, exposure process management controller 160 and analytical apparatus 170. Host 600, exposure cell 700, carrier line 800 (to be more specific, the controller thereof), device manufacturing apparatus group 900, exposure process management controller 160 and analytical apparatus 170 are connected to each other via wired or wireless communication network or dedicated communication line, and data communication can be performed between them. Host 600 realizes the overall control of the entire system by the data communication.

Exposure cell 700 is equipped with two exposure apparatuses 100 and 101, two tracks 200A and 200B, a measurement and/or inspection instrument 120, and a carrier line 140.

Exposure apparatuses 100 and 101 are apparatuses that transfer a device pattern onto a wafer that is coated with photoresist. Exposure apparatus 100 is an exposure apparatus that performs exposure without using liquid immersion exposure techniques (so-called dry exposure), and exposure apparatus 101 is an exposure apparatus that performs exposure using liquid immersion exposure techniques (so-called liquid immersion exposure). In the following description, exposure apparatus 100 is also referred to as a dry exposure apparatus, and exposure apparatus 101 is also referred to as a liquid immersion exposure apparatus.

[Dry Exposure Apparatus]

Figure 2:
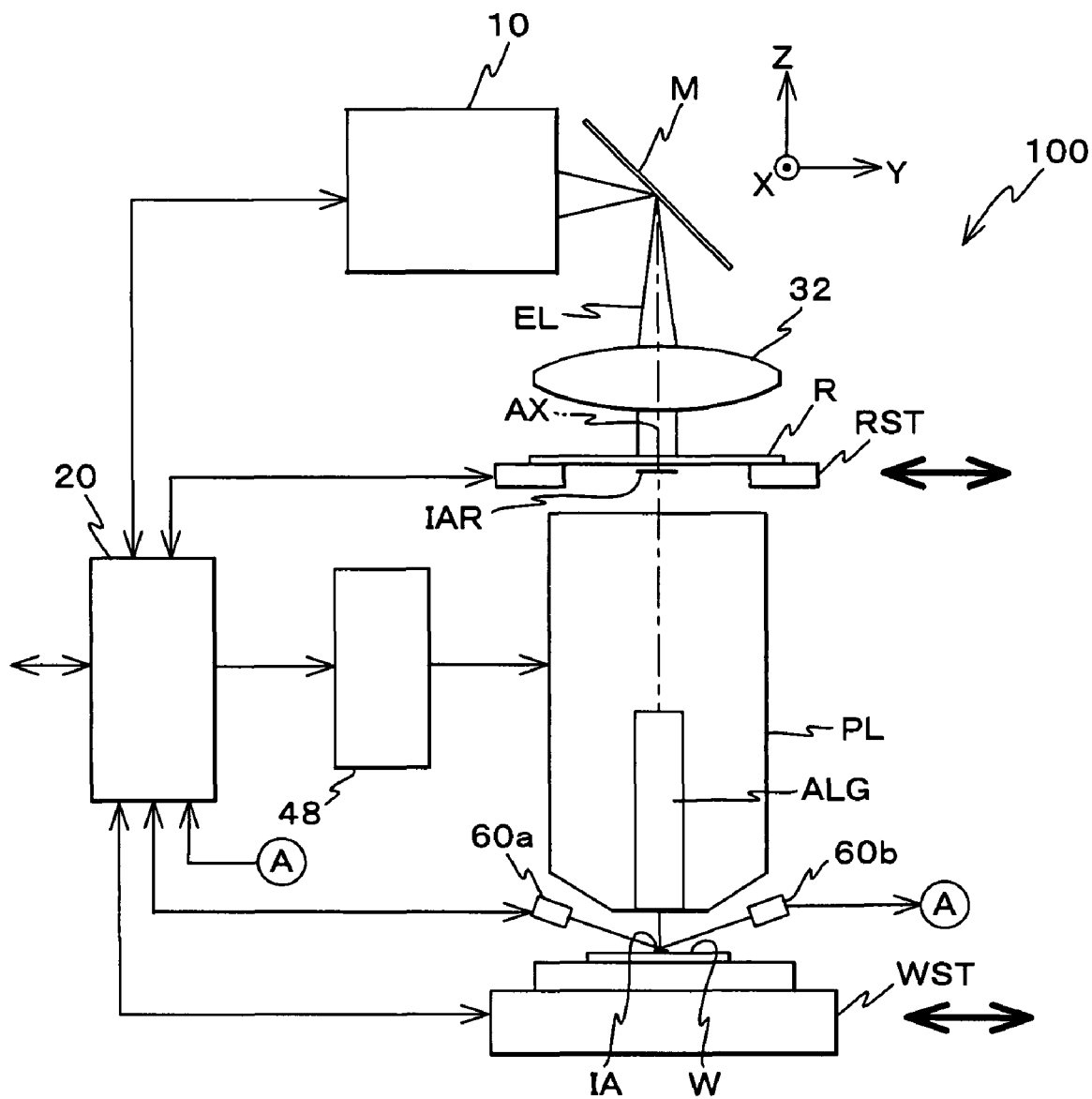
FIG. 2 is a view showing a schematic configuration of a dry exposure apparatus.

First of all, the configuration of exposure apparatus 100 will be described. FIG. 2 shows an example of the schematic configuration of exposure apparatus 100. Exposure apparatus 100 is equipped with an illumination system 10 that emits a coherent illumination light EL, a reticle stage RST that holds a reticle R on which a device pattern and the like that are illuminated by illumination light EL are formed, a both-side telecentric projection optical system PL that projects the device pattern and the like that have been illuminated by illumination light EL, a wafer stage WST that holds a wafer W that becomes subject to exposure, a main controller 20 that performs the overall control of these constituents, and the like.

Illumination light EL from illumination system 10 illuminates a device pattern such as a circuit pattern that is formed on reticle R held on reticle stage RST. An irradiation area of illumination light EL is to be an illumination area IAR. Illumination light EL passing through illumination area IAR is incident on wafer W held on wafer stage WST via projection optical system PL (whose optical axis is to be "AX"). With this operation, a projected image of the device pattern within illumination area IAR is formed in an irradiation area (exposure area) IA on wafer W of illumination light EL that is conjugate with illumination area IAR.

Herein, an XYZ coordinate system that uses a coordinate axis parallel to optical axis AX of projection optical system PL as a Z-axis will be considered. Wafer stage WST can move on a moving plane parallel to an XY plane, and also can adjust the surface of wafer W in a Z-axis direction, a θx (rotation around an X-axis) direction and a θy (rotation around a Y-axis) direction. Reticle stage RST can move in a Y-axis direction synchronously with wafer stage WST. By the synchronous scanning of both stages WST and RST in the Y-axis direction in accordance with a projection magnification of projection optical system PL, the surface of wafer W traverses exposure area IA synchronously with a device pattern on reticle R traversing illumination area IAR. With this operation, the entire device pattern on reticle R is transferred onto wafer W. Exposure apparatus 100 transfers the device pattern on reticle R in a plurality of different areas on wafer W by repeating the relative synchronous scanning of both stages RST and WST described above and the stepping of wafer stage WST with respect to illumination light EL. That is, exposure apparatus 100 is an exposure apparatus by a scanning exposure (step-and-scan) method.

Main controller 20 is quipped with an exposure dose control system that controls intensity (exposure dose) of illumination light, a stage control system that performs synchronous control of both stages RST and WST, autofocus-leveling control (hereinafter, simply referred to as "focus control") that matches the surface of wafer W within a depth of focus of projection optical system PL, and the like, a lens control system that controls image-forming performance of projection optical system PL (none of which is shown), and the like.

The exposure dose control system performs feedback control in which an exposure dose is controlled so as to coincide with a target value based on detection values of various exposure dose sensors that can detect the exposure dose.

The stage control system performs position control and velocity control of both stages RST and WST in which the positions of stages RST and WST are controlled so as to coincide with the target positions, based on measurement values of interferometers and the like that measure the positions of stages RST and WST.

Out of the stage control system, a control system that performs synchronous control of both stages WST and RST is to be a synchronous control system and a control system that controls the Z-position of the stage position (wafer surface) (i.e. the position of wafer W in the focus direction of projection optical system PL), and a rotation amount around the X-axis and the Y-axis (a tilt of the wafer surface with respect to a projected image of a device pattern) is to be a focus control system.

The synchronous control system performs synchronous control of both stages RST and WST during scanning exposure, and performs feedback control based on the measurement values of the interferometers and the like so that the synchronous error between the stages can be reduced. Further, in exposure apparatus 100, a multipoint AF (Autofocus) sensor (60a, 60b) that detects the focus/leveling deviation of the wafer surface at a plurality of detection points is arranged. The focus control system performs feedback control in which, for example, around 9 detection points are selected among the plurality of (e.g. 7×7=49) detection points of the multipoint AF sensor (60a, 60b), the height and tilt of the wafer surface are obtained from the detection values of 9 channels at the selected detection points, and the wafer surface corresponding to exposure area IA is made to match the image plane of projection optical system PL.

The target value of exposure dose in the exposure control system and the target value of focus of the focus control system are decided taking a device pattern to be transferred onto wafer W into consideration. Consider a plane having an exposure dose as a horizontal axis and focus as a vertical axis. Within this plane, consider a frame (window) that indicates a range that can be set as the target value of exposure dose and the target value of focus. This frame is called a process window. Any exposure dose or focus within the process window can be set as the control target value. The process window is decided, taking into consideration a line width in design of a device pattern, a relation between the exposure dose and the focus with which a pattern line becomes uniform, a balance between the resolution of projection optical system PL and the depth of focus, and the like. When the depth of focus of the projection optical system becomes larger, the width of the process window in the focus direction can be set wider.

Projection optical system PL contains a plurality of optical systems (not shown) such as dioptric elements (lens elements). Out of theses lens elements, some lens elements are movable lenses whose position and attitude can be adjusted from the outside by the lens control system. Each of the lens elements can be shifted and driven in the X-axis, Y-axis, and Z-axis (optical axis) directions and can also be rotated and driven in a rotation direction around each axis (θx, θy and θz), that is, can be driven in directions of six degrees of freedom. The lens control system monitors the atmospheric pressure, the temperature within a chamber of exposure apparatus 100, the exposure dose and the temperature of lenses of projection optical system PL, computes the magnification variation amount of projection optical system PL and the focus variation amount based on the monitoring results, and then performs adjustment of the pressure inside projection optical system PL and adjustment of lens spacing of the movable lens elements based on the variation amounts using an image-forming characteristics correction controller 48. With this operation, the best focus position and the magnification follow the target values.

[Control System Parameter]

In exposure apparatus 100, several factors that set the operations of the exposure dose control system, the stage control system and the lens control systems described above are parameterized. They are called control system parameters. The values of the control system parameters can freely be set within an appropriate range. The control system parameters are roughly divided into adjustment system parameters that require suspension of the process and apparatus adjustment when the setting values are changed, and non-adjustment system parameters that do not require apparatus adjustment.

Several representative examples of the adjustment system parameters will be described. First, regarding the exposure dose control system, there are an adjustment parameter of an exposure dose sensor (not shown) that detects an exposure dose, an adjustment parameter of an illuminance measurement sensor (not shown) that measures intensity of illumination light on the wafer surface, and the like. Further, regarding the synchronous control system, there are parameters such as a coefficient value of a correction function for correcting bending of movable mirrors that are arranged on stages WST and RST to reflect a laser beam from interferometers for position measurement of stages WST and RST, position loop gain of feedback control, velocity loop gain, constant of integration and the like. Further, regarding the focus control system, there are a focus offset that is an offset adjustment value of focus control when matching the wafer surface and an optimal image-forming plane by projection optical system PL on exposure, a leveling adjustment parameter for matching the wafer surface and the optimal image-forming plane of projection optical system PL on exposure, linearity of a position detection device (PSD) that is a sensor at an individual detection point of the multipoint AF sensor (60a, 60b), offset among sensors, detection repeatability of each sensor, offset among channels, an AF beam irradiation position (i.e. detection point) on the wafer, other parameters relating to AF plane correction, and the like. Either of the values of these adjustment system parameters needs to be adjusted by calibration or test operation of the apparatus.

Next, several representative examples of the non-adjustment system parameters will be described. First, regarding the exposure dose control system, for example, there are a parameter related to selection of an ND filter in illumination system 10, an exposure dose target value and the like. Further, regarding the synchronous control system, for example, there are scan velocity of both stages WST and RST during exposure and the like. Further, regarding the focus control system, for example, there are the number and the placement of focus sensors, that is, the selection state of focus sensors, a parameter related to focus level difference correction, a fine adjustment amount of focus offset, a scan direction on an edge shot (chipped shot) of the wafer outer edge, and the like. Among the foregoing parameters, the selection state of focus sensors is an important parameter for highly accurate focus control. The wafer surface is not completely flat, and has unevenness even within an area that is covered by all the detection points of the multipoint AF sensor (60a, 60b). Accordingly, in order to accurately position the wafer surface within exposure area IA into the depth of focus of projection optical system PL, it is preferable to select the detection points so that the surface height of the wafer surface that is detected by each detection point becomes as uniform as possible. Further, the height of the wafer surface that is detected by each detection point of the multipoint AF sensor (60a, 60b) is sometimes affected by a film thickness of a resist film or the like at the detection point. In order to reduce the influence of the film thickness, it is preferable to select detection points so that the film thickness of the resist film at points that are detected by the detection points becomes as uniform as possible.

Either of the setting values of these parameters are a parameter whose value can be changed without performing calibration of the apparatus, and most of them are designated by the exposure recipe. Incidentally, the ND filter is selected by the result of a check (average power check) that is performed only once in a state where an exposure dose target value is properly set (e.g. to the minimum) at the time of starting exposure to a certain wafer W. Further, by the selection of the ND filter, the scan velocity is also finely adjusted to some extent.

A line width and a transfer position of a device pattern on wafer W are deviated from design values due to each control error of exposure dose, synchronous accuracy and focus. Then, in exposure apparatus 100, time-series data of control amount related to exposure dose error obtained from the exposure dose control system (exposure dose trace data), time-series data of control amount related to synchronous accuracy error obtained from the synchronous control system (synchronous accuracy trace data), time-series data of control amount related to focus error obtained from the focus control system (focus trace data), and time-series data of control amount related to lens control error obtained from the lens control system of projection optical system PL (lens trace data) are logged. The logged trace data are utilized for optimization of parameters in analytical apparatus 170, as will be described later.

[Wafer]

Figure 3A:
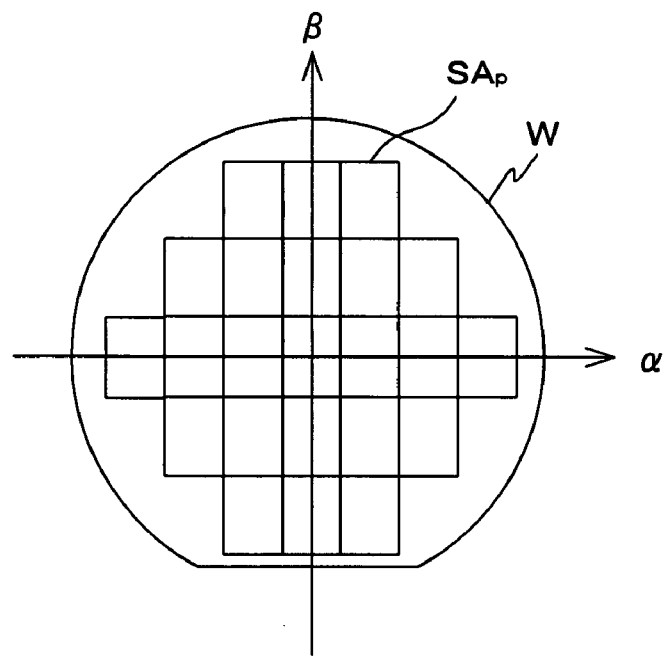
FIG. 3A is an entire view of a wafer and FIG. 3B is an enlarged view of part of the wafer.
Figure 3B:
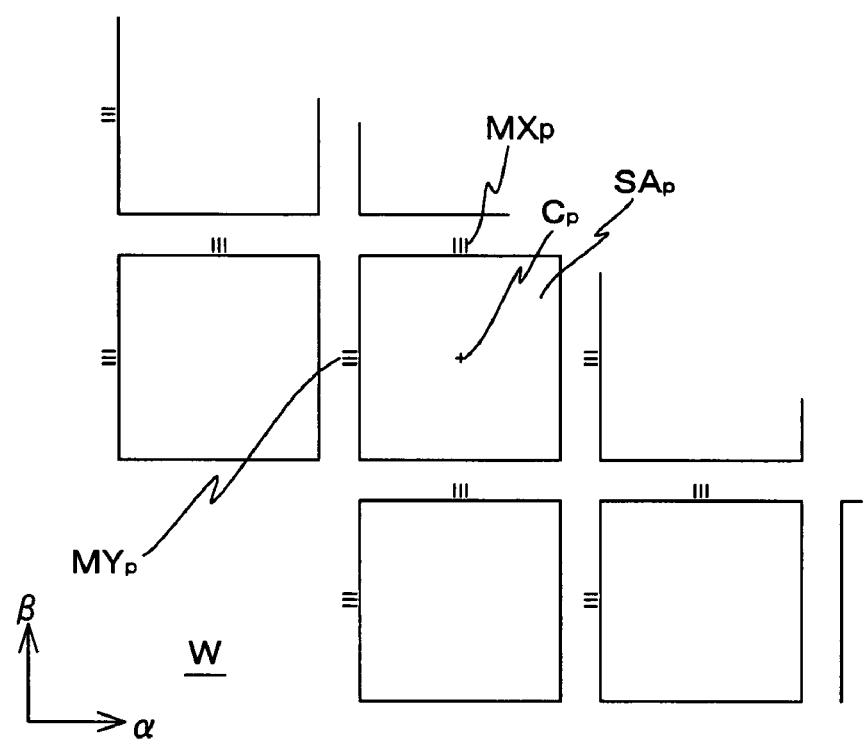

FIG. 3A shows an example of wafer W that becomes subject to exposure in exposure apparatus 100. As is shown in FIG. 3A, on wafer W, a device pattern is formed in a plurality of areas $SA_p$. Area $SA_p$ is also called a shot area. As is shown in FIG. 3B, in each shot area $SA_p$, wafer marks ($MX_p$, $MY_p$) are arranged. The wafer mark ($MX_p$, $MY_p$) is a mark with which position information can be detected from its shape or the like. For example, in FIG. 3B, the wafer mark ($MX_p$, $MY_p$) is shown as a line-and-space mark. As the shape of the wafer mark, besides the line-and-space mark, a box mark or a cross mark can be employed, or the wafer mark may also be a level difference mark that is formed by unevenness of a base of the wafer, or a bright-dark mark that is formed by difference of reflectance.

In exposure apparatus 100, a device pattern on reticle R needs to be accurately overlaid and exposed to shot areas $SA_p$ on wafer W. In order to realize accurate overlay exposure, the position of each shot area $SA_p$ needs to be known accurately. The wafer marks are arranged for knowing the position of each shot area $SA_p$ (position of the center $C_p$). Since the wafer marks ($MX_p$, $MY_p$) are transferred and formed together with the device pattern of shot area $SA_p$ where the wafer marks are arranged, the positional relation between the wafer marks and the shot area is substantially fixed, and when the positions of the marks are obtained, the center position $C_p$ of the shot area can be obtained.

Incidentally, wafer W, shot areas $SA_p$ and the wafer marks ($MX_p$, $MY_p$) shown in FIGS. 3A and 3B are merely examples, and the size, the number per shot area, the array state, the shape and the like can appropriately be changed.

Referring back to FIG. 2, in exposure apparatus 100, an alignment system ALG is arranged for measuring the positions of the wafer marks ($MX_p$, $MY_p$). Alignment system ALG photoelectrically detects unevenness of the base of wafer W or distribution of reflectance in the vicinity of the wafer mark ($MX_p$, $MY_p$), using an alignment sensor that is equipped inside. A photoelectric conversion signal equivalent to the wafer surface including the wafer mark ($MX_p$, $MY_p$) is obtained by the photoelectric detection, and waveform data corresponding to the photoelectric conversion signal can be obtained. Alignment system ALG extracts a waveform (mark waveform) corresponding to the wafer mark ($MX_p$, $MY_p$) from the detected waveform data, and detects the position of the mark based on the extraction results. Alignment system ALG computes the position of the wafer mark ($MX_p$, $MY_p$) on the XY coordinate system-based on the detected position of the mark within the detection field and the XY position of the detection field itself of the alignment sensor. In exposure apparatus 100, the transfer position of the device pattern is decided based on the computation results.

Incidentally, in order to perform accurate overlay exposure of a device pattern, position information of all shot areas $SA_p$ on wafer W may be measured. However, the throughput could be affected by doing so. Thus, in exposure apparatus 100, the global alignment technique is employed in which the wafer marks that are actually measured are limited and the array of shot areas $SA_p$ on the wafer (the shot array that is set by an $\alpha\beta$ coordinate system in FIG. 3A) is statistically estimated from position information of the measured wafer marks. In exposure apparatus 100, as the global alignment, wafer alignment by a so-called EGA method is employed in which the deviation of actual shot array with respect to design shot array is expressed in a polynomial with X and Y as independent variables, and valid coefficients in the polynomial are obtained by performing statistical computation. In the wafer alignment by the EGA method, first, several shot areas $SA_p$ with which the wafer marks subject to measurement are measured are selected. The selected shot areas are called samples shots. Alignment system ALG measures the positions of the wafer marks (sample marks) that are arranged with the sample shots. Hereinafter, such measurement operation is referred to as the EGA measurement.

In the wafer alignment by the EGA method, a correction amount that indicates the XY position coordinate of each shot area is estimated by statistical computation based on the measurement results of the EGA measurement, that is, position information of the several sample marks. Hereinafter, such computation is referred to as the EGA computation. Incidentally, the wafer alignment by the EGA method is disclosed in, for example, Kokai (Japanese Unexamined Patent Application Publication) No. 61-044429 (the corresponding U.S. Pat. No. 4,780,617) and the like.

The XY correction amount of the position of each shot area that is obtained by the above-described polynomial is referred to as the EGA correction amount. Since the coefficients of the polynomial obtained in the wafer alignment by the EGA method are obtained by the least-squares method, the difference (nonlinear error component) remains between the actually measured value of the mark position and the mark position corrected by the EGA correction amount. The difference is called a residual error. As a matter of course, the residual error is preferably smaller from the viewpoint of the accuracy.

One of measures to be taken to reduce the residual error is to heighten the order of the EGA polynomial model. For example, when making the EGA polynomial model not be a primary expression but be a quadratic expression or a cubic expression, the residual error naturally becomes smaller. In the case the order of the polynomial is heightened, however, the number of sample shots need to be increased accordingly.

Further, in the case the measurement results of some sample marks remarkably deviate from the actual shot array, the entire residual error tends to be larger. Accordingly, the measurement positions of such sample marks are preferably rejected so as not to be used in the EGA computation. That is, it is also possible to increase estimation accuracy by not using some of the positions of sample marks obtained by the EGA measurement in the EGA computation. Thus, the selection of the number and/or the placement of sample marks is an important factor for the wafer alignment by the EGA method.

[Alignment-related Parameter]

In exposure apparatus 100, several factors that set the operation related to wafer alignment by the EGA method using alignment system ALG are parameterized, and the setting values thereof can be adjusted as alignment-related parameters. The alignment-related parameters are roughly divided into waveform processing parameters that do not require re-measurement by the alignment system for adjustment of the values, and actual-measurement-required parameters that require the re-measurement.

As the waveform processing parameters, for example, there is the combination of sample marks (the number and/or positions of sample marks) that are selected from the already measured sample marks and are actually used for the EGA computation. In other words, in the case all the measured sample marks are not used in the EGA computation but the EGA computation is performed using the appropriate combination of the sample marks out of the measured sample marks, the combination becomes the waveform processing parameter. Further, designation of sample marks to be rejected per mark or per shot area, a reject limit value (a threshold that serves as a datum when judging whether or not to reject a sample mark from the EGA computation) at the time of mark detection, and the like are included in the waveform processing parameters.

Further, in the case the alignment system is equipped with plural types of alignment sensors and performs mark detection with all the sensors, the type of alignment sensor that detects waveform data used in actual detection of mark position (the FIA (Field Image Alignment) method or the LSA (Laser Step Alignment) method) is also included in the waveform processing parameters. Further, processing conditions with respect to the waveform data, that is, signal processing conditions (signal processing algorithm (an edge extraction method, a template matching method, a loopback autocorrelation method or the like, a slice level or the like) are also included in the waveform processing parameters.

Further, the types of the EGA polynomial model (such as a 6-parameter model, a 10-parameter model, an inside-shot averaging model, a shot factor indirect application model, and a high-order EGA processing condition (usage order and usage correction coefficient)), a weighted EGA processing condition, an extension EGA processing condition of EGA optional function (such as an inside-shot multipoint EGA implementing condition, an EGA computation model, and a shot component correction condition), a correction amount (such as an alignment correction value) to be added to a measurement position of the measured mark, and the like are also included in the waveform processing parameter. These parameters used to express the shot array such as the EGA polynomial model can also be classified into linear correction parameters that correct a liner component of the shot array, and nonlinear correction parameters that are used to correct a nonlinear component of the shot array. Since a nonlinear component of the shot array is expressed as a high-order function or a map of the XY coordinate system in most cases, the nonlinear correction parameter generally becomes the coefficient or a correction amount on the map.

Further, in the actual-measurement-required parameters, the types of sample marks (including the case where the mark shapes are different), the number and/or the placement (in the case of measuring new sample points), an illumination condition (such as an illumination wavelength, a bright/dark field, illumination intensity, or the existence/nonexistence of phase difference illumination) when illuminating marks at the time of mark measurement, a focus state (such as a focus offset) at the time of mark detection, and the designation of an alignment sensor when changing an alignment sensor to be used for mark detection, and the like are included. In particular, the detected mark waveform changes due to a resist film depending on the wavelength of illumination light in some cases, the wavelength of illumination light should carefully be set.

The control parameters and the alignment-related parameters are not limited to those described above. Further, all the control parameters and the alignment-related parameters are basically variable. However, it is also possible that all the control parameters and the alignment-related parameters are not made to be variable but some of the parameters are made to be invariable (fixed). When doing so, which parameters are made to be fixed can be appropriately selected at a user's discretion.

As is described above, in exposure apparatus 100, as the apparatus parameters, the control parameters and the alignment-related parameters can be set. The setting values of these parameters need to be adjusted beforehand to some extent so that a device pattern on reticle R is favorably transferred onto wafer W.

Main controller 20 is a computer system that controls various constituents of exposure apparatus 100 as is described above. Various operations of exposure apparatus 100 described above are realized by overall control by main controller 20, and the exposure dose control system, the synchronous control system, the focus control system, the lens control system, and the like described above are contained within main controller 20. Further, main controller 20 is connected to a communication network that is set up within device manufacturing system 1000, and data can be sent to and received from the outside via the communication network. Via the communication network, main controller 20 receives the command and operates, or sends trace data of various control errors to analytical apparatus 170, or receives information on parameters that have been optimized by analytical apparatus 170 and sets them inside.

[Liquid Immersion Exposure Apparatus]

Next, the configuration of exposure apparatus 101 will be described. As is described earlier, exposure apparatus 101 is an exposure apparatus that exposes wafer W via liquid (performs exposure using so-called liquid immersion exposure techniques) in order to improve the resolution by substantially shortening the exposure wavelength and also to substantially widen the depth of focus.

Figure 4:
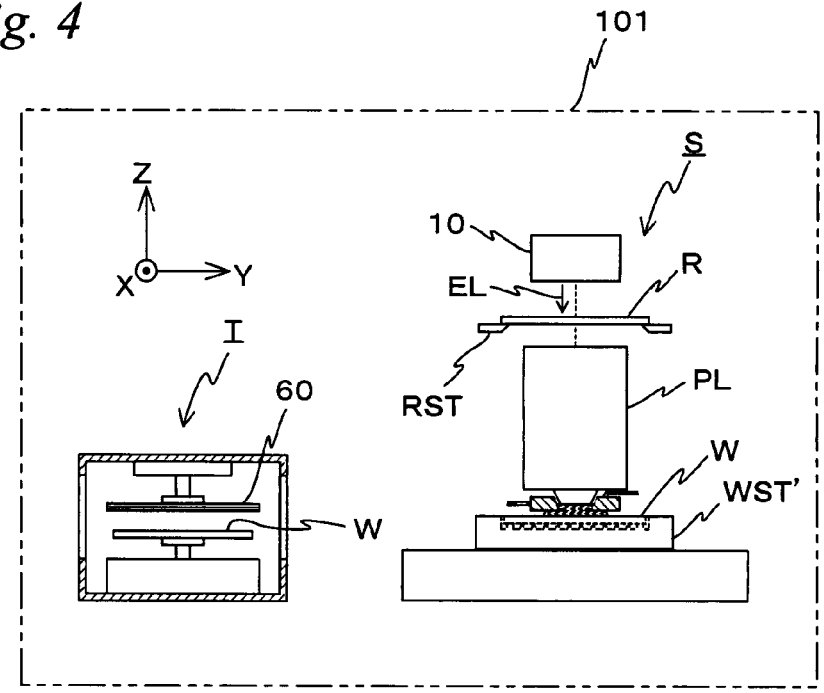
FIG. 4 is a view used to explain a liquid immersion exposure apparatus.

As is shown in FIG. 4 as an example, exposure apparatus 101 is equipped with an exposure apparatus main section S that performs exposure processing to wafer W and a removal unit T that removes liquid, foreign substances and the like that adhere to wafer W.

The configuration of exposure apparatus main section S shown in FIG. 4 is substantially similar to the configuration of exposure apparatus 100, and exposure apparatus main section S is equipped with illumination system 10 that irradiates exposure light EL, reticle stage RST that holds reticle R, a wafer stage WST' that holds wafer W, projection optical system PL that projects a projected image of a device pattern of reticle R that is illuminated with exposure light EL on wafer W, and the like. The structure of wafer stage WST' is slightly different from the structure of wafer stage WST of exposure apparatus 100, as will be described later. Further, although omitted in FIG. 4, main controller 20 also performs the overall control of the inside of exposure apparatus 101.

Figure 5:
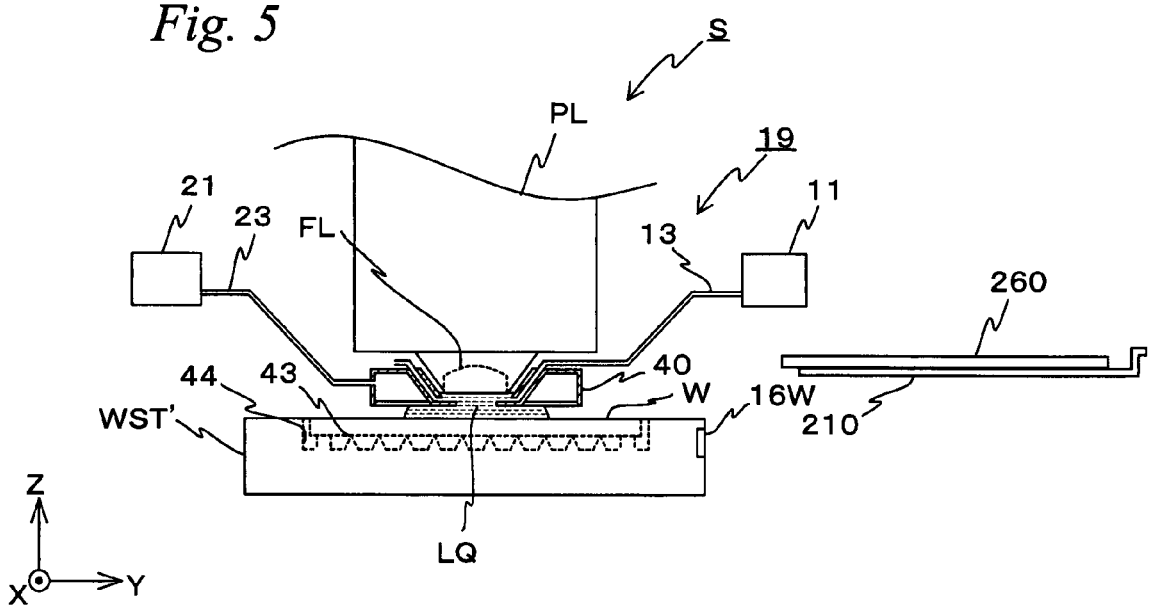
FIG. 5 is a view used to explain an exposure apparatus main section in FIG. 4.

Further, as is shown in FIG. 5 that enlargedly shows part of FIG. 4, besides, exposure apparatus main section S is quipped with a liquid immersion system 19 and a liquid immersion monitor 260.

Wafer stage WST' has a holder 43 that alternatively holds wafer W or liquid immersion monitor 260 by vacuum suction. Holder 43 is placed on the bottom surface of a recessed section 44 that is formed on the surface on the +Z side of wafer stage WST'.

<<Liquid Immersion System>>

Liquid immersion system 19 forms an area (hereinafter, also referred to as a "liquid immersion area") that is filled with liquid LQ between projection optical system PL and wafer W. Herein, as is shown in FIG. 5 as an example, liquid immersion system 19 is quipped with a nozzle member 40, a supply pipe 13, a light source for illumination 15 (not shown in FIG. 5, refer to FIG. 6), a recovery pipe 23, a liquid supply unit 11, a liquid recovery unit 21, and the like.

Figure 6:
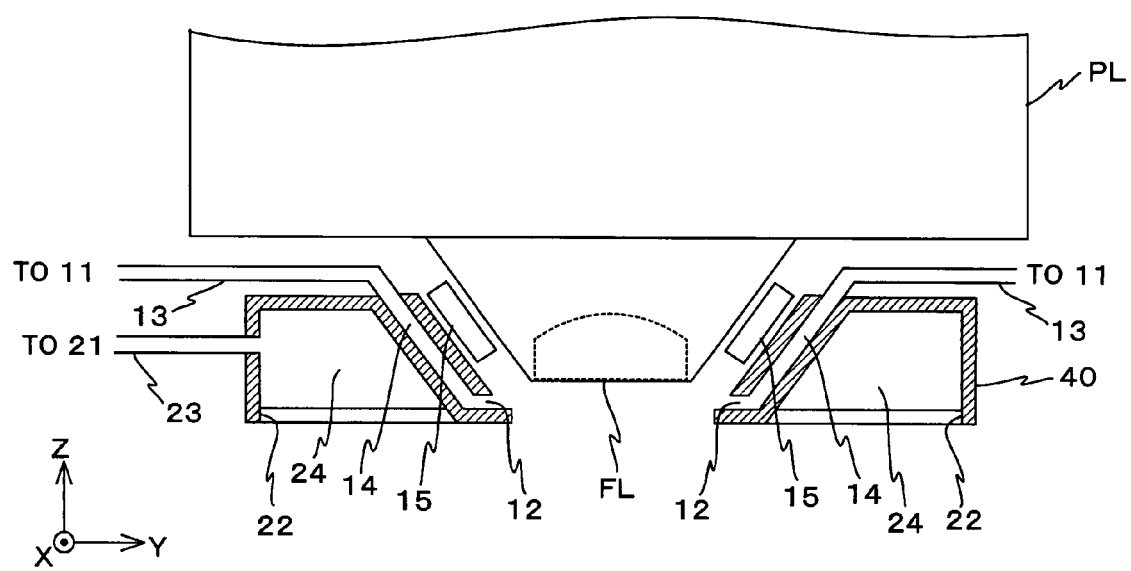
FIG. 6 is a view used to explain a liquid immersion system in FIG. 5.

Nozzle member 40 is an annular member that is arranged so as to enclose an optical element FL that is closest to the image plane of projection optical system PL among a plurality of optical elements of projection optical system PL, and has a supply opening 12 for supplying liquid LQ to the space below optical element FL and a recovery opening 22 for recovering liquid LQ in the liquid immersion area that is formed by supplied liquid LQ between optical element FL and wafer W on holder 43, as is shown in FIG. 6 as an example. At recovery opening 22, for example, a mesh member made of titanium or a porous member made of ceramics is placed. Further, inside nozzle member 40, a flow channel 14 that connects supply opening 12 and one end of supply pipe 13 and a flow channel 24 that connects recovery opening 22 and one end of recovery pipe 23 are formed. Incidentally, in the embodiment, as an example, pure water is used as liquid LQ.

In the embodiment, among of a plurality of optical elements of projection optical system PL, only optical element FL comes into contact with liquid LQ.

Light source for illumination 15 is installed at a periphery portion of the liquid immersion area, and illuminates the vicinity of the liquid immersion area and optical element FL while liquid immersion monitor 260 is operating.

Liquid supply unit 11 is connected to the other end of supply pipe 13. Liquid supply unit 11 has a temperature adjustment unit that adjusts the temperature of liquid LQ to be supplied, a degassing unit that reduces gas components in liquid LQ to be supplied, a filter unit that removes foreign substances in liquid LQ to be supplied and the like, and sends out liquid LQ that is clean and whose temperature has been adjusted. That is, liquid LQ sent out from liquid supply unit 11 is supplied to the liquid immersion area via supply pipe 13, flow channel 14 and supply opening 12. Incidentally, liquid supply unit 11 is controlled by main controller 20.

Liquid recovery unit 21 is connected to the other end of recovery pipe 23. Liquid recovery unit 21 has an exhaust system that includes a vacuum unit, and recovers liquid LQ. That is, liquid LQ in the liquid immersion area is recovered by liquid recovery unit 21 via recovery opening 22, flow channel 24 and recovery pipe 23. Incidentally, liquid recovery unit 21 is controlled by main controller 20.

Main controller 20 performs liquid supply by liquid supply unit 11 and liquid recovery by liquid recovery unit 21 in parallel at least while the exposure processing is being performed.

Figure 7A:
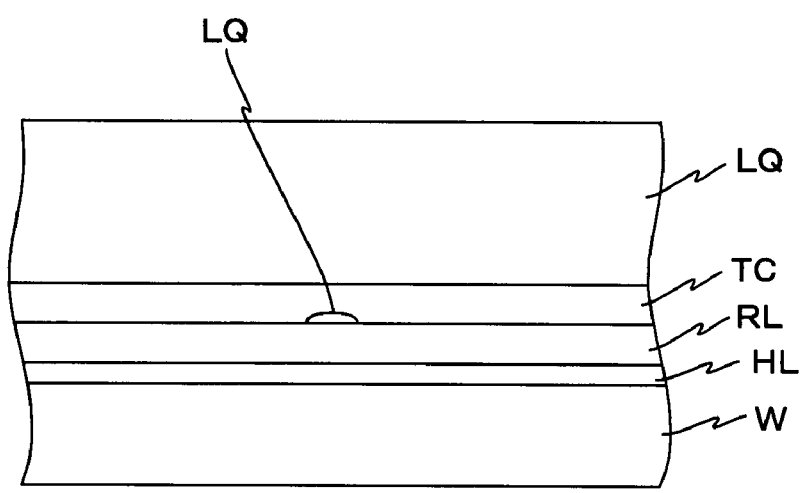
FIGS. 7A to 7C are views each used to explain a problem peculiar to the liquid immersion system.
Figure 7B:
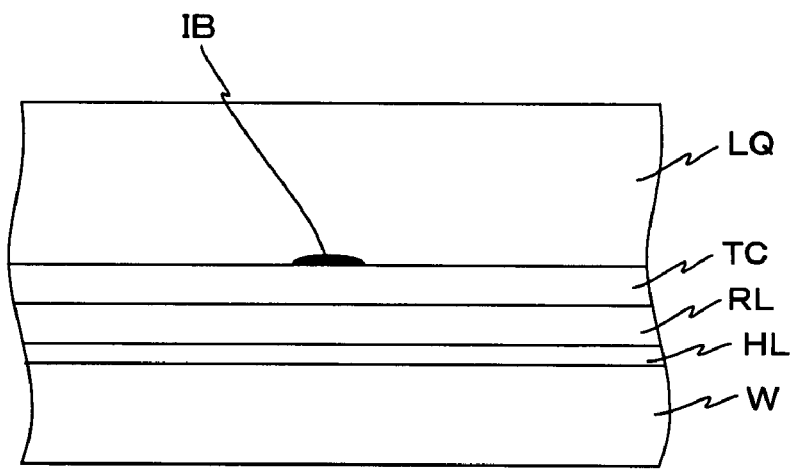
Figure 7C:
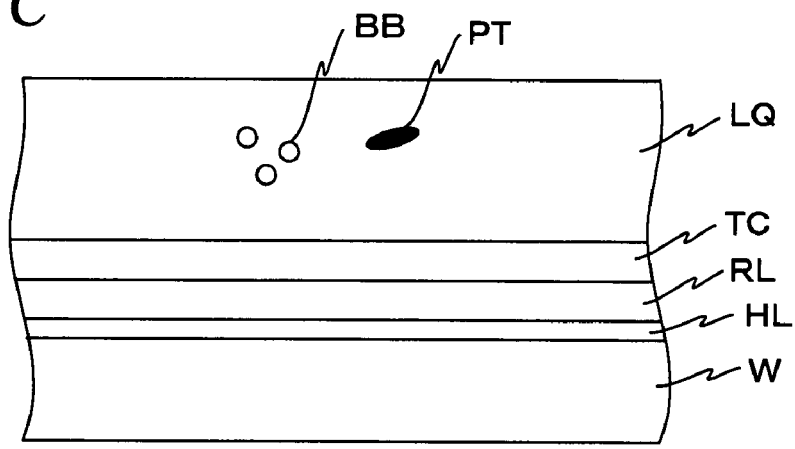

Meanwhile, as is shown in FIG. 7A as an example, sometimes liquid LQ enters a boundary portion between a resist film RL and a topcoat film TC. In this case, liquid LQ infiltrates inside the resist and changes the resist performance, which could result in deteriorating uniformity of an exposure pattern that will be described later. Herein, topcoat film TC is a film that has liquid repellency (water repellency in this case) to liquid LQ. Further, as is shown in FIG. 7B as an example, sometimes a foreign substance IB such as a particle or a watermark adheres on topcoat film TC. In this case, a post-bake (PEB: Post-Exposure-Bake) processing and a development processing after exposure are affected even if exposure is normally performed, which could generate defects such as break of a device pattern that is formed on a wafer by exposure (hereinafter, shortly referred to as an "exposure pattern" as needed), or ununiformity of line width. Further, as is shown in FIG. 7C as an example, sometimes foreign substances such as bubbles BB and/or a particle PT exist in the liquid immersion area. In this case, the optical path of exposure light EL changes, which could generate defects of the exposure pattern. Further, the resist is eluted into liquid LQ and contaminates optical element FL, which could generate defects of the exposure pattern. Incidentally, there is the possibility that bacteria comes into existence at the members (such as supply pipe 13, and optical element FL) that are in liquid LQ and/or come into contact with liquid LQ, and the bacteria becomes one of foreign substances. Further, the reference code HL in FIGS. 7A to 7C indicates an antireflection film.

The occurrence of the states shown in FIGS. 7A to 7C and the like can be prevented to some extent by changing the temperature of liquid LQ, increasing the flow speed of liquid LQ, tightening processing conditions of filter processing when circulating liquid LQ, or shortening a period of time for liquid immersion when the same area on wafer W is immersed in liquid LQ by changing the exposure route of shot areas $SA_p$ on wafer W (the route of wafer stage WST' during the step-and-scan) or the like. Accordingly, in liquid immersion exposure apparatus 101, the processing conditions that affect these liquid immersion states are parameterized and can be adjusted. Hereinafter, these parameters are generally referred to also as liquid-immersion-related parameters.

<<Liquid Immersion Monitor>>

In order to judge whether or not the liquid-immersion-related parameters are appropriately set, liquid immersion monitor 260 that monitors whether foreign substances are contained in the liquid immersion area or not, and whether optical element FL and the like are contaminated or not is needed. Herein, as is shown in FIG. 8A and FIG. 8B as an example, liquid immersion monitor 260 has a base material 261 that has the substantially same outer shape as wafer W, a plurality of CCD sensor modules 262 that are embedded on base material 261, a liquid immersion analytical unit 263 that analyzes an output signal of each CCD sensor module 262 and wirelessly transmits the analytical results, and the like. Liquid immersion analytical unit 263 has a flash memory in which various programs to be used in liquid immersion analytical unit 263 are stored, a work memory and the like. Herein, in the center portion of base material 261, one CCD sensor module 262 is embedded, and four CCD sensor modules 262 are substantially equiangularly embedded at the peripheral area of base material 261. Incidentally, the analytical results at liquid immersion analytical unit 263 are notified from liquid immersion analytical unit 263 to main controller 20, exposure process management controller 160, analytical apparatus 170, and the like.

The material of base material 261 only has to be the one that hardly affect liquid LQ when coming into contact with liquid LQ. For example, the material may also be the same as the material of wafer W, or may also be metal such as titanium, or the material containing fluorine resin such as PTFE or PFA. Further, in order to apply water repellency to the surface of base material 261 that comes into contact with liquid LQ, a film having water repellency may also be formed on the surface.

As is shown in FIG. 9 as an example, each CCD sensor module 262 has six one-dimensional line sensors that have a longitudinal direction in the X-axis direction. Herein, the one-dimensional line sensors that are located from the −Y side end portion to the +Y side end portion in order are referred to as line sensors 267A, 267B, 267C, 267D, 267E and 267F respectively. Further, in each line sensor, a plurality of microlenses 264 that correspond to respective photodetection sections are arranged.

Figure 10:
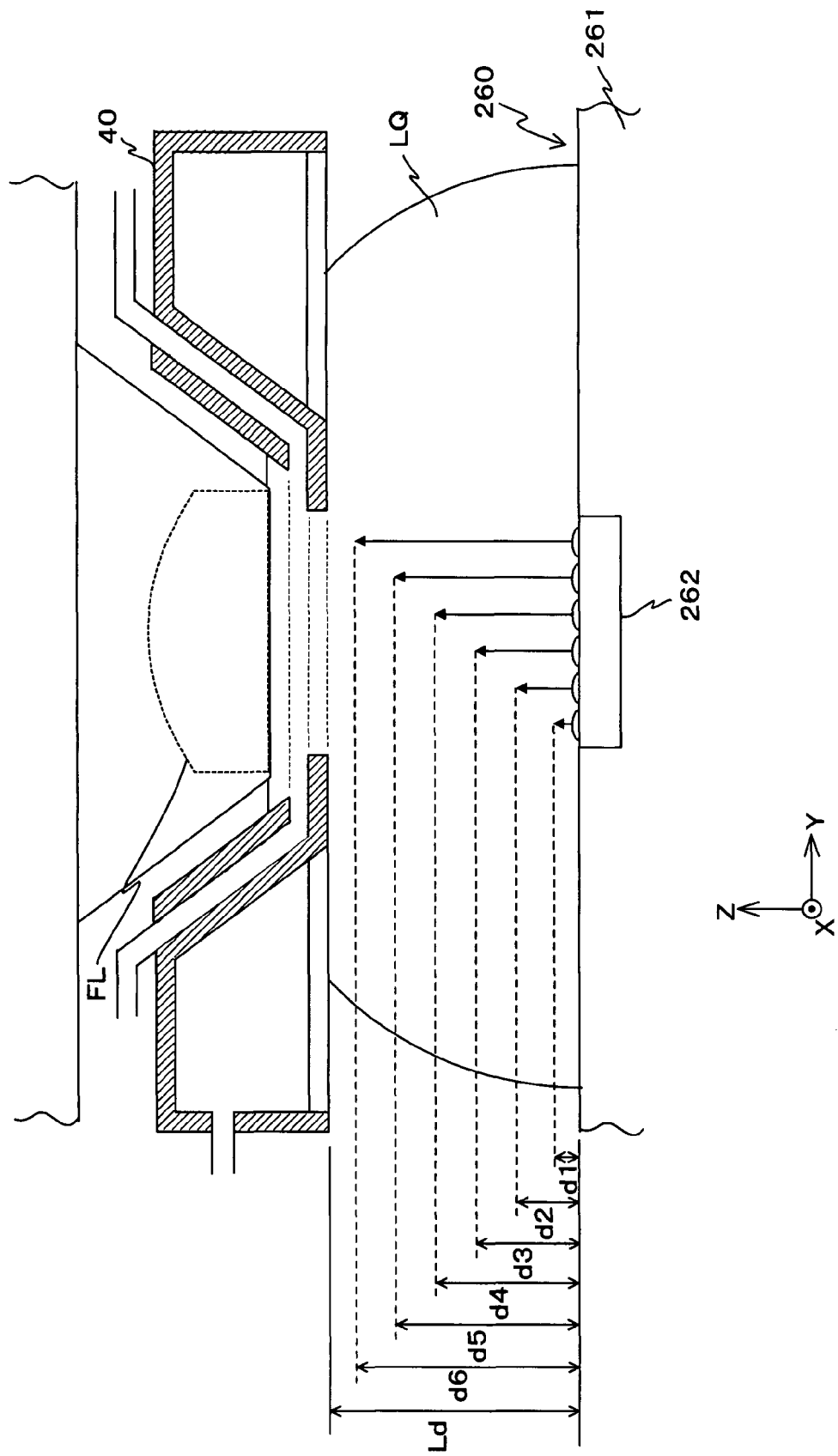
FIG. 10 is a view used to explain an object plane position of each line sensor in the CCD sensor module in FIG. 9.

The focal distances of microlenses 264 are different per line sensor. That is, the distances to an observation subject position (object plane position) are each different per line sensor. And, the offset amount of the object plane position per line sensor is set, taking into consideration the substantial depth of focus in accordance with the detection resolution of foreign substances. Herein, as is shown in FIG. 10 as an example, the observation subject position of each of line sensors 267A, 267B, 267C, 267D, 267E and 267F is the position at a distance of d1, d2(>d1), d3(>d2), d4(>d3), d5(>d4) and d6(>d5) from the surface of base material 261, respectively. Thus, for example, when the thickness (the length in the Z-axis direction) of the liquid immersion area is around 3 mm, almost all of the liquid immersion area can be inspected by setting d1=0.25 mm, d2=0.75 mm, d3=1.25 mm, d4=1.75 mm, d5=2.25 mm and d6=2.75 mm.

For example, assuming that a diameter D of microlens 264 is 8 μm and a focal distance f is 12.0 μm, an F number becomes 1.5 (=f/D). When a white LED (a wavelength λ: 560 nm) is used as an illumination light source, a depth of focus becomes $\pm 0.61\lambda F/NA = \pm 01.22\lambda F^2 = \pm 1.54$μm. Incidentally, a center thickness t of microlens 264 (refer to FIG. 11) can be 2 to 3 μm. In FIG. 11, the reference code 262A indicates a CCD pixel, the reference code 262B indicates a transfer electrode, the reference code 262C indicates a resin layer, and the reference code 262D indicates an insulation layer.

Liquid immersion monitor 260 is housed in advance in a predetermined position within exposure apparatus main section S, and is set on holder 43 by a carrier unit 210 (refer to FIG. 5) as is shown in FIG. 12 as an example, when performing a liquid immersion monitor processing.

Meanwhile, there are an interline method, a frame interline method and a frame transfer method for CCD (charge-coupled device) depending on the structure that transfers signal charge. Either of these methods may be used, but it is preferable to employ the frame transfer method in which the large photodetection area size can be used because the photodetection section also serves as the transfer section.

Further, when it is assumed that a CCD pixel size Cs is 8.0 μm (including 2.0 μm of a dead zone), an effective pixel number Cp of a line sensor is 4000 (32 mm length), and a CCD scan data rate $C_d$ is 25 nsec/pixel (=40 MHz), one line scan time Tc of the line sensor becomes Cp×Cd=100 μsec. Then, a stage scan speed Sp at the time of liquid immersion monitoring becomes Cs/Tc=80 mm/sec.

Incidentally, in liquid immersion monitor 260, each line sensor may be formed on base material 261 using the photo-lithography method, or a CCD sensor module that has been created in advance may be embedded in the recessed portion formed on base material 261.

<<Removal Unit>>

Figure 13:
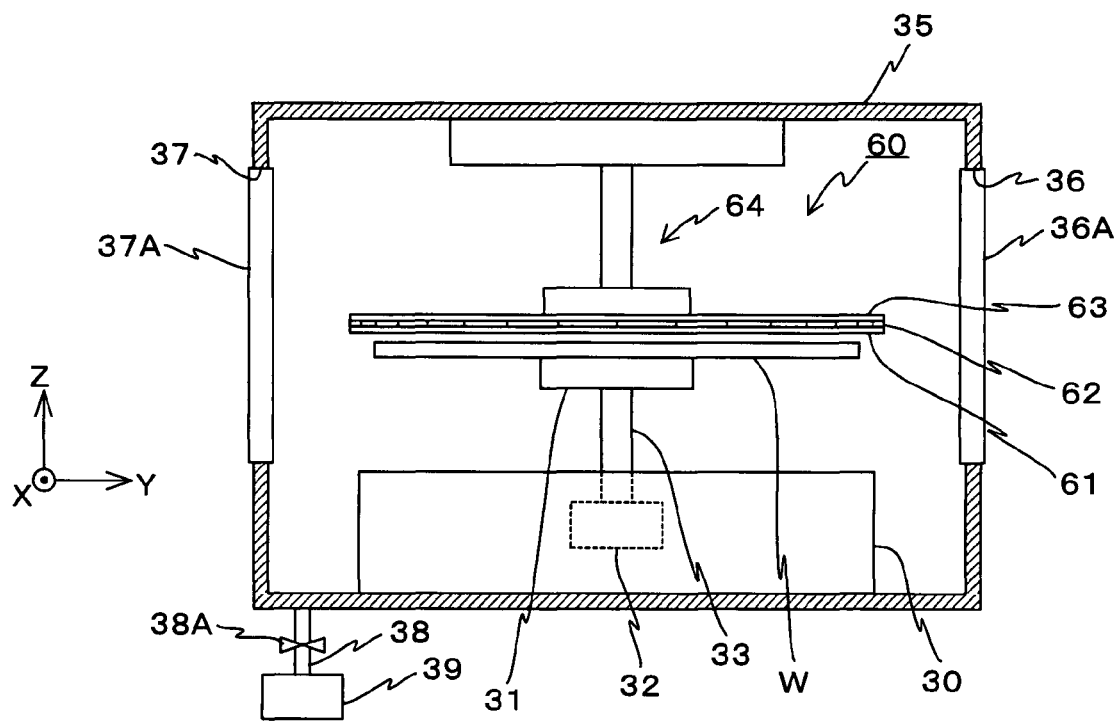
FIG. 13 is a view used to explain a removal unit T in FIG. 4.

Removal unit T shown in FIG. 4 is a unit that removes liquid LQ, foreign substances and the like (hereinafter, also described as "liquid/foreign substance" for the sake of convenience) that adhere to wafer W. Herein, as is shown in FIG. 13 as an example, removable unit T has a stage unit 30, a holder 31 that holds wafer W by vacuum suction, a rotation unit 32 that rotates and drives holder 31, a generating unit 60 that generates a flexure traveling wave for moving liquid/foreign substance adhering to wafer W, a chamber 35, a liquid suction unit 39, an observation unit (now shown) that observes the surface of wafer W, and the like. Sage unit 30, holder 31, rotation unit 32 and generating unit 60 are housed within chamber 35. Incidentally, the observation results by the observation unit are notified to main controller 20, measurement and/or inspection instrument 120, analytical apparatus 170, and the like.

Chamber 35 has an opening section 36 that is formed on the wall surface on the +Y side and an opening section 37 that is formed on the wall surface on the −Y side in FIG. 13. A shutter 36A that opens/closes opening section 36 is arranged at opening section 36, and a shutter 37A that opens/closes opening section 37 is arranged at opening section 37. Wafer W to which liquid immersion exposure has been performed is carried into chamber 35 via opening section 36, and wafer W to which a removal processing of liquid/foreign substance has been performed is carried outside chamber 35 via opening section 37. The opening/closing of shutters 36A and 37A are controlled by main controller 20.

Liquid suction unit 39 is connected to chamber 35 via a flow channel 38 at which a valve 38A is arranged. When valve 38A is in an opened state, the liquid within chamber 35 is drained outside chamber 35 by liquid suction unit 39. Incidentally, during the liquid/foreign substance removal processing, valve 38A is in an opened state.

Rotation unit 32 has a motor that is placed inside stage unit 30 and an axis 33 that is rotated and driven by the motor. At the upper end of axis 33, holder 31 is fixed. Rotation unit 32 rotates wafer W held on holder 31 via axis 33 by the motor. Incidentally, holder 31 is drivable together with axis 33 in the Z-axis direction, the θx direction and the θy direction by a holder drive unit (not shown).

Figure 14:
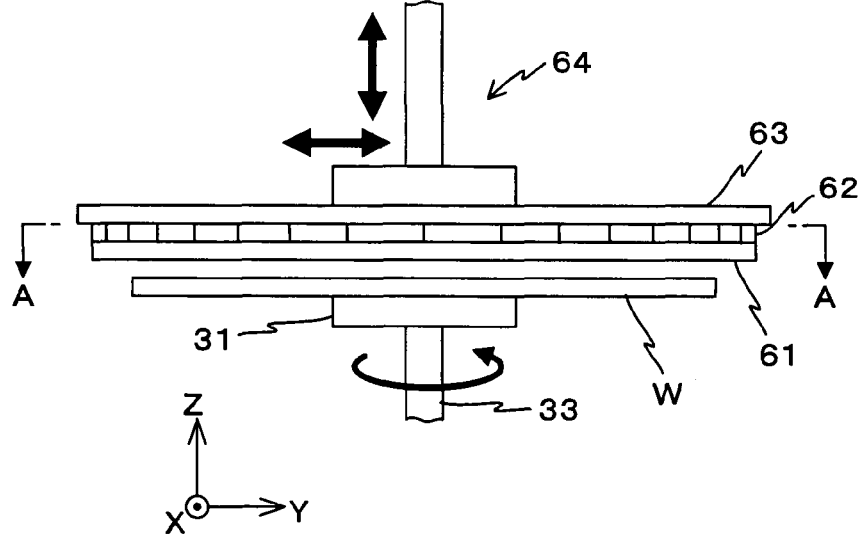
FIG. 14 is a view used to explain a generating unit in FIG. 13.

As is shown in FIG. 14 as an example, generating unit 60 has an elastic stator 61 that is placed facing wafer W held on holder 31 and generates a flexure traveling wave, a oscillating body 62 that is placed on the surface on the +Z side of elastic stator 61 and includes a piezoelectric element that excites a flexure traveling wave, a support member 63 that supports oscillating body 62, and a drive mechanism 64 that drives support member 63 in the X-axis direction, the Y-axis direction, the Z-axis direction, the θX direction, the θY direction and the θZ direction. Drive mechanism 64 is controller by main controller 20. That is, the distance between elastic stator 61 and wafer W, the tilt angle of elastic stator 61 with respect to wafer W, the position of elastic stator 61 with respect to wafer W within the XY plane, and the like can be adjusted by main controller 20.

Figure 15:
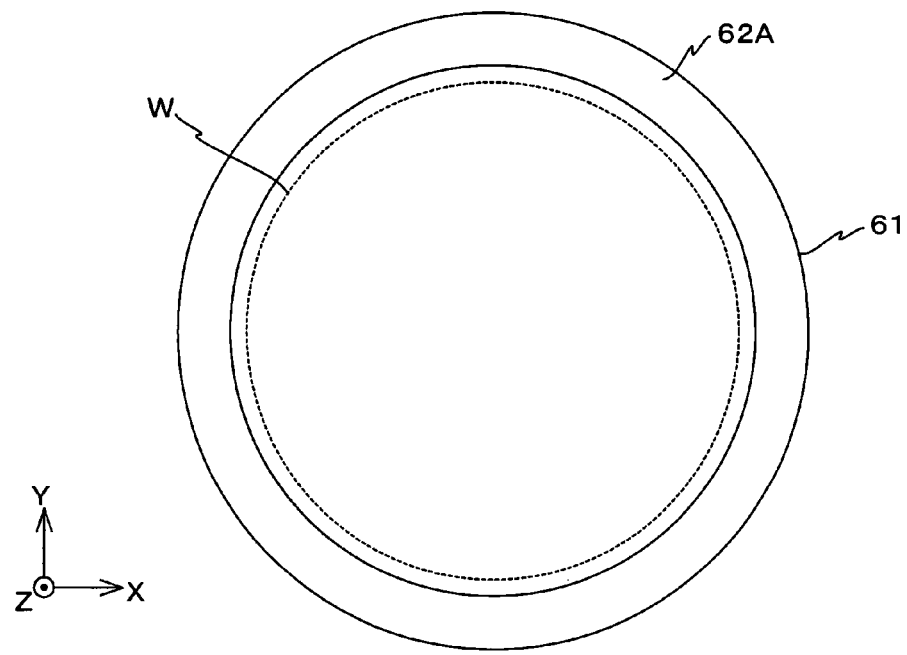
FIG. 15 is a view used to explain an elastic stator and an oscillating body in FIG. 13.

As is shown in FIG. 15 as an example, elastic stator 61 is an elastic member having a roughly circular shape that is slightly larger than wafer W. On the surface of elastic stator 61 on the −Z side, water repellent coat is applied. Then, on the peripheral area on the surface of elastic stator 61 on the +Z side, a piezoelectric element 62A is placed in a ring-shaped arrangement so that a desirable flexure traveling wave can be obtained. Incidentally, elastic stator 61 may also have a ring shape.

Figure 16:
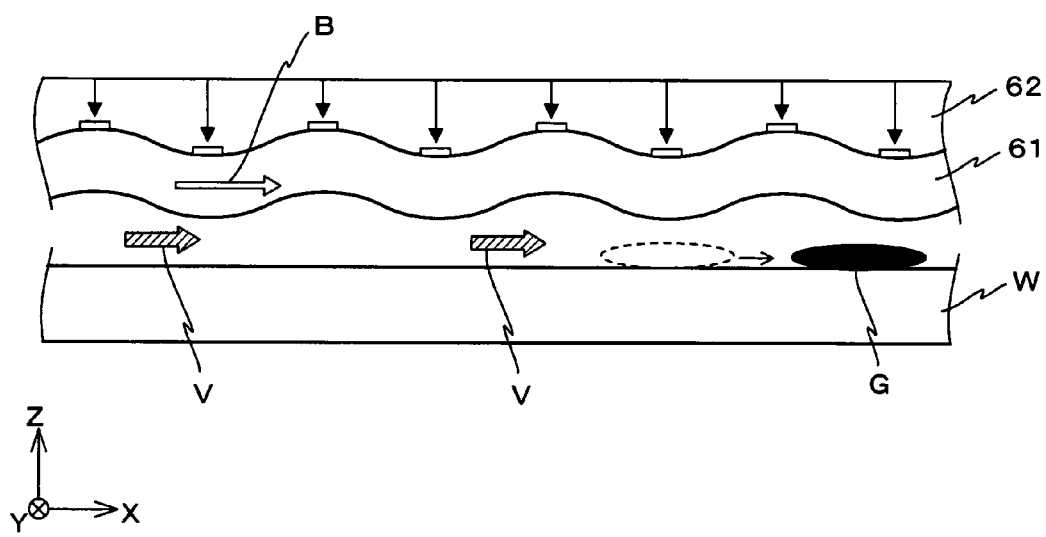
FIG. 16 is a view (No. 1) used to explain the working of the generating unit in FIG. 14.
Figure 17:
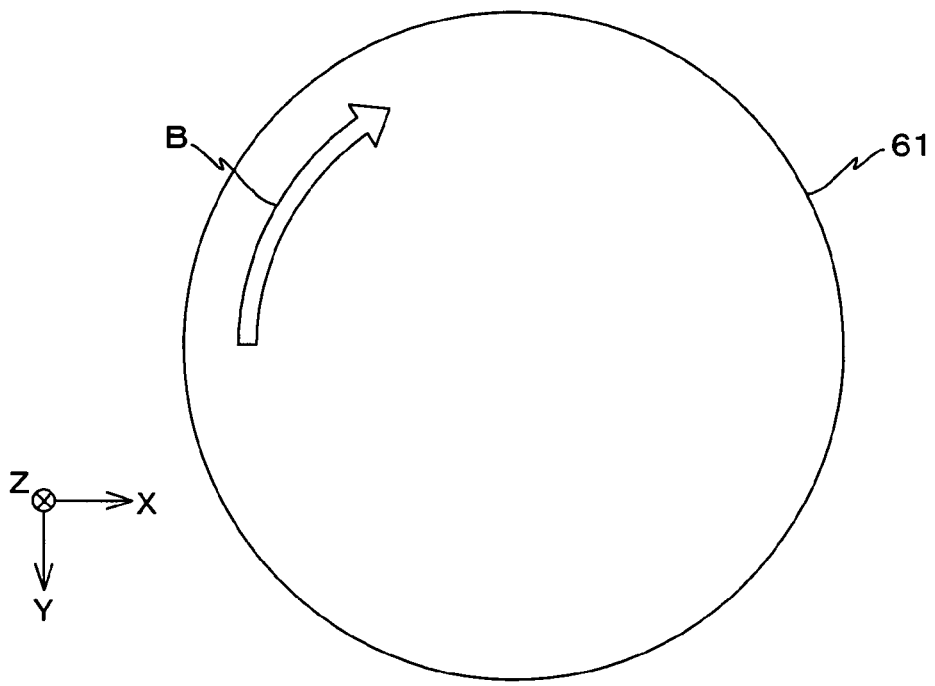
FIG. 17 is a view (No. 2) used to explain the working of the generating unit in FIG. 14.

The piezoelectric element of oscillating body 62 is uniformly polarized in a direction of the thickness (the Z-axis direction in this case), and a plurality of electrodes (hereinafter, also referred to as an electrode group) are arranged at a half-wave pitch of flexural oscillation. When the electric signal of resonance frequency is input to the electrode group; a standing wave of flexural oscillation is excited. With this operation, as is shown in FIG. 16 as an example, a flexure traveling wave B is generated and an acoustical field is generated between elastic stator 61 and wafer W by flexure traveling-wave B. Then, a liquid/foreign substance G adhering to wafer W is moved by an acoustical viscous flow V in the acoustical field. In other words, generating unit 60 can move liquid/foreign substance G adhering to wafer W in a noncontact state with wafer W. Further, when a recessed portion is formed on the surface of wafer W, even if the liquid/foreign substance enters inside the recessed portion, the liquid/foreign substance entering inside the recessed portion can be taken out to the outside of the recessed portion. Herein, as is shown in FIG. 17 as an example, flexure traveling wave B whose traveling direction is a circumferential direction of elastic stator 61 is generated. Thus, acoustical viscous flow V flows in a circumferential direction of wafer W as its traveling direction. Incidentally, the electrode group does not have to be arranged on the entire surface of oscillating body 62, but may be arranged on a part thereof. In this case, another electrode group is arranged and set so that the phase difference of standing wave that is excited by another electrode becomes $\pi/2$ ($=\frac{1}{4}$ wavelength), thereby exciting oscillation and generating a flexure traveling wave.

When inclining holder 31 along with the generation of flexure traveling wave B, the liquid/foreign substance adhering to wafer W can be favorably removed by the synergistic action between the action of gravity and the action by the flexure traveling wave.

Figure 18:
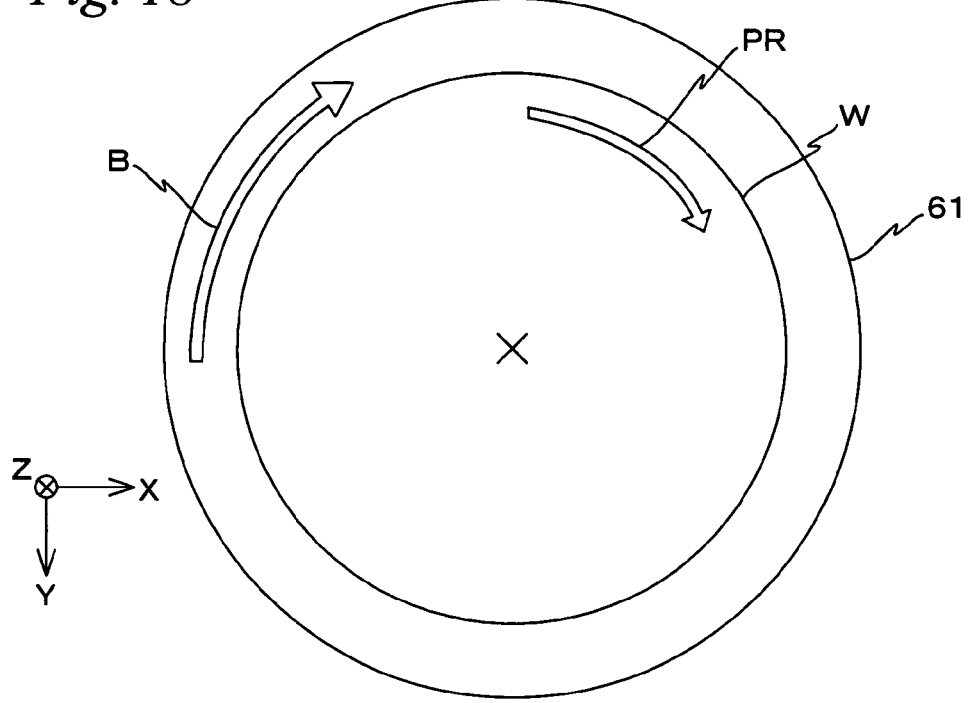
FIG. 18 is a view (No. 3) used to explain the working of the generating unit in FIG. 14.

Further, when rotating wafer W along with the generation of flexure traveling wave B, the centrifugal force is added, which makes it possible to better move the liquid/foreign substance adhering to wafer W. In this case, as is shown in FIG. 18 as an example, when making a rotation direction PR of wafer W coincide with a traveling direction of flexure traveling wave B, the direction of acoustical viscous flow V and the direction of centrifugal force substantially coincide, which makes it possible to favorably remove the liquid/foreign substance adhering to wafer W, even if wafer W is rotated at a relatively low speed. Thus, it becomes possible to reduce the burden to wafer W, reduce the electric power consumption of rotation unit 32, suppress the heat generation of rotation unit 32, and decrease the size of rotation unit 32.

Meanwhile, the generation start of flexure traveling wave B and the rotation start of wafer W may be performed substantially at the same time, or the generation of flexure traveling wave B may be started after starting the rotation of wafer W. However, for example, when the liquid/foreign substance enters inside a recessed portion formed on the surface of wafer W, the rotation of wafer W may be started after a predetermined period of time elapses from the generation start of flexure traveling wave B. In this case, after the liquid/foreign substance that enters inside the recessed portion is once moved to the outside of the recessed portion by flexure traveling wave B, the liquid/foreign substance can be removed from the surface of wafer W by the rotation of wafer W.

Figure 19:
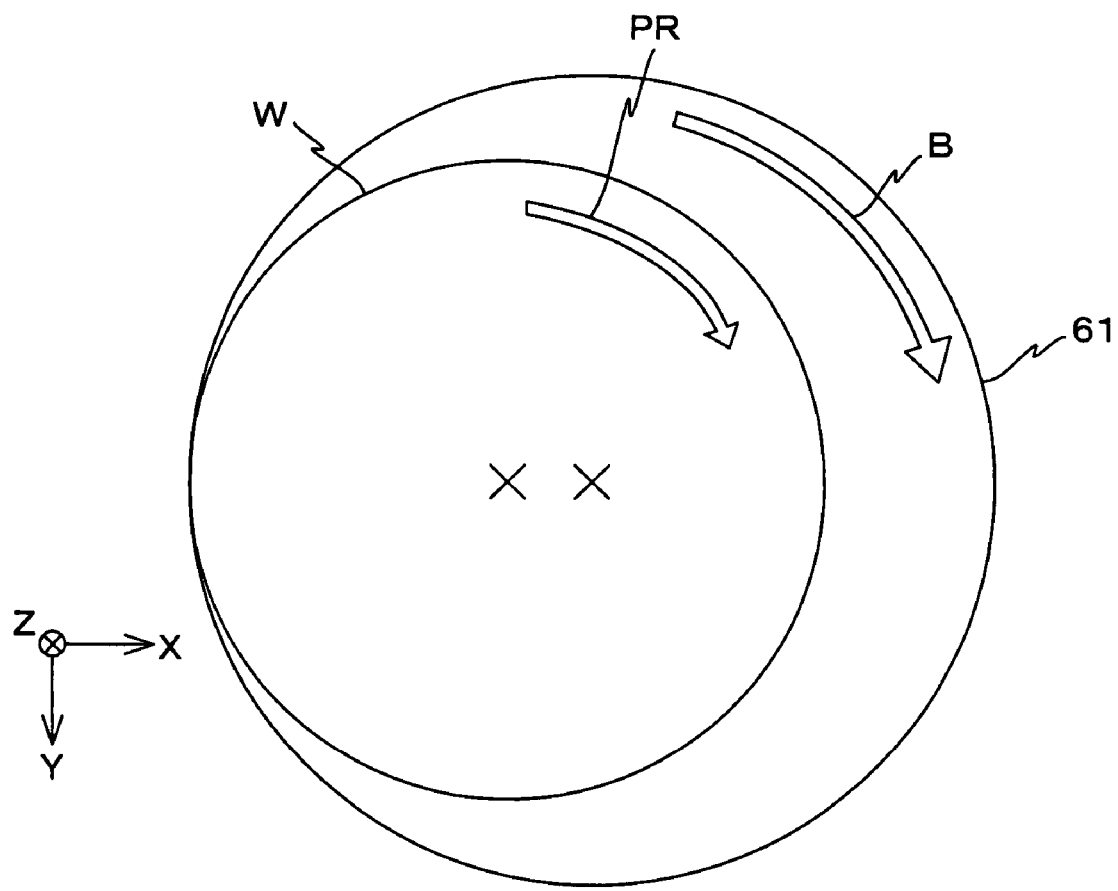
FIG. 19 is a view (No. 4) used to explain the working of the generating unit in FIG. 14.

Incidentally, in the case the liquid/foreign substance adheres near the center of wafer W, as is shown in FIG. 19 as an example, the rotation center of wafer W and the center of elastic stator 61 may be displaced.

Further, the rotation of wafer W and the tilt of wafer W may be used in combination. By using them in combination, the liquid/foreign substance adhering to wafer W can be removed further favorably.

Then, the liquid removed from wafer W is drained outside chamber 35 by liquid suction unit 39. Accordingly, the humidity within chamber 35 does not fluctuate greatly. Also, the humid gas is not discharged outside chamber 35 when opening shutter 36A and shutter 37A.

Figure 20A:
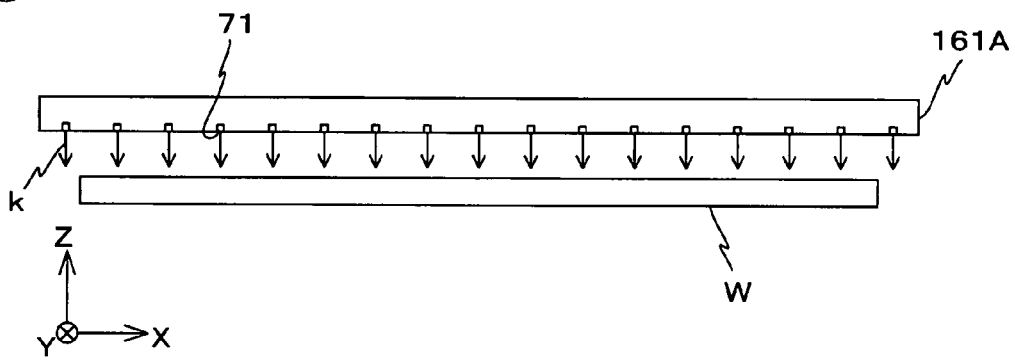
FIG. 20A and FIG. 20B are views each used to explain an elastic stator that has gas outlets.
Figure 20B:
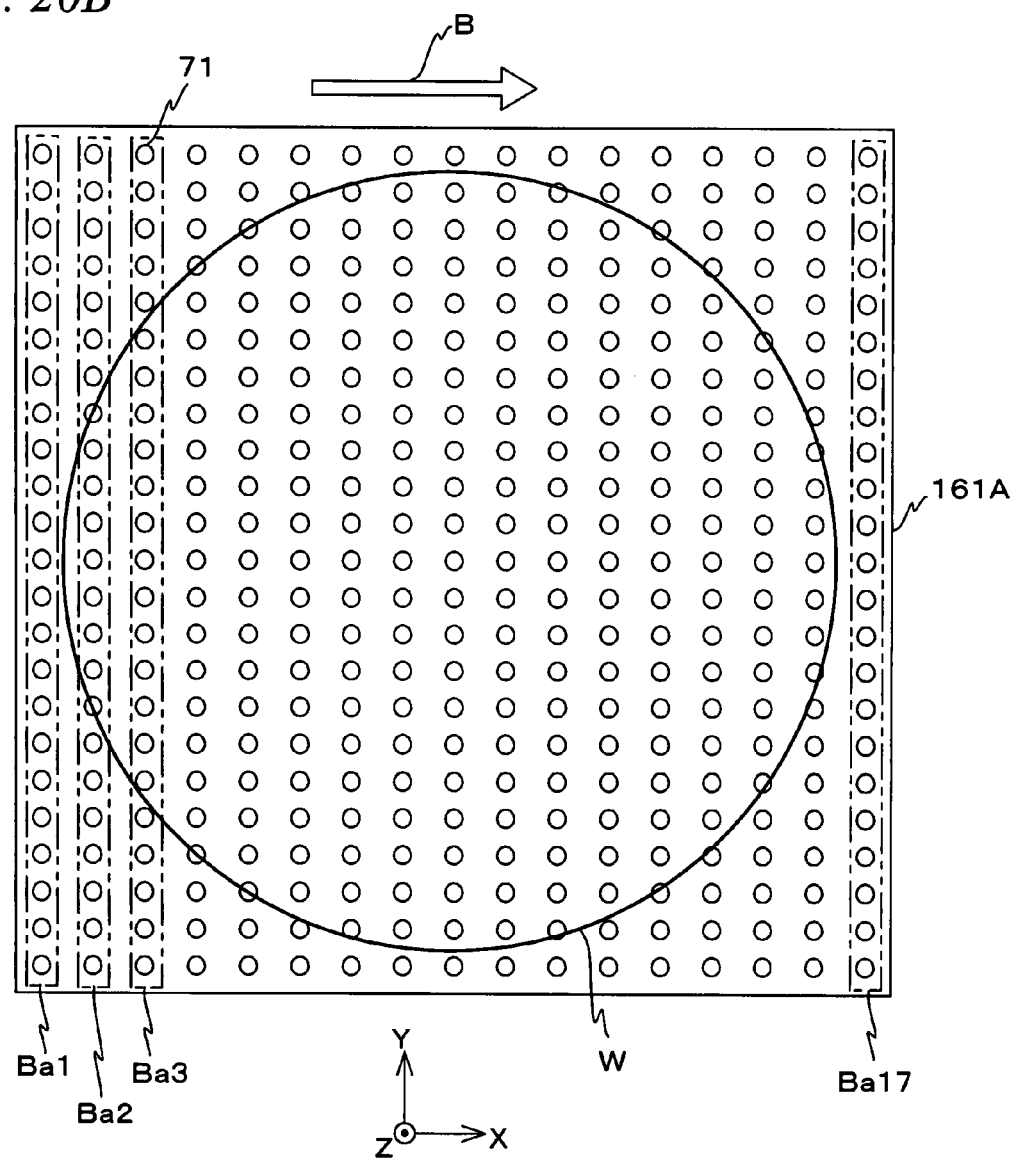

Incidentally, instead of elastic stator 61, a rectangular-plate-shaped elastic stator 161A that has the surface on the −Z side on which a plurality of gas outlets 71 are formed may be used, as is shown in FIG. 20A and FIG. 20B as an example. In this case, a gas supply unit (omitted in the drawing) that blows gas k from a plurality of gas outlets 71 toward the surface of wafer W is further arranged. Herein, a gas outlet group arranged in a line in the Y-axis direction is to be one block, and blocks are to be a first block Ba1, a second block Ba2, a third block Ba3, . . . , and a seventeenth block Ba17 from the −X direction end portion toward the +X direction in order. Then, in accordance with traveling of flexure traveling wave B, gas blowing from first block Ba1 is started, next, gas blowing from second block Ba2 is started, and subsequently, gas blowing from third block Ba3, . . . and seventeenth block Ba17 is started in order. Further, when a predetermined period of time elapses after starting gas blowing from first block Ba1, the gas blowing from first block Ba1 is stopped. Similarly, when a predetermined period of time elapses after starting gas blowing from second block Ba2, the gas blowing from second block Ba2 is stopped. Afterwards, in the similar manner, the gas blowing from the block is stopped after a predetermined period of time elapses after starting the gas blowing. With this operation, it becomes possible to remove the liquid/foreign substance adhering to wafer W in a shorter period of time. Incidentally, the number of blocks is not limited to 17. In this case, wafer W and elastic stator 161A may be tilted in the traveling direction of flexure traveling wave B.

Figure 21A:
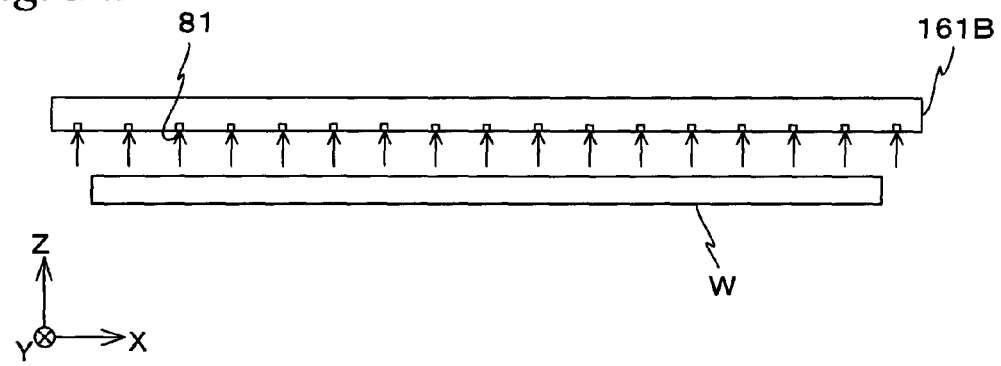
FIG. 21A and FIG. 21B are views each used to explain an elastic stator that has suction openings.
Figure 21B:
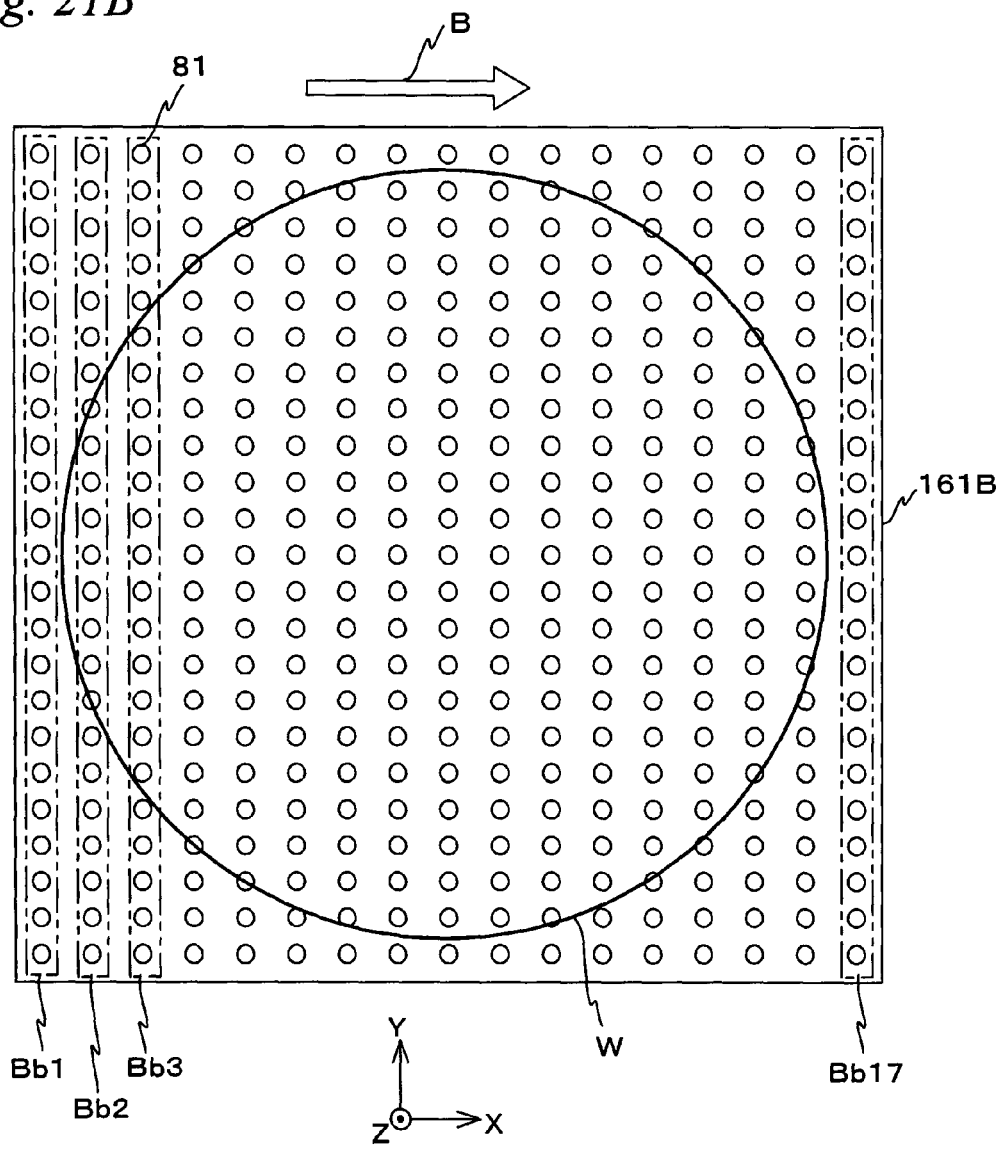

Further, instead of elastic stator 61, a rectangular-plate-shaped elastic stator 161B that has the surface on the −Z side on which a plurality of suction openings 81 are formed may be used, as is shown in FIG. 21A and FIG. 21B as an example. In this case, a suction unit (omitted in the drawing) that suctions liquid or the like adhering to the surface of wafer W from a plurality of suction openings 81 is further arranged. Herein, a suction opening group arranged in a line in the Y-axis direction is to be one block, and blocks are to be a first block Bb1, a second block Bb2, a third block Bb3, . . . , and a seventeenth block Bb17 from the −X direction end portion toward the +X direction in order. Then, in accordance with traveling of flexure traveling wave B, suction by first block Bb1 is started, next, suction by second block Bb2 is started, and subsequently, suction by third block Bb3, and seventeenth block Bb17 is started in order. Further, when a predetermined period of time elapses after starting suction by first block Bb1, the suction by first block Bb1 is stopped. Similarly, when a predetermined period of time elapses after starting suction by second block Bb2, the suction by second block Bb2 is stopped. Afterwards, in the similar manner, the suction by the block is stopped after a predetermined period of time elapses after starting the suction. With this operation, it becomes possible to remove the liquid/foreign substance adhering to wafer W in a shorter period of time. Incidentally, the number of blocks is not limited to 17. In this case, wafer W and elastic stator 161B may be tilted in the traveling direction of flexure traveling wave B.

Further, instead of liquid suction unit 39 or together with liquid suction unit 39, a drying unit that supplies dry gas into chamber 35 may also be arranged. With the drying unit, removal of liquid LQ adhering to wafer W can be enhanced.

Several processing conditions of removal unit T are also parameterized, and removal unit T is designed so that the processing state of liquid removal processing changes depending on the values of the parameters. Removal unit T may also be arranged within track 200B of liquid immersion exposure apparatus 101.

[Track]

Referring back to FIG. 1, tracks 200A and 200B are placed so as to have contact with a chamber (not shown) that encloses exposure apparatus 100 or 101. Tracks 200A and 200B perform carrying-out and carrying-in of wafer W mainly from/to exposure apparatuses 100 and 101 by a carrier line that is equipped inside tracks 200A and 200B.

[Coater Developer]

Within tracks 200A and 200B, a coater-developer (C/D) 110 that is equipped with a coater that performs a resist coating processing, a developer that performs a development processing, a PEB unit that performs a PEB processing, and the like is arranged. C/D 110 can observe the processing states of resist coating, development, PEB processings, and record the observation data as log data. As the processing states that can be observed, for example, each state of the rotation speed of a spin coater, the temperature during development, a development module processing, the temperature uniformity of PEB (hotplate temperature uniformity), and the wafer heating history management (to avoid overbake after the PEB processing, a cooling plate) can be cited. The processing state of C/D 110 can also be adjusted to some extent by setting the apparatus parameters. As such apparatus parameters, for example, there are a parameter that can correct the thickness of resist on wafer W (a dripping quantity and a dripping interval of resist), the set temperature within the apparatus, the rotation speed of a spin coater, and the like.

C/D 110 can operate independently from the external apparatuses such as exposure apparatuses 100 and 101, and measurement and/or inspection instrument 120. C/D 110 is placed along the carrier line within tracks 200A and 200B, and by the carrier line, wafer W can be carried between exposure apparatuses 100 and 101, C/D 110, and the outside of tracks 200A and 200B. Further, C/D 110 is connected to a communication network within device manufacturing system 1000 and data transmission with the outside is possible.

In other words, exposure apparatus 100 and C/D 110 within track 200A, and exposure apparatus 101 and C/D 110 within track 200B are inline connected to each other, respectively. Herein, the inline connection means the connection between the apparatuses, and between processing units within each apparatus via a carrier unit that performs automating transport of wafer W such as a robot arm or a slider. By the inline connection, a period of time required for delivery of wafer W between exposure apparatus 100 and C/D 110, or between exposure apparatus 101 and C/D 110 can be remarkably shortened.

Exposure apparatus 100 and track 200A that are inline connected and exposure apparatus 101 and track 200B that are inline connected can be considered as one substrate processing apparatus (100, 200A) or (101, 200B) as a unit. To wafer W, the substrate processing apparatus (100, 200A) or (101, 200B) performs a coating process of coating photosensitive agent such as photoresist, an exposure process of projecting and exposing an image of a pattern of a mask or reticle R on wafer W which is coated with photosensitive agent, a PEB process after finishing the exposure process, a development process of developing wafer W after that, and the like. Exposure cell 700 can be regarded to be quipped with one substrate processing apparatus (100, 200A) and one substrate processing apparatus (101, 200B).

[Measurement and/or Inspection Instrument]

Measurement and/or inspection instrument 120 is a composite measurement and/or inspection instrument that can perform various types of measurement and/or inspection to wafer W. Measurement and/or inspection instrument 120 is equipped with a stage that holds wafer W similar to wafer stage WST in exposure apparatus 100. The XY position of the stage is measured by an interferometer (not shown) as in the case of wafer stage WST. The controller of measurement and/or inspection instrument 120 controls the XY position of the stage based on the measurement position of the interferometer. For measurement and/or inspection of wafer W, first of all, the alignment of wafer W is necessary. Measurement and/or inspection instrument 120 can position wafer W as in the case of exposure apparatus 100 or 101, and is quipped with an alignment system that is similar to alignment system ALG of exposure apparatus 100. The alignment of wafer W in measurement and/or inspection instrument 120 can be performed under alignment-related parameters that are similar to those of exposure apparatus 100 or 101.

Besides, measurement and/or inspection instrument 120 is equipped with the following sensors to perform measurement and/or inspection that will be described below.

(1) Measurement and/or inspection of an antireflection film, a photoresist film and a topcoat film on wafer W (film thickness, peeling of film)

An interferometer that can measure the film thickness of each film (2) Measurement of wafer marks ($MX_p$, $MY_p$) on wafer W The alignment system described above (by an image processing method) similar to alignment system ALG of exposure apparatus 100 or 101

(3) Measurement of surface shape of wafer W (so-called shot flatness (device topography, focus level difference))

A multipoint AF sensor that matches the multipoint AF sensor in exposure apparatus 100 or 101

(4) Inspection of foreign substances and/or stains on wafer W

An alignment system (a sensor by an image processing method) or a sensor by a laser scan method (5) Measurement of line width and overlay error of a pattern formed on wafer W A high-powered imaging device that can pick up an image of a device pattern (6) Pattern defects on wafer W An imaging device or a sensor by a laser scan method Measurement and/or inspection instrument 120 can operate independently from exposure apparatuses 100 and 101, and C/D 110. Carrier line 140 within exposure cell 700 can carry wafer W one by one between exposure apparatus 100 or 101, C/D 110 and measurement and/or inspection instrument 120. Further, measurement and/or inspection instrument 120 can input/output data via a communication network.

[Device Manufacturing Apparatus Group]

As device manufacturing apparatus group 900, a film forming apparatus 910, an oxidation/ion-implantation apparatus 920, an etching apparatus 930, a CMP (Chemical Mechanical Polishing) apparatus 940 that performs a processing of planarizing wafer W by performing chemical mechanical polishing, and the like are arranged. Film forming apparatus 910 is an apparatus that forms a thin film such as an antireflection film and a topcoat film on wafer W using CVD (Chemical Vapor Deposition) or the like. Oxidation/ion-implantation apparatus 920 is an apparatus used to form an oxide film on the surface of wafer W or implant impurities in a predetermined position on wafer W. Etching apparatus 930 is an apparatus that performs etching to developed wafer W. CMP apparatus 940 is a polishing apparatus that planarizes the surface of the wafer by chemical mechanical polishing. The processing state of each apparatus can be adjusted by adjustment of the processing parameters thereof, and also each apparatus can observe the processing state and can log data related to the processing state as log data. Further, each apparatus can input/output data via a communication network.

Between film forming apparatus 910, oxidation/ion-implantation apparatus 920, etching apparatus 930 and CMP apparatus 940, a carrier route in which wafer W can be carried between them is arranged. Besides these apparatuses, device manufacturing apparatus group 900 includes apparatuses that perform a probing processing, a repair processing, a dicing processing, a packaging processing, a bonding processing and the like.

[Carrier Line]

Carrier line 800 performs carriage of wafer W between various units in device manufacturing apparatus group 900 and exposure cell 700. Wafer W is carried from the apparatus that finishes a processing to wafer W to the apparatus that is to perform a processing to wafer W next, by concerted operation between carrier line 800 and carrier line 140 within exposure cell 700.

[Management Controller]

Management controller 160 intensively controls an exposure process that is implemented by exposure apparatus 100 or 101, and also performs management of C/D 110 within tracks 200A and 200B and control of their cooperative operation. As such a controller, for example, a personal computer (PC) can be employed. Management controller 160 receives information that shows the progress of processings and operations, information that shows processing results, measurement and/or inspection results and the like from each apparatus through the communication network within device manufacturing system 1000, grasps the status of the entire manufacturing line of device manufacturing system 1000, and performs management and control of each apparatus so that the exposure process and the like are appropriately performed.

[Analytical Apparatus]

Analytical apparatus 170 is connected to the communication network within device manufacturing system 1000 and can perform data transmission with the outside. Analytical apparatus 170 collects various types of data (data of various measurement and/or inspection results of measurement and/or inspection instrument 120 and data related to processing states of other apparatuses) via the communication network, and performs analysis of data related to processes to wafer W and optimization of processing conditions of each apparatus. As hardware to realize such analytical apparatus 170, for example, a personal computer can be employed. In this case, the analytical processing is realized by the execution of an analytical program that is executed by the CPU (not shown) of analytical apparatus 170. The analytical program is supplied by media (information recording medium) such as CD-ROM and executed in a state of being installed on the PC.

Analytical apparatus 170 compositely analyzes log data of exposure apparatus 100 and at least two types of measurement and/or inspection results in measurement and/or inspection instrument 120, and based on the analytical results, performs optimization of the processing conditions of various apparatuses. Herein, the processing conditions to be optimized differ depending on the analytical results, and are varied such as the control system parameters of exposure apparatus 100, the alignment-related parameters, the liquid-immersion-related parameters and a liquid immersion removal processing condition, processing conditions for the resist coating processing, the postbake (PEB) processing and the development processing in C/D 110, a measurement and/or inspection condition of measurement and/or inspection instrument 120, processing conditions of various apparatuses in device manufacturing apparatus group 900, and the like.

Further, analytical apparatus 170 has databases related to the measurement and/or inspection results of measurement and/or inspection instrument 120 and the processing contents of various apparatuses. One of the databases that are quipped in analytical apparatus 170 is a CD table group. The CD table group is a database that shows a relation between a pattern line width and each control error of an exposure dose, synchronous accuracy, focus and a lens. In the CD table group, a relation between the statistical value of each control error of an exposure dose, synchronous accuracy, focus and a lens in a period from when exposure area IA reaches a certain point on wafer W until when exposure area IA passes the certain point during relative synchronous scanning of wafer stage WST or WST' and reticle stage RST, and a line width of the certain point is stored.

The statistical value of each control error at a certain point (sample point) on the wafer can be computed based on the exposure dose trace data, synchronous accuracy trace data, focus trace data, lens trace data that are acquired from exposure apparatuses 100 and 101.

As will be described later, analytical apparatus 170 can estimate the pattern line width based on the statistical values of control errors of the exposure dose, the synchronous accuracy or the focus, referring to the CD table group as needed. Incidentally, in the case the statistical value of control error of the exposure dose, the synchronous accuracy or the focus is a value that is not registered as a line-width estimated value, the pattern line width can be estimated by interpolation of several values that are nearest to the value.

In order to effectively estimate the pattern line width based on the CD table group, the relation between the statistical values of various control errors and the pattern width needs to be registered in advance. When performing the registration, the statistical value of each control error that is computed from the trace data during exposure by the exposure apparatus (100, 101) to wafer W and the pattern line width that is measured by measurement and/or inspection instrument 120 only have to be actually stored in the table group.

Incidentally, the pattern line width registered in the CD table group may be not based on the measurement results of measurement and/or inspection instrument 120, but may be based on the values measured by the SEM or the values measured by the OCD method or the like, or may be the values that are obtained from an aerial image of a test pattern that is measured by an aerial image sensor that measures an aerial image of the test pattern.

Incidentally, even with the completely same exposure dose error, synchronous accuracy error, focus error and lens error, the pattern line width differs depending on the exposure conditions of exposure apparatus 100 or 101 and the design conditions of a pattern to be transferred. Therefore, the table group is prepared for each exposure condition and each pattern design condition. In this manner, it is necessary to compile a database of the table groups beforehand so that an estimated value of pattern line width can be searched using the exposure condition, the pattern design condition, the exposure dose error, the synchronous accuracy error, the focus error as keys. Incidentally, as the exposure conditions, there are an exposure wavelength, projection optical system NA, illumination NA, illumination σ, illumination types, depth of focus and the like, and as the pattern design conditions, there are mask line width, target line width (e.g. 130 nm), pattern pitch, mask types (binary, halftone, Levenson), pattern types (an isolated line, a line-and-space pattern) and the like. The relation between these exposure conditions and pattern design conditions and the pattern line width, and the setting method of other conditions such as an image height in the table are disclosed in detail in, for example, Kokai (Japanese Unexamined Patent Application Publication) No. 2001-338870.

The CD table group is used for optimization of parameters related to pattern line width in analytical apparatus 170. For example, when obtaining the combination of exposure-dose-control-related, synchronous-control-related, focus-control-related and lens-control-related system parameters, or the illumination condition as a precondition, or the like which makes the line width be closer to the design value, the CD table group is referred to.

In addition, analytical apparatus 170 is equipped with a database to store analytical results.

[Overall Control by Host]

As is described earlier, host 600 performs the overall control of device manufacturing system 1000, and each apparatus in device manufacturing system 1000 operates according to instructions from host 600. In the following description, the operation of the individual apparatus will be described.

[Operation of Exposure Apparatus]

Figure 22:
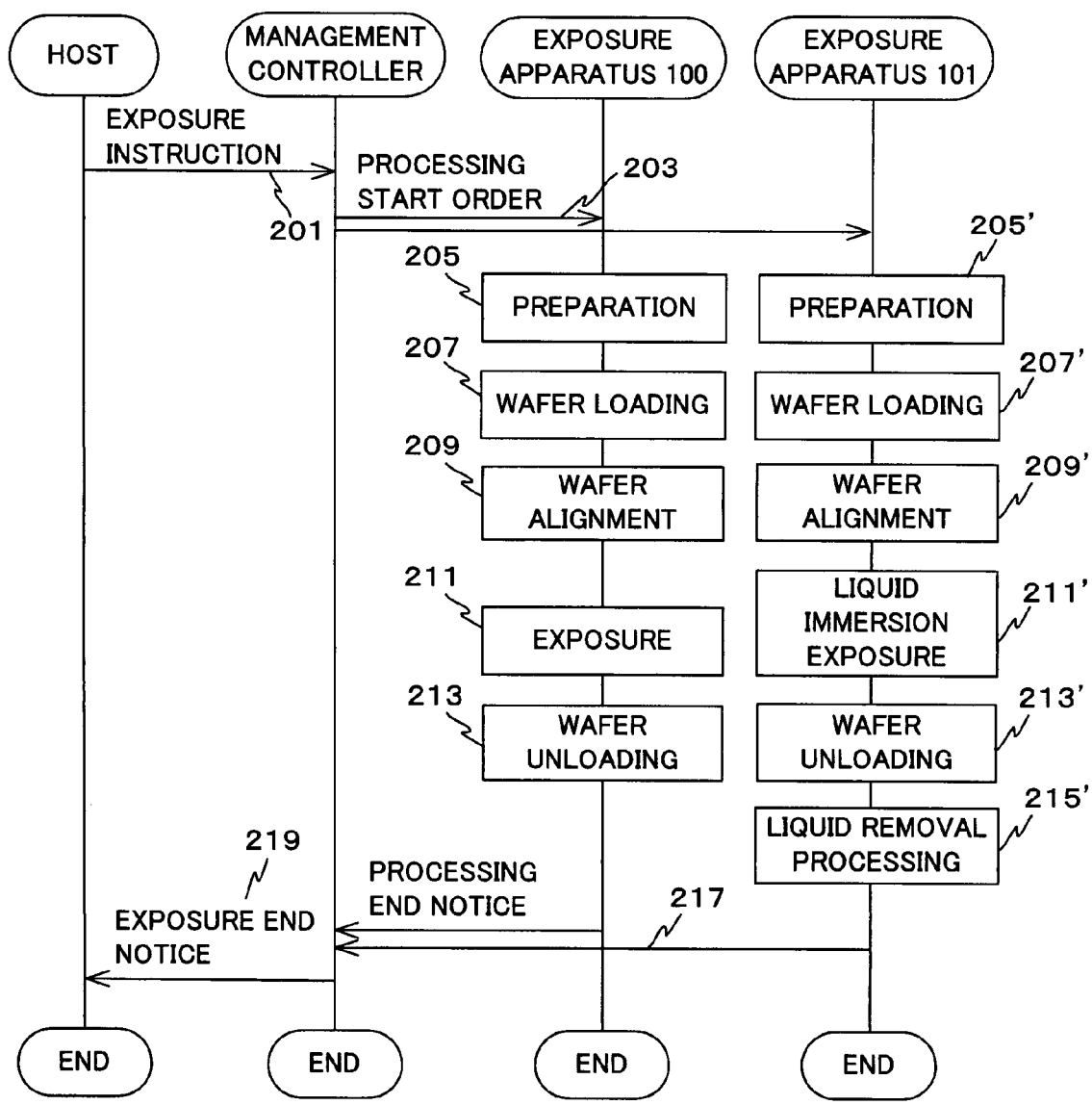
FIG. 22 is a view showing the control operation of an exposure apparatus by a host.

FIG. 22 shows a flow of operations of exposure apparatuses 100 and 101. As is shown in FIG. 22, first of all, host 600 outputs an exposure instruction for a certain wafer W to management controller 160 (step 201). In the exposure instruction, the designation of exposure recipe of the wafer W is also included. Management controller 160 judges whether or not a layer subject to exposure this time is a layer that requires high transfer accuracy (e.g. a layer where a contact hole is formed) referring to the exposure recipe, and transmits a processing start order to liquid immersion exposure apparatus 101 in the case the layer requires high transfer accuracy, or transmits a processing start order to dry exposure apparatus 100 if this is not the case (step 203).

When receiving the processing start order, dry exposure apparatus 100 loads relevant reticle R referring to the designated exposure recipe, and performs preparatory operations such as reticle alignment and baseline measurement (step 205). Then, after roughly aligning wafer W, dry exposure apparatus 100 loads wafer W on wafer stage WST (step 207). Next, dry exposure apparatus 100 measures search alignment marks and wafer marks ($MX_p$, $MY_p$) that are formed on-wafer W using alignment system ALG and performs alignment of wafer W (step 209). Then, dry exposure apparatus 100 performs exposure by a step-and-scan method (step 211). After the exposure, dry exposure apparatus 100 unloads wafer W (step 213).

On the other hand, when receiving the processing start order, liquid immersion exposure apparatus 101 loads relevant reticle R referring to the designated exposure recipe and performs preparatory operations such as reticle alignment and baseline measurement (step 205'). Then, after roughly aligning wafer W, liquid immersion exposure apparatus 101 loads wafer W on wafer stage WST' (step 207'). Next, liquid immersion exposure apparatus 101 measures wafer marks ($MX_p$, $MY_p$) formed on wafer W using alignment system ALG and performs wafer alignment (step 209'). Then, liquid immersion exposure apparatus 101 performs exposure to wafer W by driving wafer stage WST' in a predetermined route and synchronously scanning reticle stage RST appropriately (step 211'). After the exposure, liquid immersion exposure apparatus 101 unloads wafer W (step 213') and then performs a liquid removal processing of wafer W using removal unit T (step 215'). Incidentally, although not shown in FIG. 22, monitoring by liquid immersion monitor 260 is also performed as needed.

After completing all the processings described above, dry exposure apparatus 100 or liquid immersion exposure apparatus 101 transmits a processing end notice to management controller 160 (step 217). Management controller 160 notifies the exposure end to host 600. (step 219).

Figure 23:
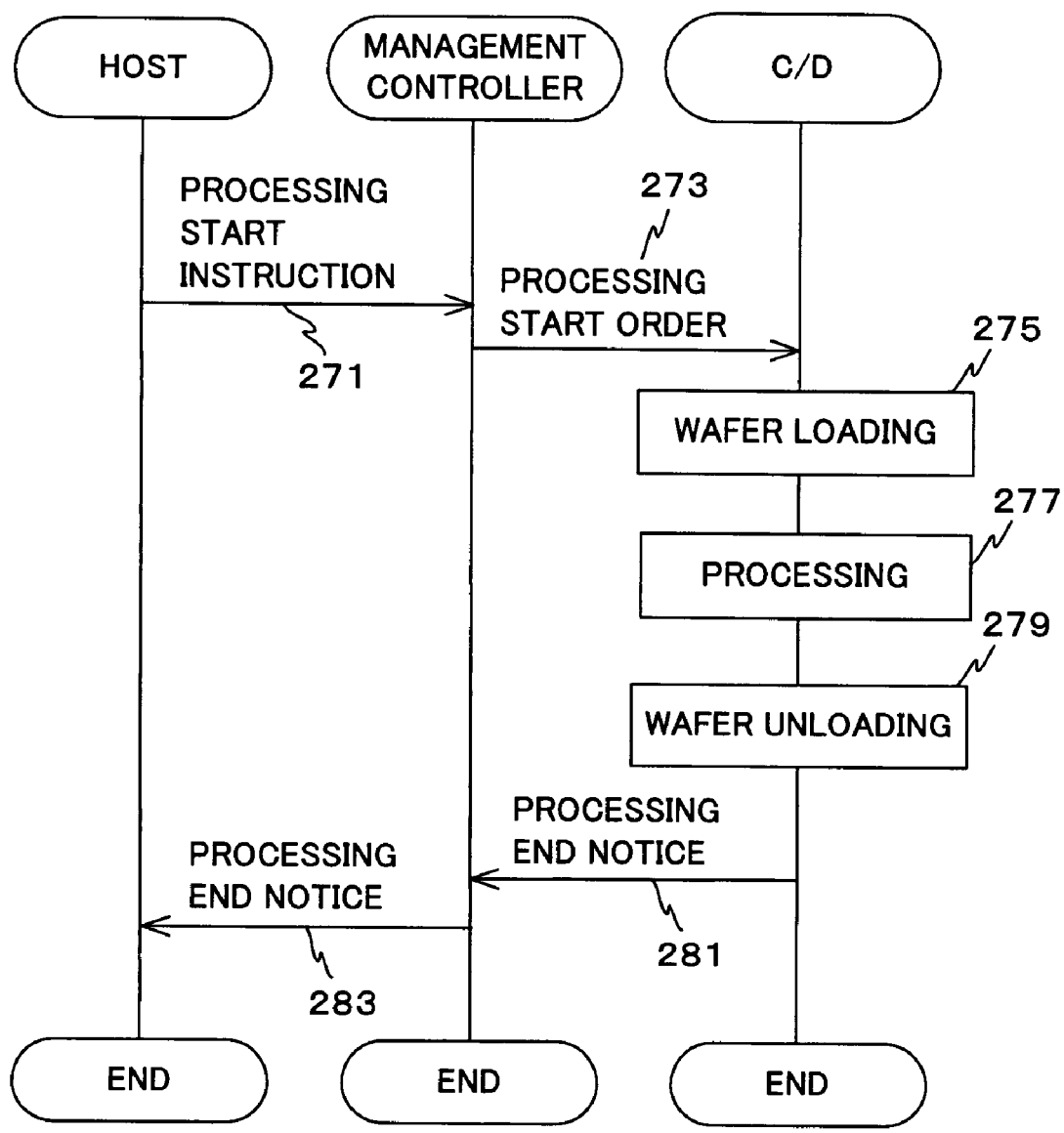
FIG. 23 is a view showing the control operation of a C/D by the host.

FIG. 23 shows a flow of operations of C/D 110. As is shown in FIG. 23, first of all, host 600 transmits a processing start instruction to management controller 160 (step 271). Management controller 160 transmits a processing start order to C/D 110 (step 237). In the processing start order, information on the processing contents (resist coating, development and postbake) to be performed to wafer W is included. C/D 110 loads wafer W on a stage of a unit that performs a processing to be performed, for example, the coater, the developer or the postbake unit (step 275). Then, C/D 110 performs the ordered processing (resist coating, postbake, development) to wafer W (step 277). After the processing, C/D 110 unloads wafer W (step 279). C/D 110 transmits a processing end notice to management controller 160 (step 281), and management controller 160 transmits the processing end notice to host 600 (step 283).

Figure 24:
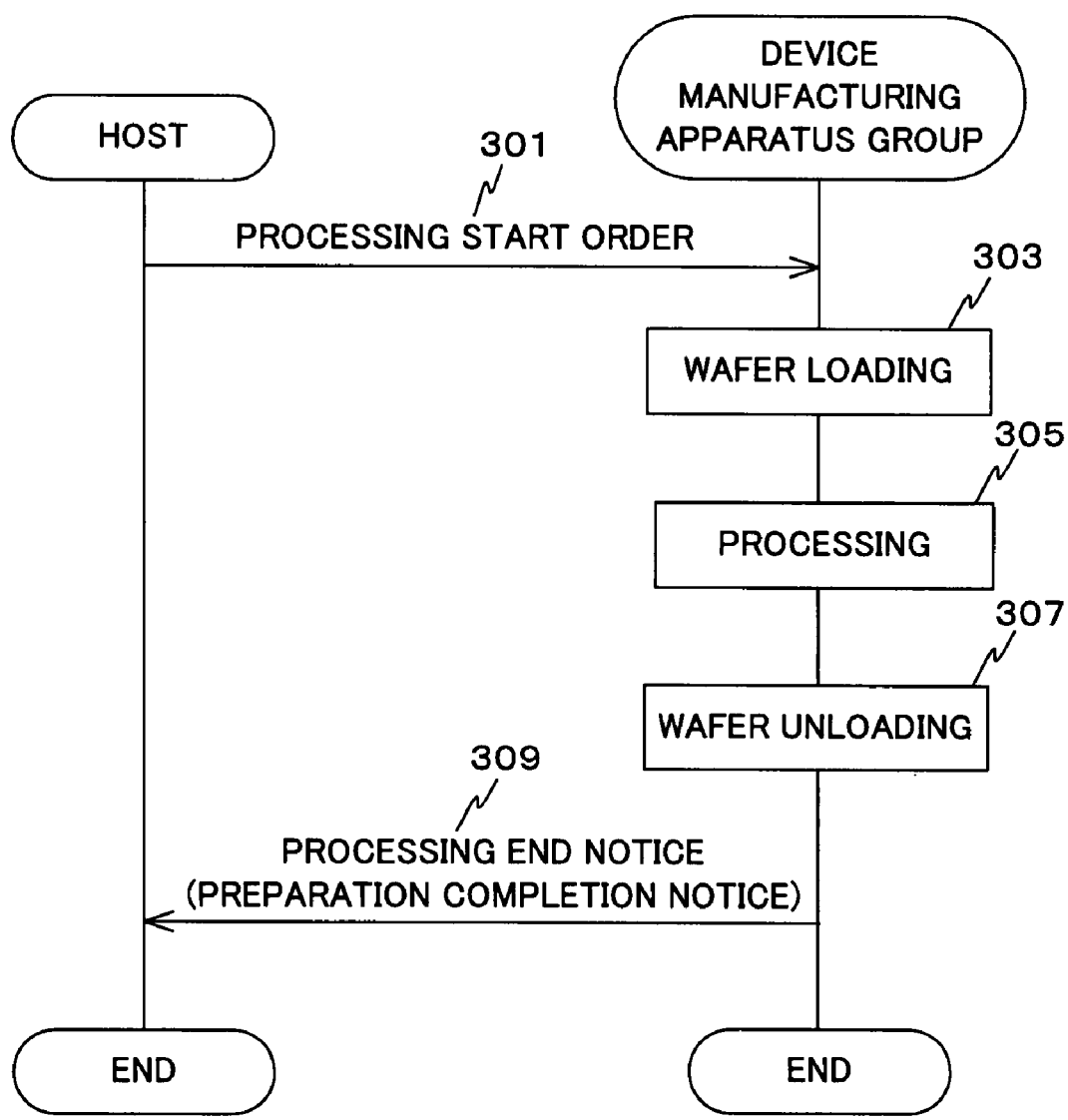
FIG. 24 is a view showing the control operation of a device manufacturing apparatus group by the host.

FIG. 24 shows a flow of operations of each apparatus of device manufacturing apparatus group 900. The flow of operations of each apparatus of device manufacturing apparatus group 900 shown in FIG. 24 is substantially the same as the flow of operations of C/D 110 shown in FIG. 23. That is, each apparatus that receives a processing start order from host 600 (step 301) loads wafer W (step 303), performs a predetermined processing to wafer W (step 305), unloads the wafer W (step 307) and sends a processing end notice to host 600 (step 309).

Figure 25:
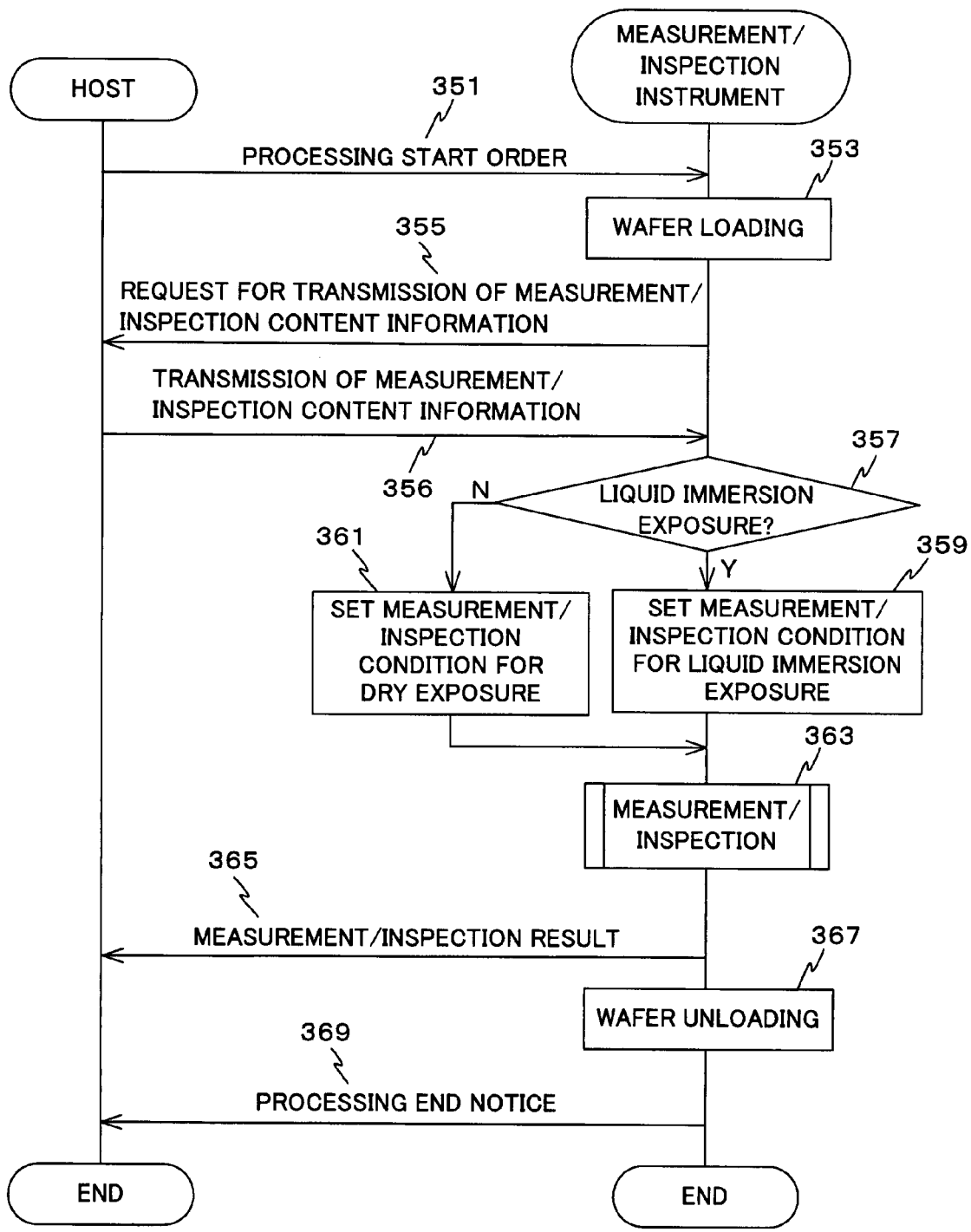
FIG. 25 is a view showing the control operation of a measurement and/or inspection instrument by the host.

FIG. 25 shows a flow of processings of host 600 and measurement and/or inspection instrument 120. Host 600 sends a processing start order to measurement and/or inspection instrument 120 (step 351). Next, measurement and/or inspection instrument 120 loads wafer W (step 353). Then, measurement and/or inspection instrument 120 sends a request for transmission of measurement and/or inspection content information to host 600 (step 355), and host 600 transmits information of measurement and/or inspection contents to measurement and/or inspection instrument 120 (step 356). The measurement and/or inspection contents include, for example, information with which whether or not wafer W has been exposed by liquid immersion exposure can be identified, besides measurement and/or inspection contents such as inspection of films on wafer W, detection of wafer marks, appearance inspection of foreign substances, stains or the like, line width measurement, and measurement of overlay error. Next, measurement and/or inspection instrument 120 judges whether or not loaded wafer W has been exposed by liquid immersion exposure, referring to information such as IC chip (IC tag) embedded in wafer W or barcode, or measurement and/or inspection content information sent from host 600 (step 357). When the judgment is affirmed, the procedure proceeds to step 359, and when the judgment is denied, the procedure proceeds to step 361. In the embodiment, the measurement and/or inspection contents of measurement and/or inspection instrument 12 are changed between liquid immersion exposure and dry exposure. Then, in step 359, the processing contents of the apparatus and the like are set so that measurement and/or inspection is performed under the measurement and/or inspection conditions for liquid immersion exposure, and in step 361, the processing contents of the apparatus and the like are set so that measurement and/or inspection is performed under the measurement and/or inspection conditions for dry exposure. In this manner, the measurement and/or inspection contents in measurement and/or inspection instrument 120 are different between dry exposure and liquid immersion exposure. The inspection conditions in liquid immersion exposure will be described next.

First, in the case of wafer W that is exposed in a liquid immersion exposure method, as is shown in FIGS. 7A to 7C, since topcoat film TC is formed on resist film RL, measurement and/or inspection of topcoat film TC is added to the measurement and/or inspection contents in the case of liquid immersion exposure.

Further, since the size of a pattern formed by liquid immersion exposure is smaller than the size of a pattern formed by dry exposure in general, the required accuracy for pattern line width and overlay error are to be set higher. For example, when measuring the pattern line width or the overlay error by the image processing method, the magnification of image data only has to be set larger, or the pixel size only has to be changed in a direction of increasing the detection sensitivity.

Regardless of the detection method, in the case of measurement and/or inspection in liquid immersion exposure, the sensitivity of the pattern defect is preferably set higher than that in the case of dry exposure. This is because the size of a pattern formed by liquid immersion exposure is smaller as is described above, and therefore, the size of the defect of the pattern that affects the yield is also relatively smaller.

Further, in the case the wavelength of illumination light that illuminates wafer W in measurement and/or inspection instrument 120 can be selected, the shorter wavelength is preferably selected. For example, when the selectable range of wavelengths is 260 nm to 500 nm, the wavelength of illumination light is set to 260 nm in the measurement and/or inspection in liquid immersion exposure.

Further, when either one of an optical method and an electron beam (EB) method can be selected as a detection method of a pattern defect, the EB method is preferably selected. Further, when the bright field and the dark field can be selected, the bright field is preferably selected because films on wafer W are formed in multi layers in liquid immersion exposure. Further, when the detection method is the optical method and a layer having a high level difference is a target, a confocal system is preferably selected in the case the confocal system can be selected as the optical system.

Further, in the case an image comparison algorithm, a design data comparison algorithm, a feature extraction algorithm and the like can be selected as a detection algorithm of a pattern defect, the image comparison algorithm or the feature extraction algorithm is preferably selected. Herein, the image comparison algorithm is an algorithm in which a pattern defect is extracted by, for example, comparing image data of two shot areas in which the same device pattern should have been formed are compared by die-to-die or cell-to-cell. Further, the design data comparison algorithm is an algorithm in which a pattern defect is extracted by, for example, comparing a line width of a pattern that is extracted from image data of a device pattern with the value in design thereof. Further, the feature extraction algorithm is an algorithm in which a feature included in image data of a device pattern is extracted and a pattern defect is extracted from the feature.

Further, in the case detection of foreign substances by a laser scan method or the like is performed, the sensitivity, the number and the angle of a photomultiplier that detects the scattered light can also be adjusted.

Further, at the time of liquid immersion exposure, detection processings are added and/or changed as will be described below.

(1) Inspection of pattern defects peculiar to liquid immersion
(2) Inspection of watermarks, stains due to exuding of a resist component, resist peeling and the like
(3) Inspection of particles/foreign substances adhering to the remaining liquid that is left on wafer W
(4) Intensive inspection of points at which the liquid immersion state is expected to be unfavorable Among the inspections referred to above, the inspection of pattern defects peculiar to liquid immersion in (1) is important. In the state as is shown in FIG. 7A where liquid LQ and a foreign substance (bubble, particle) enters into a boundary portion between resist film RL and topcoat film TC, in the state as is shown in FIG. 7B where foreign substance IB such as a particle or a watermark adheres on topcoat film TC, in the state as is shown in FIG. 7C where a foreign substance such as bubbles BB and/or particle PT exists in the liquid immersion area, and besides, in a state where a part of topcoat film TC is peeled off, sometimes a pattern that is foreign to a device pattern appears on the wafer surface due to the state, after the PEB processing.

Figure 26A:
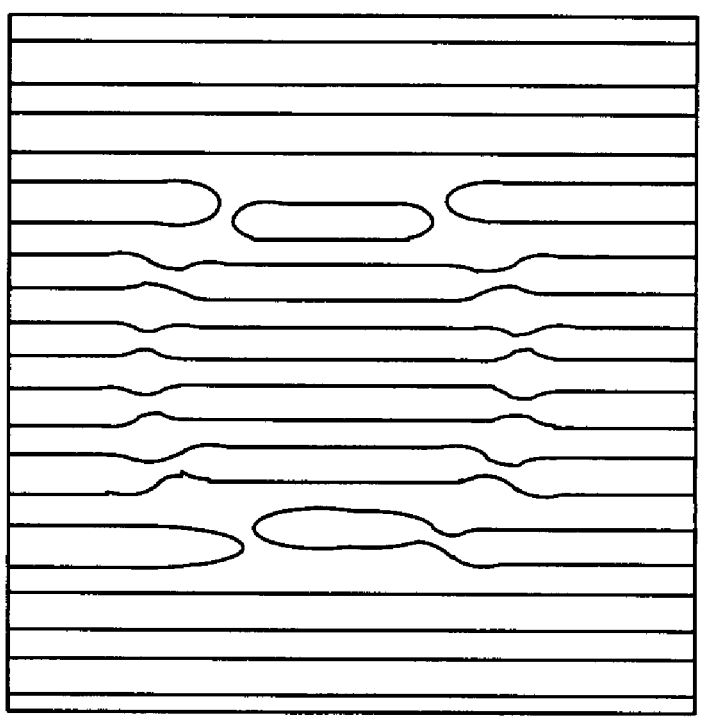
FIG. 26A is an example of an image showing a pattern defect peculiar to liquid immersion at the time of liquid immersion exposure.
Figure 26B:
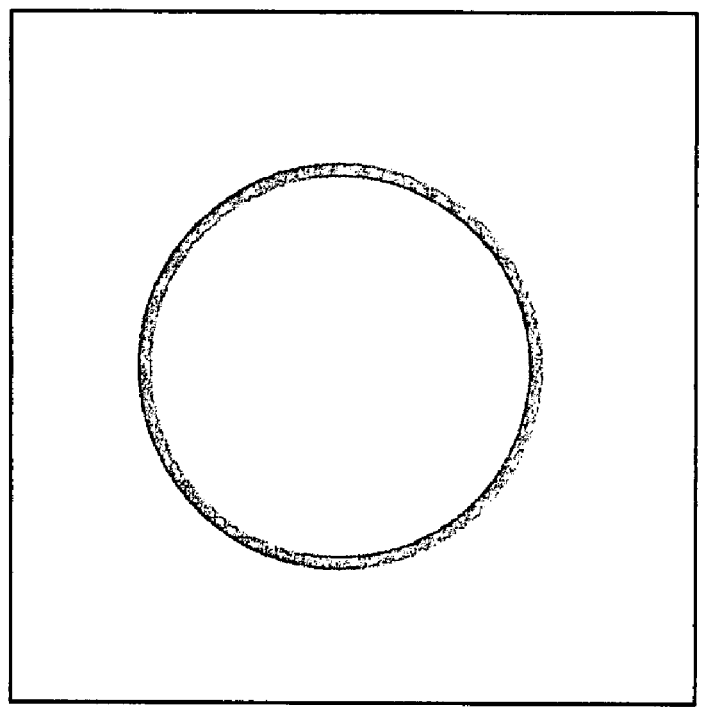
FIG. 26B is a view showing the characteristics of a pattern peculiar to liquid immersion.

FIG. 26A shows an example of an image showing a pattern defect peculiar to liquid immersion. In FIG. 26A, the line width of part of the linear device pattern becomes thinner due to the above-described liquid immersion states shown in FIGS. 7A to 7C. When extracting the pattern defect portion by obtaining the difference between the image data in FIG. 26A and image data corresponding to an original device pattern (design pattern), a circular pattern appears as is shown in FIG. 26B. In this manner, in liquid immersion exposure, when the exposure state deteriorates, a pattern that is completely irrelevant to a device pattern and is peculiar to liquid immersion appears due to the foreign substance, the bubble, or the watermark, and therefore, measurement and/or inspection instrument 120 needs to inspect whether or not such a pattern is formed. In order to detect such a pattern peculiar to liquid immersion, a composite processing may also be performed by using the combination of plural types of algorithms such as the feature extraction algorithm and the image comparison algorithm as described above.

Further, for example, in the case of the defect due to the bubble, there are the characteristics that a circular bright section exists in the vicinity outside the bubble, and inside the bubble, a dark section serves as a base and a pattern different from that in the vicinity appears. Further, as a peculiar pattern due to the watermark, a pattern like a dark mass is entirely formed.

Further, the intensive inspection of points at which the liquid immersion state is expected to be unfavorable in (4) is also important.

In other words, when performing exposure to shot areas $SA_p$ near the wafer outer circumference, the liquid immersion area protrudes from wafer W, and sometimes a pattern defect occurs frequently in these shot areas since the state in these shot areas is different from the case where shot areas in the center portion of wafer W are exposed. Thus, in the case of liquid immersion exposure, it can be considered that pattern defect inspection near the outer circumference is performed more intensively than near the center of wafer W.

Moreover, in liquid immersion exposure, it is known that the temperature of wafer W is lowered due to volatilization of liquid from the wafer W surface and the like, and the deformation degree of wafer W becomes larger than that in dry exposure and the wafer scaling fluctuates. Therefore, regarding the overlay error measurement of a device pattern, the measurement frequency for the outer circumference of wafer W may also be increased.

Further, in liquid immersion exposure, it can be said that measurement of distortion of shot area itself (shot distortion), measurement of aberration of projection optical system PL and the like are preferably set to be performed frequently.

Referring back to FIG. 25, after the measurement and/or inspection conditions are set in step 359 or 361, measurement and/or inspection is performed under the set measurement and/or inspection conditions (step 363). In the next step, step 365, measurement and/or inspection instrument 120 sends the measurement and/or inspection results to host 600. In the next step, step 367, measurement and/or inspection instrument 120 unloads wafer W. In the next step, step 369, measurement and/or inspection instrument 120 returns a processing end notice to the host.

Figure 27:
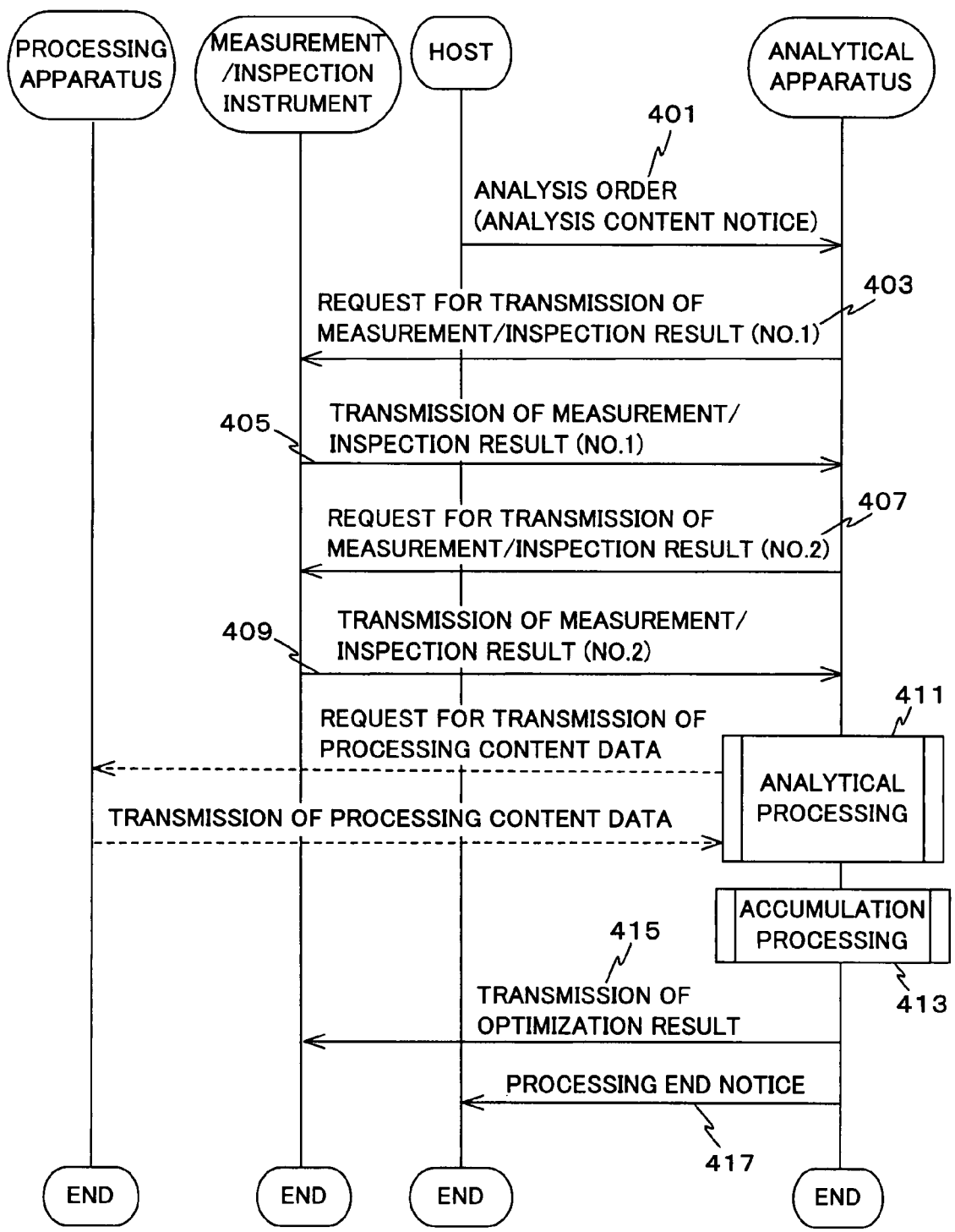
FIG. 27 is a view showing the control operation of an analytical apparatus by the host.

FIG. 27 shows a flow of processings of host 600 and analytical apparatus 170. Host 600 sends an analysis order to analytical apparatus 170 (step 401). The analysis order includes specific analysis contents that are to be analyzed in the analytical apparatus. Next, analytical apparatus 170 reads the analysis contents and requests measurement and/or inspection instrument 120 for a measurement and/or inspection result (No. 1) required for the analysis (step 403). Measurement and/or inspection instrument 120 sends measurement and/or inspection result data (No. 1) to analytical apparatus 170 (step 405). Incidentally, the measurement and/or inspection result data also includes information on measurement and/or inspection conditions, besides the measurement and/or inspection results. Furthermore, analytical apparatus 170 requests measurement and/or inspection instrument 120 for a measurement and/or inspection result (No. 2) required for analysis (step 407). Measurement and/or inspection instrument 120 sends measurement and/or inspection result data (No. 2) to analytical apparatus 170 (step 409). Incidentally, the measurement and/or inspection result data also includes information on measurement and/or inspection conditions, besides the measurement and/or inspection results.

Next, analytical apparatus 170 performs an analytical processing (step 411). When, performing the analytical processing, analytical apparatus 170 requests the processing apparatus such as exposure apparatus 100 or 101 for transmission of processing contents data required for the analysis, as needed. The processing apparatus that receives the request transmits the processing contents data to analytical apparatus 170. After finishing the analytical processing, analytical apparatus 170 performs an accumulation processing of accumulating the collected measurement and/or inspection results and data of analytical results in a database (step 413). Next, analytical apparatus 170 sends the analytical results (optimization results) to the processing apparatus such as measurement and/or inspection instrument 120 and/or exposure apparatus 100 or 101, as needed (step 415). Finally, analytical apparatus 170 returns a processing end notice to host 600 (step 417).

As is described above, host 600 uses the control operation to each apparatus shown in FIGS. 22 to 25 and FIG. 27 as one processing unit to make each apparatus operate and execute a series of processes. Incidentally, these operations are merely examples, and exposure apparatuses 100 and 101 may be made to operate according to instructions from analytical apparatus 170 via the management controller or without it.

[Device Manufacturing Process]

Next, a flow of a series of processes in device manufacturing system 1000 will be described. The series of processes of device manufacturing system 1000 are scheduled and controlled by host 600. The table in FIG. 28 shows processing items that can be executed in the series of processes. In the columns of a main item in the table, rough processing procedures that could be executed in order are described in the processing order. As is shown in the table, in the series of processes, first of all, a film formation/resist coating processing and a wafer measurement and/or inspection processing (A), a wafer measurement and/or inspection processing (B), an exposure processing and a wafer measurement and/or inspection processing (C), a PEB processing and a wafer measurement and/or inspection processing (D), a development processing and a wafer measurement and/or inspection processing (E), an etching processing and a wafer measurement and/or inspection processing (F), and an impurity diffusion processing and a wiring processing are repeatedly performed, and after the device pattern of each layer is all formed, a probing processing, a repair processing, a dicing processing, a packaging processing and a bonding processing are performed and finally a device is completed. Incidentally, the abnormality detected in the measurement and/or inspection processing is used for adjustment or the like of processing contents of the various processings described above, that is, the film formation/resist coating processing, the exposure processing, the PEB processing, the development processing, the etching processing, the impurity diffusion processing and the wiring processing, the probing processing, the repair processing and the like.

In the embodiment, the processings corresponding to the main items shown in FIG. 28 are to be repeated with respect to each wafer, for example, in a pipeline manner.

In the columns of subitems, specific processing contents that are actually performed during the corresponding processings in the main items are described. In the columns of the subitem (essential), the processings that are performed without fail in the series of processes are indicated. Further, in the columns of the subitem (liquid immersion), the processings, which are performed without fail in the process in which exposure in liquid immersion exposure apparatus 101 is performed, are described. For example, in the film formation/resist coating processing, antireflection film formation (film formation) and resist coating are the essential processings, but topcoat film coating is essential only in the case of performing liquid immersion exposure. In the case of performing liquid immersion exposure, the processings in the subitems (liquid immersion) also become the essential processings.

Further, in the columns of the subitem (selection), the processings whose execution or non-execution is selected by host 600 are described. The processings designated as the subitems (selection) are the measurement and/or inspection processings that are performed in each stage of the series of processes.

First, in film formation/resist coating processing and wafer measurement and/or inspection processing (A), film thickness measurement of an antireflection film, a resist film and a topcoat film, appearance inspection of films (inspection of physical abnormality such as scratch and chemical abnormality such as entry of foreign substances such as infiltrating of liquid), and the like are selectively performed. Besides, in wafer measurement and/or inspection processing (B), alignment pre-measurement (pre-measurement of wafer mark M), focus pre-measurement (measurement of surface shape of wafer W), and appearance inspection of wafer W (mainly, inspection of foreign substances on wafer W) are selectively performed.

Further, in wafer measurement and/or inspection processing (C), appearance inspection (mainly, inspection of foreign substances on wafer W) is performed, and in wafer measurement and/or inspection processing (D), appearance inspection (mainly, pattern inspection such as inspection of stains on wafer W) is performed. In wafer measurement and/or inspection processings (E) and (F), pattern defect inspection, pattern line width (size) measurement, overlay error measurement and the like are selectively performed.

Host 600 creates a series of processing procedures by selecting in advance the processings of performing measurement and/or inspection required for the analysis performed in analytical apparatus 170 from among the subitems (selection), and combining the subitems (essential) (or the subitems (essential) and the subitems (liquid immersion)) and the selected subitems (selection) in the order in the table shown in FIG. 28, and executes the created processing procedures. In the following description, the combination of the processing procedures in the series of processes created in host 600 and analytical contents that can be performed in analytical apparatus 170 will be described.

(1) Optimization of Processing Conditions Related to Wafer alignment

First, the case will be described where optimization of processing conditions related to wafer alignment is performed. In the case of performing the optimization, host 600 creates processing procedures by selecting the subitem (selection): film thickness measurement processing of each film in the main item: wafer measurement and/or inspection processing (A) and the subitem (selection): alignment pre-measurement in the main item: wafer measurement and/or inspection processing (B) Herein, the alignment pre-measurement is a processing where pre-measurement of the wafer marks ($MX_p$, $MY_p$) in measurement and/or inspection instrument 120 is performed before carrying wafer W into exposure apparatus 100 or 101.

Figure 29A:
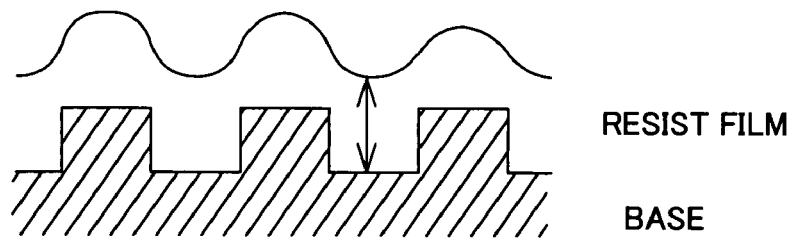
FIG. 29A is a sectional view of part of a wafer.

FIG. 29A shows a sectional view of part of wafer W. As is shown in FIG. 29A, uneven marks are formed on the base of wafer W, and a resist film is coated on the uneven marks by C/D 110 in the film formation/resist coating processing (refer to FIG. 28). Incidentally, in actual, an antireflection film is formed under the resist film, and in the case liquid immersion exposure is performed, a topcoat film is further formed on the resist film. However, theses films are omitted in FIG. 29A for simplification of the description. Alignment system ALG photoelectrically detects intensity images of the uneven marks on the base shown in FIG. 29A with epi-illumination and acquires waveform data corresponding to the photoelectrically detected intensity images.

Figure 29B:
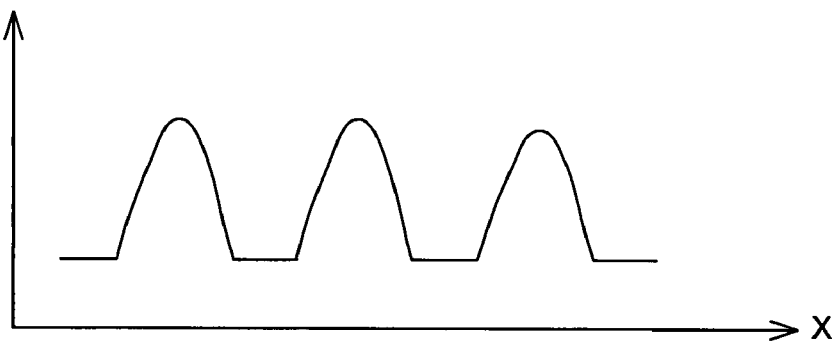
FIG. 29B is an example of mark waveform data.

FIG. 29B shows an example of the one-dimensional waveform data. As is shown in FIG. 29B, the one-dimensional waveform data shows the waveform having three peaks in accordance with the unevenness of the marks.

Figure 29C:
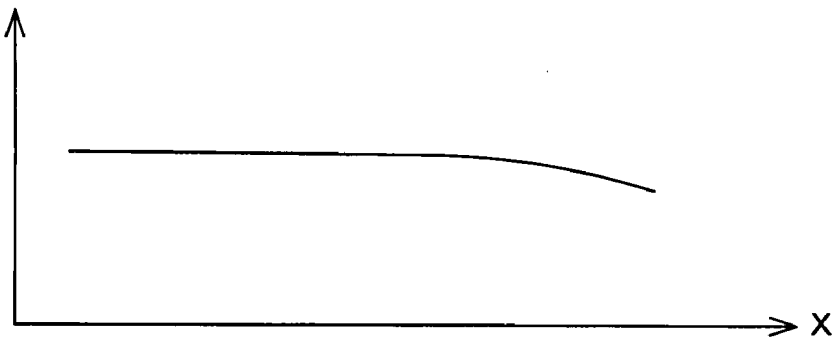
FIG. 29C is an example of film thickness data.

Further, FIG. 29C shows an example of film thickness data of a resist film on wafer W corresponding to the one-dimensional waveform data. Incidentally, in actual, the film thickness data of a resist film is two-dimensional (XY coordinate system) data, but herein, the film thickness data is converted into one-dimensional data in the measurement axis direction so as to accord with the mark waveform data. Various methods can be employed as the method of conversion, and the one-dimensional data can be obtained by totaling and/or averaging data in a direction orthogonal to the measurement axis direction. It is known that since alignment system ALG episcopically illuminates the wafer mark from above the resist film and photoelectrically detects an intensity image by a reflected light and/or a diffracted light from the wafer mark in the wafer alignment, the intensity image is easily affected by the resist film or the like. Then, in optimization of this case, the processing conditions related to wafer alignment are efficiently optimized, by analyzing the correlativity between the mark waveform data shown in FIG. 29B and the film thickness data shown in FIG. 29C, determining whether the cause of abnormality in the mark waveform data is the resist film or the like, or the base (mark itself) in accordance with the degree of correlation, and narrowing down the processing conditions that are effective for solving the cause.

For example, in the examples shown in FIG. 29A and FIG. 29C, the film thickness on the right side of the waveform is slightly thinner, and also in the waveform data shown in FIG. 29B, the rightmost peak is smaller, and the correlativity between the mark waveform data and the film thickness data is considered to be high. Since it is difficult to accurately detect position information of the mark using such waveform data, any measures needs to be taken. As the measures to be taken in such a case, for example, the method in which the ununiformity of a resist film shown in FIG. 29A is solved can be considered. This is because it can be considered that asymmetry property of the mark waveform is solved by solving the ununiformity, and it becomes possible to accurately detect the mark position. Further, the measures can also be considered in which actual-measurement-required parameters used to acquire the mark waveform data in alignment system ALG are re-set to a state that is not affected by the ununiformity of film thickness.

As such actual-measurement-required parameters, for examples, there are the wavelength of illumination light of epi-illumination, and the like. By setting the wavelength of illumination light in the range that is insensitive to a resist film or the like, the intensity image of the mark can be detected regardless of the ununiformity of film thickness.

On the other hand, in the case there is no correlation between the asymmetry property of the mark waveform data and the film thickness data, which is different from the examples shown in FIG. 29B and FIG. 29C, the mark itself as the base is considered to have asymmetry property. Then, in such a case, the mark only has to be excluded from the measurement subject.

In the case of trying to perform optimization in this case, host 600 selects film thickness measurement of an antireflection film, film thickness measurement of a resist film and film thickness measurement of a topcoat film by measurement and/or inspection instrument 120 from among the subitems (selection) in the main item: film formation/resist coating processing and wafer measurement and/or inspection processing (A), and alignment pre-measurement by measurement and/or inspection instrument 120 from among the subitems (selection) in the main item: wafer measurement and/or inspection processing (B), and creates processing procedures of a series of processes so that the selected processings are executed. In this case, in actual, as is shown in a frame in FIG. 30, a film formation processing of an antireflection film in film forming apparatus 910, a film thickness measurement processing of the antireflection film in measurement and/or inspection instrument 120, a resist film coating processing in C/D 110, a film thickness measurement processing of the resist film in measurement and/or inspection instrument 120, (in the case of liquid immersion exposure, in addition to these processings, a film formation processing of a topcoat film in film forming apparatus 910, a film thickness measurement processing of the topcoat film in measurement and/or inspection instrument 120), an alignment pre-measurement processing in measurement and/or inspection instrument 120, and an exposure processing are to be executed in this order. By executing this process, each film thickness data of an antireflection film, a resist film and a topcoat film and waveform data of wafer marks are measured. Incidentally, in the case abnormality is detected in the inspection processing of each film, the film is to be removed once, and a film is to be newly formed or coated. Further, an antireflection film and a topcoat film are formed by the coating in C/D 110 in some cases.

Host 600 issues a processing start order to analytical apparatus 170 according to the processing in FIG. 27, before exposure is started (step 401). The processing start order is an order that optimization of processing conditions related to wafer alignment in (1) should be performed. Analytical apparatus 170 performs steps 403 to 409, and acquires various film thickness data, data of alignment pre-measurement and the like from measurement and/or inspection instrument 120.

Figure 30:
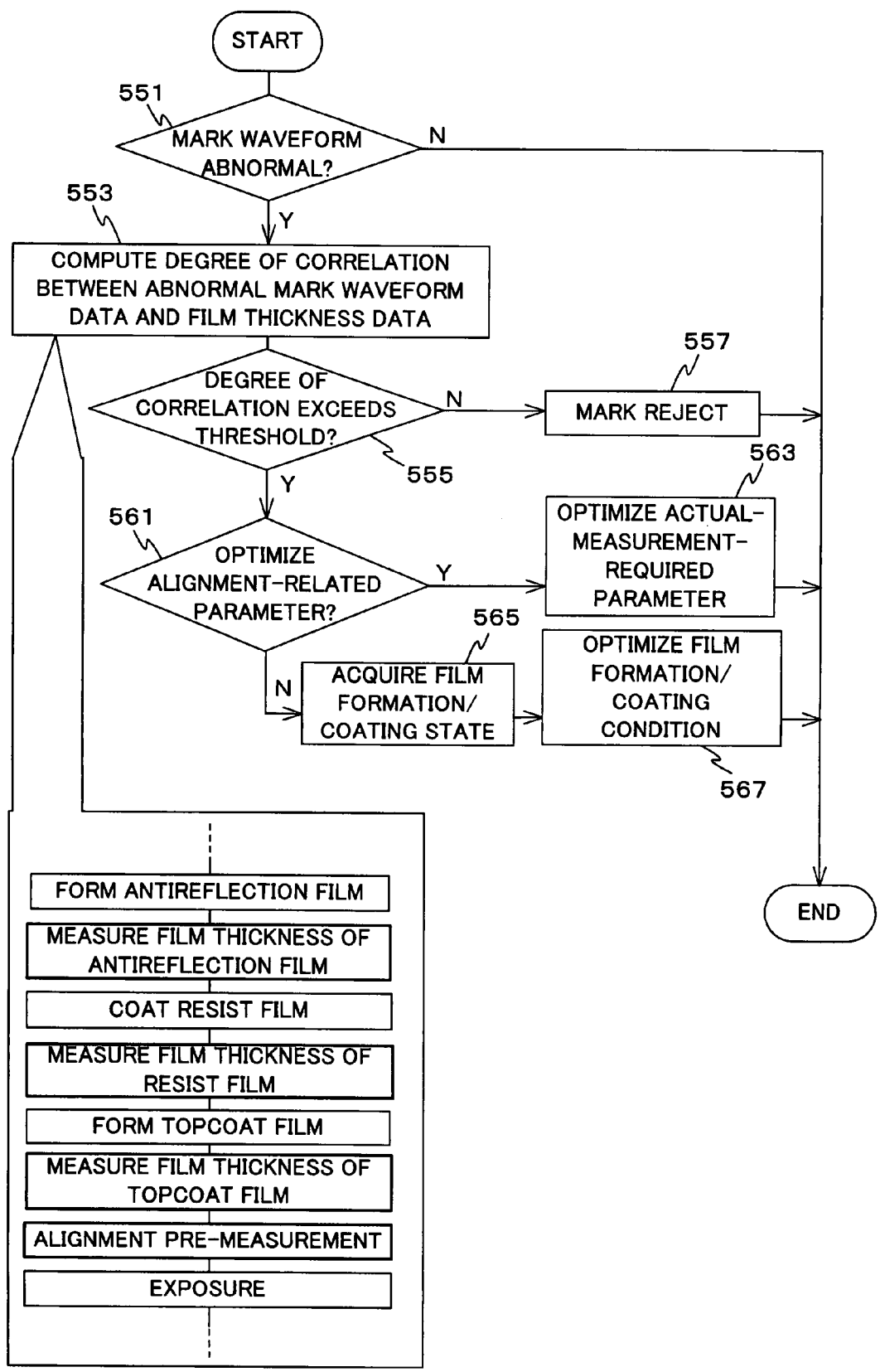
FIG. 30 is a flowchart of optimization of wafer alignment.

FIG. 30 shows a flowchart of an analytical processing in step 411 in FIG. 27 for the optimization processing. The analytical processing is performed with respect to each wafer mark for which waveform data has been acquired. As is shown in FIG. 30, first, in step 551, whether or not there is abnormality in mark waveform data is judged. When the judgment is denied, the processing is finished, and when the judgment is affirmed, the procedure proceeds to step 553.

In step 553, the degree of correlation between the mark waveform data having abnormality and the film thickness data is computed, and in step 555, whether or not the degree of correlation exceeds a threshold is judged. When the judgment is denied, the procedure proceeds to step 557, and when the judgment is affirmed, the procedure proceeds to step 561.

When the judgment is denied, it can be considered that there is no correlation between the mark waveform data and the film thickness data and the mark waveform data has abnormality due to the base of wafer W. Then, in step 557, the alignment-related parameters are optimized so that the wafer mark is rejected from measurement subject.

On the other hand, when the judgment in step 555 is affirmed, it can be considered that there is the correlation between the mark waveform data and the film thickness date and the mark waveform data has abnormality due to the ununiformity of film thickness of various films. In this case, the procedure proceeds to step 561, in which whether or not to optimize the alignment-related-parameters is judged. When the judgment is affirmed, that is, in the case the instruction from host 600 is set so as to adjust the alignment-related-parameters, the procedure proceeds to step 563, in which actual-measurement-required parameters among the alignment-related-parameters are optimized. As the actual-measurement-required parameters to be optimized, an alignment sensor to be selected (FIA or LSA), the wavelength of illumination light that is not affected by a resist film or the like, a detection algorithm in which a mark position can be accurately detected even if the mark waveform has a high degree of asymmetry, and the like can be cited. Meanwhile, when the judgment in step 561 is denied, the procedure proceeds to step 565, in which data related to a processing state of film formation/coating (i.e. processing parameters, and monitoring data of a processing state) is acquired from film forming apparatus 910 or C/D 110. In step 567, based on the acquired processing state, optimization of film formation/coating conditions is performed. In other words, in this case, the processing conditions in C/D 110 and/or film forming apparatus 910 (such as a film formation condition of an antireflection film, a coating condition of a resist film, and a film formation condition of a topcoat film) are optimized so that the ununiformity of film thickness that has caused the asymmetry of the mark is solved.

After this processing, as is shown in FIG. 27, in the accumulation processing in step 413, data such as the mark waveform data and the film thickness data, and the optimized alignment-related parameters and history related to film formation/coating conditions, and the like are accumulated in the database of analytical apparatus 170. Then, in step 415, information on the parameters that have been optimized in steps 557, 563 and 567 is sent to the relevant apparatus, that is, exposure apparatus 100 or 101, or C/D 110 and film forming apparatus 910. Each apparatus changes the relevant parameters to the optimum values and performs the subsequent processings. Thus, feedback control of the film formation/coating conditions in film forming apparatus 910 and C/D 110 is realized, and feedforward control of the alignment-related parameters in exposure apparatus 100 or 101 is realized.

Analytical apparatus 170 returns a processing end notice to host 600 (step 417).

Incidentally, in the embodiment, either one of the optimization of the alignment-related parameters or the optimization of the film formation/coating conditions is performed, but both the optimizations may be performed.

Further, the subject for computation of the correlation with the mark waveform data is not limited to film thickness data of an individual film, that is, an antireflection film, a resist film, and a topcoat film, but film thickness data that is obtained by totaling all the films' thickness, or film thickness data of thickness of two films in total out of the three films may be employed. Thus, it becomes possible to analyze in more detail which film out of the three films affects the mark waveform data.

Incidentally, in the embodiment, the case has been described where the mark waveform data is one-dimensional data and the film thickness data is converted from two-dimensional data into one-dimensional data, but the mark waveform data may be two-dimensional data of the XY coordinate system. In this case, in step 553, the correlation between both two-dimensional data is to be computed.

(2) Optimization of Focus-control-related Parameters

Next, the case will be described where optimization of focus-control-related parameters on exposure is performed. In this case, host 600 selects the subitem (selection): film thickness measurement of each film in the main item: wafer measurement and/or inspection processing (A) and the subitem (selection): focus pre-measurement in the main item: wafer measurement and/or inspection processing (B), and creates processing procedures. The focus pre-measurement is the processing of performing pre-measurement of a surface shape of wafer W in measurement and/or inspection instrument 120 before carrying wafer W into exposure apparatus 100 or 101.

Figure 31A:
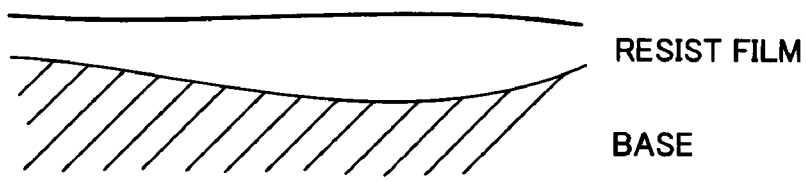
FIG. 31A is a view showing a section of part of a wafer.
Figure 31B:
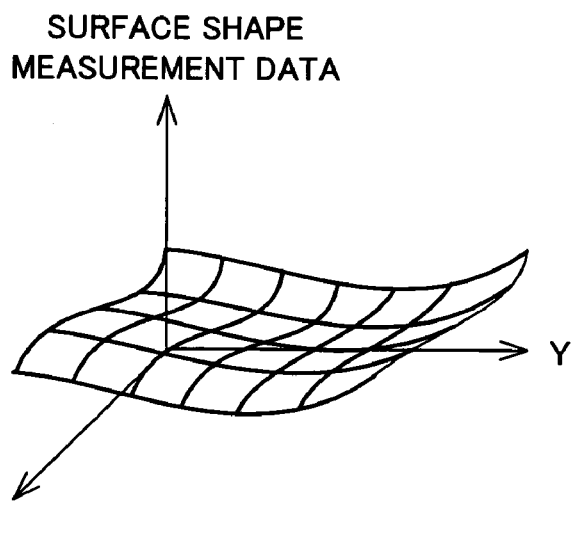
FIG. 31B is an example of measurement data of a surface shape of the wafer.

FIG. 31A shows a sectional view of part of wafer W. An antireflection film and a topcoat film are not shown and only a resist film is shown also in FIG. 31A, similar to FIG. 29A. It is not the surface of a resist film but a base of wafer W that is measured by the multipoint AF sensor (60a, 60b) during exposure, and it is the surface shape of the base of wafer W that is measured in the focus pre-measurement. FIG. 31B shows an example of measurement data of the surface shape of wafer W measured by the focus pre-measurement.

As is show in FIG. 31B, the data is two-dimensional data in the XY coordinate system, which shows that the surface shape of wafer W is not flat when exactly viewing it. In order to transfer a device pattern with high accuracy to such a surface, the parameters related to focus control need to be optimized to some extent. As the parameters that can be optimized, for example, there are selection of a focus sensor (measurement point) in the multipoint AF sensor (60a, 60b), and the like. The focus sensor is preferably selected so that the Z-position of the base between measurement points becomes as flat as possible.

Figure 31C:
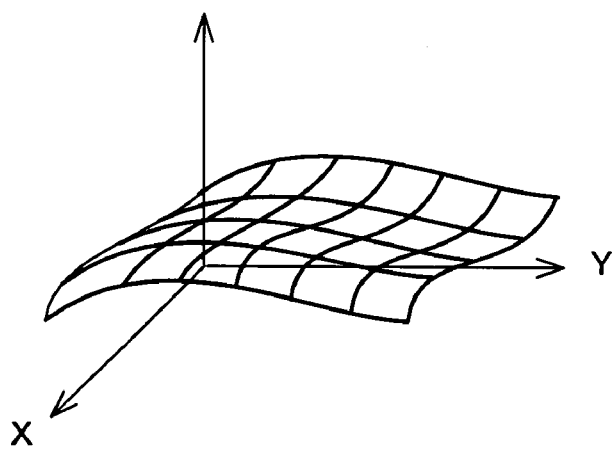
FIG. 31C is an example of measurement data of film thickness.

FIG. 31C shows an example of measurement data of film thickness corresponding to the measurement data of surface shape in FIG. 31B. The measurement data of film thickness of a resist film or the like shown in FIG. 31C is also two-dimensional data in the XY coordinate system. The measurement values of the multipoint AF sensor (60a, 60b) are affected by the ununiformity of film thickness of a resist film or the like in some cases. This is because an offset component of the multipoint AF sensor changes depending on the measurement point due to the ununiformity of film thickness, and a surface shape that is different from the actual surface shape of wafer W is observed in some cases. Accordingly, in the embodiment, concerning the place that is regarded as being abnormal because the gradient of surface shape is steep in the measurement data of surface shape of wafer W, the degree of correlation between the measurement data of surface shape shown in FIG. 31B and the film thickness data shown in FIG. 31C is analyzed, and in accordance with the degree of correlation, whether the cause of considerable change of the surface shape is due to the ununiformity of a resist film or the like, or the base of wafer W (i.e. the original surface shape) is determined, and optimization of processing conditions are optimized in accordance with the determined cause.

In this case, in host 600, film thickness measurement of an antireflection film, film thickness measurement of a resist film and film thickness measurement of a topcoat film (only when performing liquid immersion exposure) by measurement and/or inspection instrument 120 are selected from among the subitems (selection) of the main item: film formation/resist coating processing and wafer measurement and/or inspection processing (A) (refer to FIG. 28), and focus pre-measurement by measurement and/or inspection instrument 120 is selected from among the subitems (selection) of the main item: wafer measurement and/or inspection processing (B) (refer to FIG. 28). In this case, in actual, as is shown in a frame in FIG. 32, a film formation processing of an antireflection film in film forming apparatus 910, a film thickness measurement processing of the antireflection film in measurement and/or inspection instrument 120, a resist film coating processing in C/D 110, a film thickness measurement processing of the resist film in measurement and/or inspection instrument 120, a film formation processing of a topcoat film in film forming apparatus 910, a film thickness measurement processing of the topcoat film in measurement and/or inspection instrument 120, a focus pre-measurement processing in measurement and/or inspection instrument 120 and an exposure processing are to be executed in this order. By executing this process, each film thickness of an antireflection film, a resist film and a topcoat film and the surface shape of the wafer are measured by measurement and/or inspection instrument 120 before performing the exposure processing.

As is shown in FIG. 27, in step 401, host 600 issues a processing start order to analytical apparatus 170. Analytical apparatus 170 acquires measurement data of various film thickness and measurement data of the surface shape by the processings in steps 403 to 409, and the execution of the analytical processing in step 411 is started in analytical apparatus 170.

Figure 32:
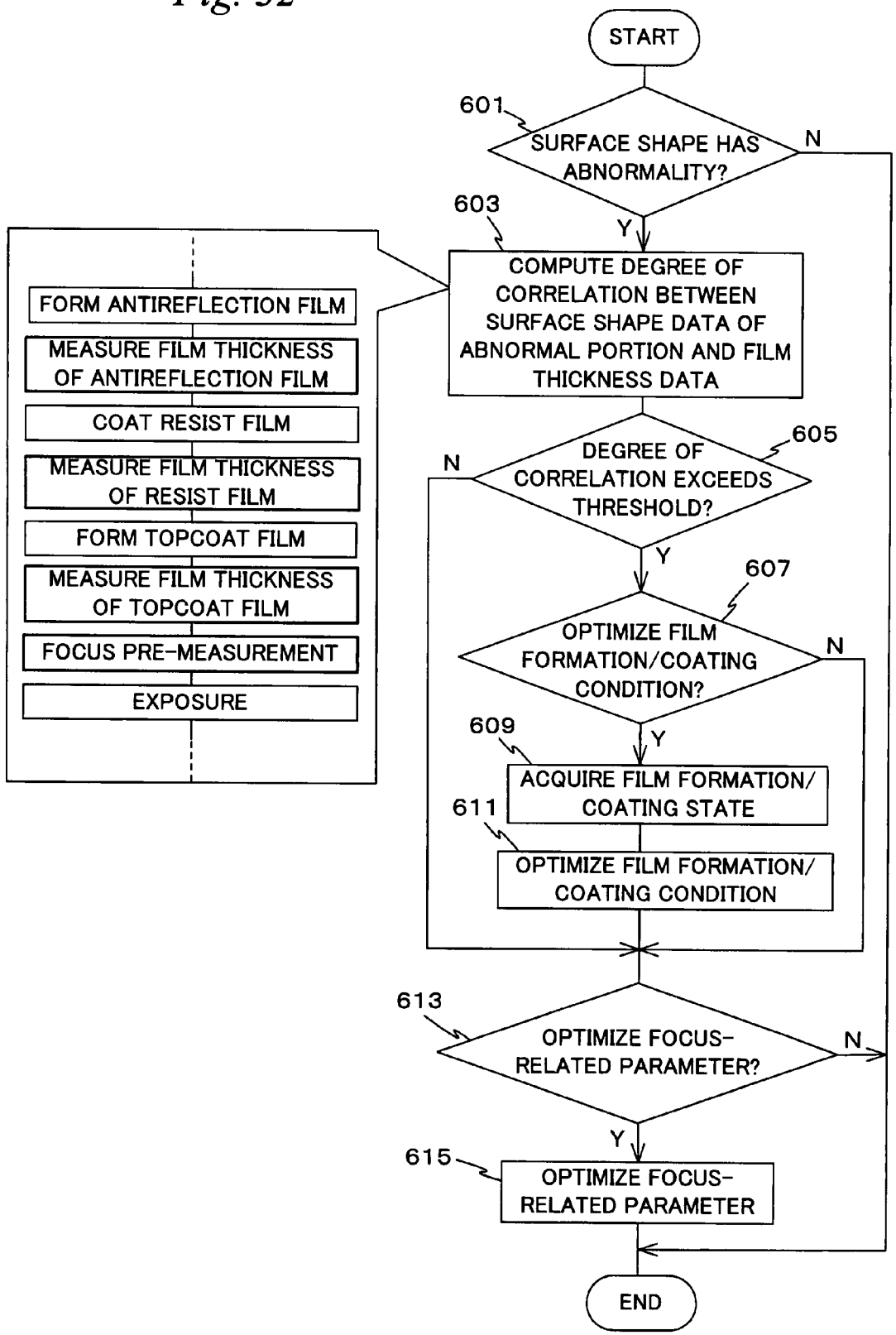
FIG. 32 is a flowchart of optimization of focus-control-related parameters.

FIG. 32 shows a specific flowchart of optimization processing in analytical apparatus 170. As is shown in FIG. 32, first, in step 601, whether or not there is a portion whose surface shape is abnormal (e.g. a portion whose gradient or level difference exceeds a predetermined level) is judged. When the judgment is denied, the processing is finished, and when the judgment is affirmed, the procedure proceeds to step 603. In step 603, the degree of correlation between measurement data of the abnormal portion and measurement data of film thickness of the portion is computed. Herein, the degree of correlation is computed using the measurement data of film thickness of various films and the measurement data of surface shape of wafer W. In step 605, whether or not the computed degree of correlation exceeds a threshold is judged. When the judgment is denied, the base of wafer W itself is judged to have been measured and the procedure proceeds to step 613, and when the judgment is affirmed, the procedure proceeds to step 607.

In step 607, whether or not to optimize film formation/coating conditions is judged according to instruction contents from host 600. The procedure proceeds to step 609 only in the case the judgment is affirmed, and data related to processing state of the film formation/coating processing is acquired from film forming apparatus 910 or C/D 110, and in step 611, the film formation/coating conditions of film forming apparatus 910 or C/D 110 are optimized. The detailed description of processing contents in this case will be omitted because they are the same as those in step 567 in FIG. 30.

In the next step, step 613, whether or not to optimize the focus-related parameters is judged according to instruction contents from host 600. The procedure proceeds to step 615 only in the case the judgment is affirmed, and the focus-related parameters are optimized by selecting a focus sensor on the surface as flat as possible, or the like.

Incidentally, when performing the optimization, the processing is slightly different between the case when the judgment is made that there is no correlation between the film thickness data and the surface shape data and the case when the judgment is made that there is the correlation. In the case the judgment is made that there is no correlation, selection of a focus sensor or the like is performed based on only the measurement data of surface shape. Further, in the case the judgment is made that there is the correlation, selection of a focus sensor or the like is performed taking the measurement data of film thickness into consideration in addition to the measurement data of surface shape, that is, based on the total (summation) of the measurement data of surface shape and the measurement data of film thickness.

After this processing, as is shown in FIG. 27, in the accumulation processing in step 413, the measurement data of surface shape, the measurement data of film thickness, and history related to the optimized focus-related parameters and film formation/coating conditions are accumulated in the database of analytical apparatus 170. Then, in step 415, data related to parameters that have been optimized in steps 611 and 615 in FIG. 32 is sent to the relevant apparatus, that is, exposure apparatus 100 or 101, or C/D 110 and film forming apparatus 910. Each apparatus changes the relevant parameters to optimum values and performs the subsequent processing. Thus, feedback control of film formation/coating conditions in film forming apparatus 910 and C/D 110 is realized, and feedforward control of the focus-related parameters in exposure apparatus 100 or 101 is realized. Analytical apparatus 170 returns a processing end notice to host 600 (step 417 in FIG. 27).

Incidentally, in the flowchart in FIG. 32, optimization of the focus-related parameters on exposure is performed only in the case abnormality of surface shape is detected, but the present invention is not limited to this. That is, step 601 does not always have to performed, and the processings in step 603 and the succeeding steps can be performed to the wafer entire surface.

Further, the case can also be considered where the surface shape is measured as flat due to the ununiformity of film thickness even if the surface shape of the base has level difference or gradient in actual. In this case, even if the correlation between film thickness and surface shape is not recognized, selection of a focus sensor is preferably performed based on the total of the measurement data of film thickness and the measurement data of surface shape.

Figure 33A:
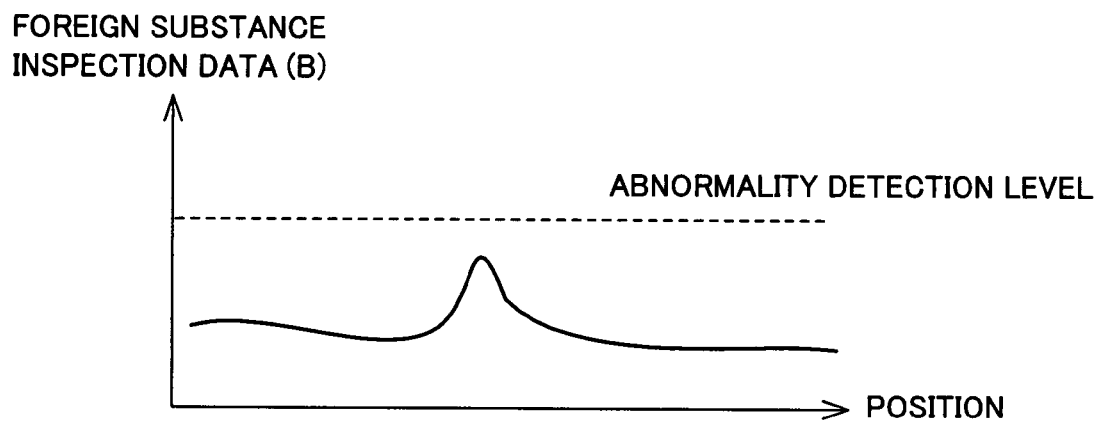
FIG. 33A is a view showing an example of foreign substance inspection data (B)

(3) Optimization of Processing Conditions of Wafer Appearance Inspection Before Exposure Next, the case will be described where optimization of processing conditions of wafer appearance inspection before exposure, that is, wafer appearance inspection in wafer measurement and/or inspection processing (B) is performed. In this case, host 600 selects the subitem (selection): appearance inspection (foreign substance inspection) in the main item: wafer measurement and/or inspection processing (B) and the subitem (selection): appearance inspection (foreign substance inspection) in the main item: wafer measurement and/or inspection processing (C), and creates processing procedures. FIG. 33A shows an example of data of inspection results of appearance inspection of wafer W in wafer measurement and/or inspection processing (B) (foreign substance inspection data (B)). Incidentally, the data is actually XY two-dimensional data, but is shown as one-dimensional data for the sake of simplification of the description. In the foreign substance inspection, a foreign substance is judged to exist at the portion at which a level of data exceeds an abnormality detection level (shown in a dotted line). In the data shown in FIG. 33A, since the portion that exceeds the abnormality detection level does not exist, the judgment is made that there is no foreign substance.

Figure 33B:
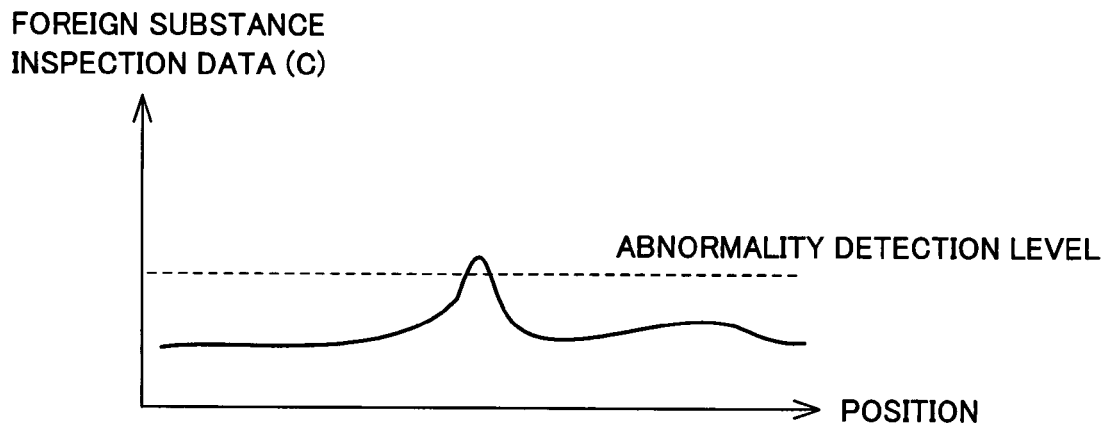
FIG. 33B is a view showing an example of foreign inspection data (C)

FIG. 33B shows an example of data of inspection results of appearance inspection of wafer W in wafer measurement and/or inspection processing (C) (foreign substance inspection data (C)). Also in this foreign substance inspection, a foreign substance is judged to exist at the portion at which a level of data exceeds an abnormality detection level shown in a dotted line. In the data shown in FIG. 33B, since the portion that exceeds the threshold exists, the judgment is made that there is a foreign substance at the portion.

When comparing the data in FIG. 33A with the data in FIG. 33B, however, the portion that is judged to have abnormality in FIG. 33B has a peak also in the data in FIG. 33A, and the correlativity between them is estimated to be high. In such a case, it can be considered that a foreign substance already adhered on wafer W before exposure, and the foreign substance could have been detected when performing wafer measurement and/or inspection processing (B), if the sensitivity of abnormality inspection in wafer measurement and/or inspection processing (B) had been increased (i.e. the abnormality detection level had been lowered). Accordingly, in such a case, by adjusting the abnormality detection level of appearance inspection in wafer measurement and/or inspection processing (B), the foreign substance adhering on wafer W can be detected earlier.

Figure 34:
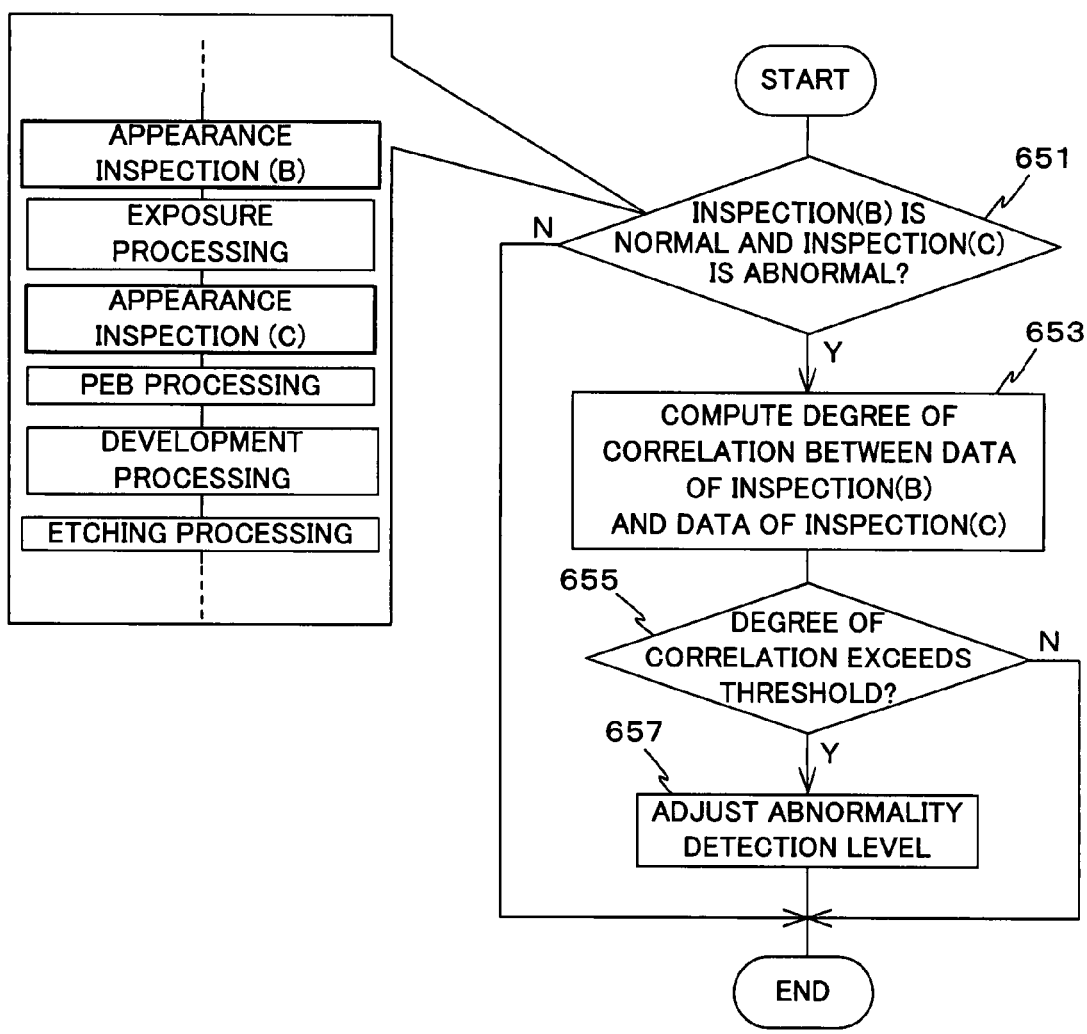
FIG. 34 is a flowchart of optimization of processing conditions of a wafer appearance inspection before exposure.

In this case, in actual, as shown in a frame in FIG. 34, an appearance inspection in wafer measurement and/or inspection processing (B) (which is shortly referred to as an appearance inspection (B) in FIG. 34), an exposure processing, an appearance inspection in wafer measurement and/or inspection processing (C) (which is shortly referred to as an appearance inspection (C) in FIG. 34), a PEB processing, a development processing and an etching processing are to be executed in this order. By executing this process, inspection data of appearance inspection (B) on wafer W before performing the exposure processing and inspection data of appearance inspection (C) on wafer W after the exposure processing can be obtained. Host 600 issues a processing start order to analytical apparatus 170 according to the processing in FIG. 27 before exposure is stared (step 401). The processing start order is the order that (3) optimization of wafer appearance inspection before exposure should be performed. Analytical apparatus 170 acquires inspection data of appearance inspections (B) and (C) by performing steps 403 to 409.

FIG. 34 shows a flowchart of some of processing procedures created by host 600. As is shown in FIG. 34, in step 651, the judgment is made of whether or not a result of appearance inspection (B) is normal and abnormality is detected in appearance inspection (C). When the judgment is denied, the processing is finished, and when the judgment is affirmed, the procedure proceeds to step 653. In step 653, the degree of correlation of inspection data between inspection (B) and inspection (C) is computed. In the next step, step 655, whether or not the computed degree of correlation exceeds a threshold is judged. The procedure proceeds to step 657 only in the case the judgment is affirmed, and the abnormality detection level of appearance inspection (B) is adjusted.

After this processing, as is shown in FIG. 27, in the accumulation processing in step 413, the inspection data of inspection (B) and inspection (C), and history related to adjustment of the abnormality detection level are accumulated in the database of analytical apparatus 170. Then, in step 657, the adjusted abnormality detection level is sent to the relevant apparatus, that is, measurement and/or inspection instrument 120. Measurement and/or inspection instrument 120 changes the relevant parameters to optimum values and performs the subsequent processing. Thus, feedback control of abnormality detection level of measurement and/or inspection instrument 120 is realized. Analytical apparatus 170 returns a processing end notice to host 600 (step 417 in FIG. 27).

(4) Optimization of Liquid-immersion-exposure-related Processing Conditions (No. 1)

Next, the case will be described where optimization of liquid-immersion-exposure-related processing conditions (No. 1) is performed. Herein, optimization of processing conditions in liquid immersion exposure is performed based on the appearance inspection result of each film on wafer W before exposure and the appearance inspection result of wafer W after exposure. In this case, host 600 selects the subitem (selection): film inspection of each film (appearance inspection (A)) in the main item: wafer measurement and/or inspection processing (A) and the subitem (selection): appearance inspection (appearance inspection (C)) in the main item: wafer measurement and/or inspection processing (C), and creates processing procedures. In a frame (call-out) in FIG. 35, a flow of processing procedures created by host 600 in order to perform this optimization processing is shown. That is, herein, an antireflection film formation, an inspection of the antireflection film, a resist film coating, an inspection of the resist film, a topcoat film formation, an inspection of the topcoat film, a liquid immersion exposure and appearance inspection (C) are performed in this order. By executing this process, inspection data of appearance inspection (A) of each film on wafer W is obtained before performing the exposure processing, and inspection data of appearance inspection (C) on wafer W is obtained after the exposure processing.

Host 600 issues a processing start order to analytical apparatus 170 according to the processing in FIG. 27 before exposure is started (step 401). Analytical apparatus 170 acquires inspection data of appearance inspection (A) and appearance inspection (C) and the like from measurement and/or inspection instrument 120 by performing steps 403 to 409, and then executes an analytical processing (step 411).

Figure 35:
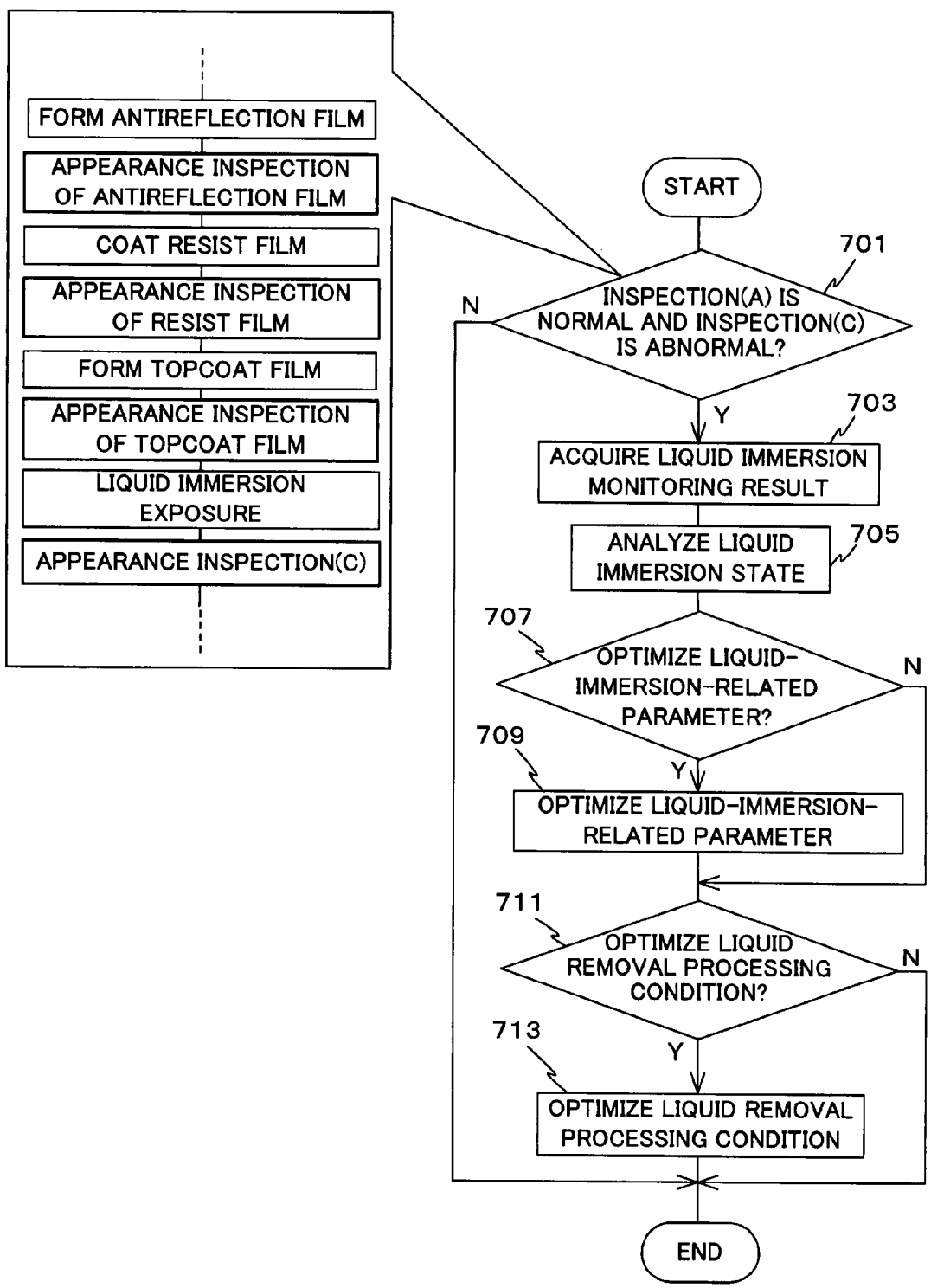
FIG. 35 is a flowchart of optimization of liquid-immersion-exposure-related processing conditions (No. 1)

FIG. 35 shows a specific flowchart of the analytical processing in this case. As is shown in FIG. 35, in step 701, the judgment is made of whether or not a result of appearance inspection (A) is normal and a result of appearance inspection (C) is abnormal. When the judgment is denied, the processing is finished, and when the judgment is affirmed, the procedure proceeds to step 703. In step 703, data of liquid immersion monitoring result by liquid immersion monitor 260 is acquired from exposure apparatus 101. In step 705, based on the acquired data of liquid immersion monitoring result, the cause of abnormality in inspection (C) is analyzed. As the cause of such abnormality, for example, as is shown in FIGS. 7A to 7C, elution of a resist film into liquid during exposure, a particle or foreign substance adhering to the remaining liquid, a watermark or the like can be considered.

In step 707, whether or not host 600 has designated optimization of liquid-immersion-related parameters is judged, and only in the case the judgment is affirmed, the procedure proceeds to step 709, in which optimization of the liquid-immersion-related parameters is performed so that the abnormality is solved. As the liquid-immersion-related parameters, for example, there are the flow speed or the temperature of liquid LQ, a filter condition of liquid LQ, a period of time when the place where abnormality occurs is immersed in liquid (liquid immersion time), and the like.

Figure 36:
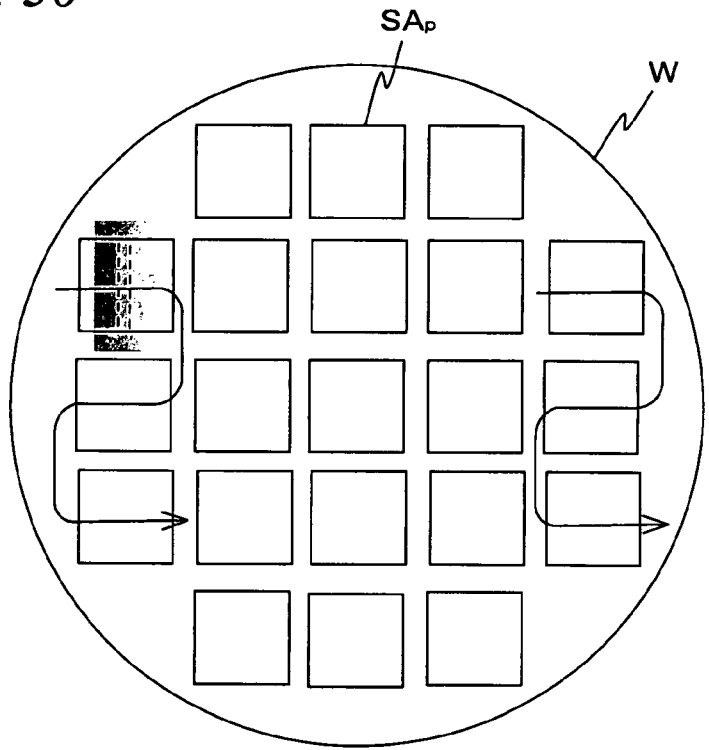
FIG. 36 is a view showing an exposure route on wafer W.
Figure 37:
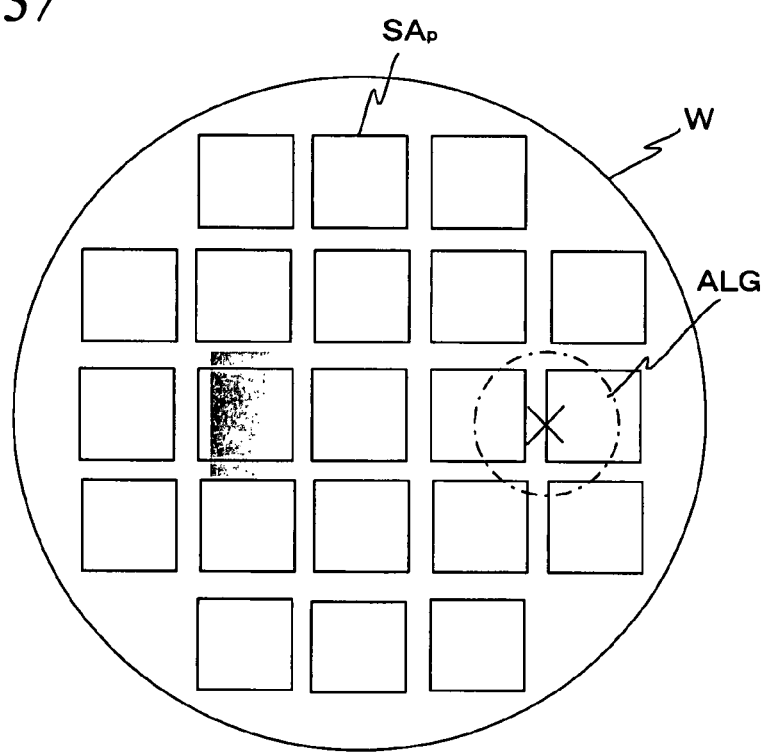
FIG. 37 is a view showing a liquid immersion state during alignment.

In order to adjust the liquid immersion time of a certain place on wafer W, an exposure route on wafer W needs to be changed. FIG. 36 shows an exposure route that shows the order in which shot areas on wafer W are exposed. In step 709, the exposure route is changed so that the liquid immersion time of the point where abnormality is detected is shortened. Further, as is shown in FIG. 37, in some cases, another place of wafer W is immersed in liquid also during wafer mark measurement by alignment system ALG, and therefore, in the case the point where abnormality is detected seems to be immersed in liquid for a long period of time during the alignment, the wafer marks to be measured may be changed.

In step 711, the judgment is made of whether or not optimization of liquid removal processing conditions is set to be performed referring to instructions from host 600, and only in the case the judgment is affirmed, the procedure proceeds to step 713, in which optimization of liquid removal processing conditions is performed. Herein, processing conditions of a liquid removal processing, for example, the processing time is lengthened, or a period of time from when exposure ends until when liquid removal is performed is shortened, so that the degree of removal of the remaining liquid on wafer W is improved (i.e. wafer W is completely dried) Incidentally, in the following description, the processing conditions of the liquid removal processing are also included in the liquid-immersion-related parameters.

After this processing, as is shown in FIG. 27, in the accumulation processing in step 413, data such as data of inspection (A) and data of inspection (C), history of the optimized liquid-immersion-related parameters and the like are accumulated in the database of analytical apparatus 170. Then, information on the parameters that have been optimized in steps 709 and 713 is sent to the relevant apparatus, that is, exposure apparatus 101. Exposure apparatus 101 changes the relevant parameters to optimum values, and performs the subsequent processing. Thus, feedback control of the liquid-immersion-related parameters and liquid removable conditions of removal unit T is realized. Incidentally, accumulation of measurement and/or inspection results and optimization results, and transmission to various apparatuses are to be performed in all the optimization processings at the time of liquid immersion exposure which will be described below, and therefore, their detailed description will be omitted.

Analytical apparatus 170 returns a processing end notice to host 600 (step 417).

Incidentally, in the embodiment, removal unit T is to be arranged within exposure apparatus 101, but the removal unit may be arranged within track 200B. In this case, feedback of optimization results of processing conditions of liquid removal is performed to track 200B, not to exposure apparatus 101.

(5) Optimization of Liquid-immersion-exposure-related Processing Conditions (No. 2)

Next, the case will be described where optimization of liquid-immersion-exposure-related processing conditions (No. 2) is performed. Herein, as is shown in a frame in FIG. 38, optimization of processing conditions in liquid immersion exposure is performed based on an appearance inspection in wafer measurement and/or inspection processing (C) before a PEB processing (appearance inspection (C)) and an appearance inspection in wafer measurement and/or inspection processing (D) after the PEB processing (appearance inspection (D)). Host 600 selects the subitem (selection): wafer appearance inspection (foreign substance inspection) in the main item: wafer measurement and/or inspection processing (C) and the subitem (selection): wafer appearance inspection (inspection of stains due to the remaining liquid, or the like) in the main item: wafer measurement and/or inspection processing (D), and creates processing procedures.

Figure 38:
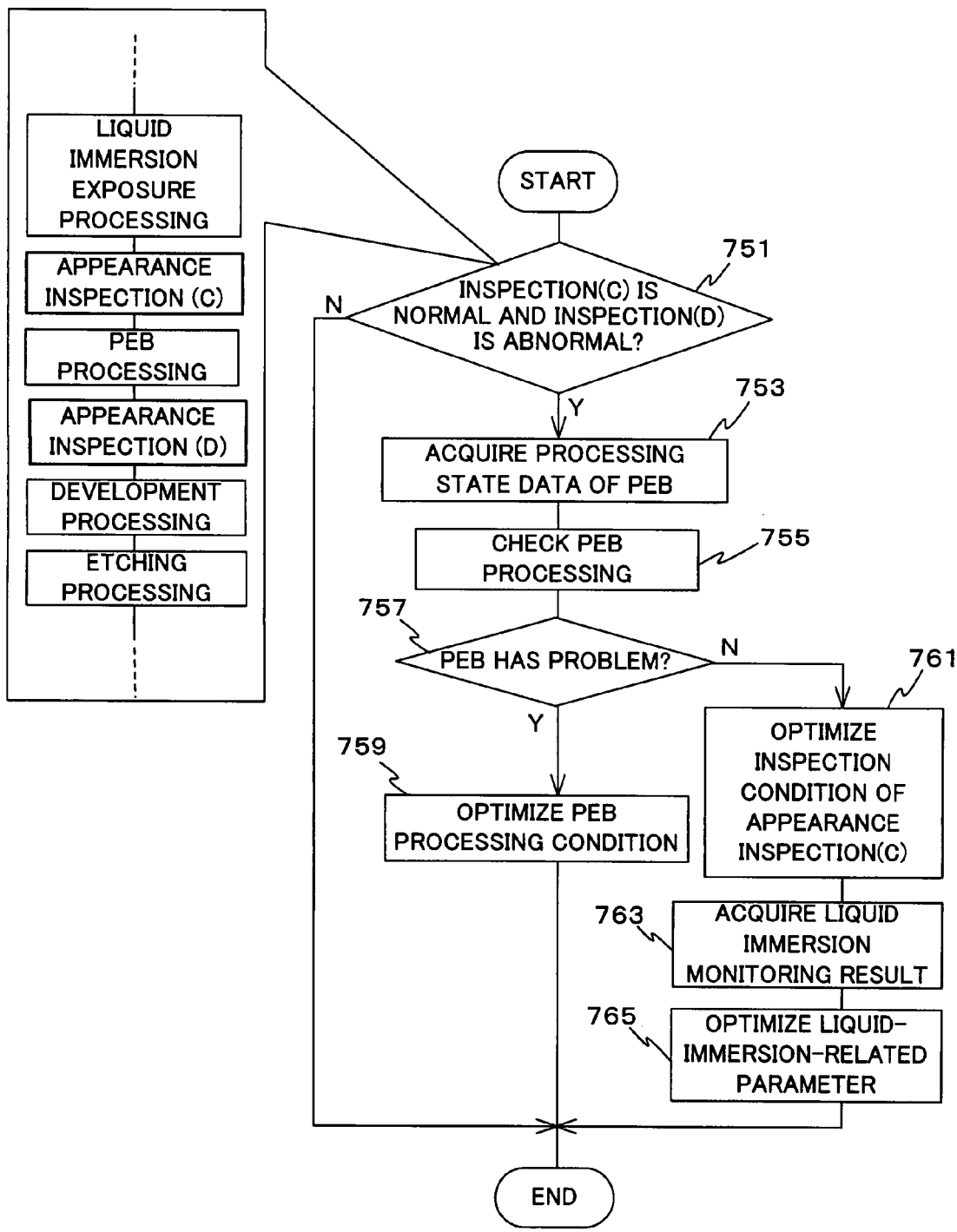
FIG. 38 is a flowchart of analytical processing in optimization of liquid-immersion-exposure-related processing conditions (No. 2)

As is shown in FIG. 38, first, in step 751, the judgment is made of whether or not a result of inspection (C) is normal and a result of inspection (D) is abnormal. When the judgment is denied, the processing is finished, and when the judgment is affirmed, the procedure proceeds to step 753. In step 753, processing state data of PEB (e.g. data of the temperature or the processing time) is acquired from C/D 110 of track 200B. In step 755, based on the acquired data of processing state of PEB, the PEB processing is checked.

In step 757, whether or not there is any problem in the processing state of the PEB processing is judged. Only in the case the judgment is affirmed, the procedure proceeds to step 759, in which the processing conditions of the PEB processing are optimized. As such processing conditions, for example, the setting temperature of PEB can be cited. In the case the judgment in step 757 is denied, the procedure proceeds to step 761, in which inspection conditions of appearance inspection (C) are optimized. Since this processing is the same as step 657 in FIG. 34, the detailed description will be omitted. In the next step, step 763, data of liquid immersion monitoring results is acquired from exposure apparatus 101, and in step 765, the liquid-immersion-related parameters (which include processing conditions of the liquid removable processing, as is described above) are optimized. Since this optimization processing is the same as steps 709 and 713 in FIG. 35, the detailed description will be omitted.

Incidentally, herein, instead of optimization of liquid-immersion-related parameters in steps 763 and 765, the film formation/coating conditions in film forming apparatus 910 or C/D 110 may be optimized. That is, optimization of top coat processing such as thickening a topcoat film, or change of types of resist, and/or change of coating conditions of resist, or the like may be performed, so that liquid does not infiltrate into a resist film.

(6) Optimization of Processing Conditions of Liquid Immersion Exposure (No. 3)

Figure 39:
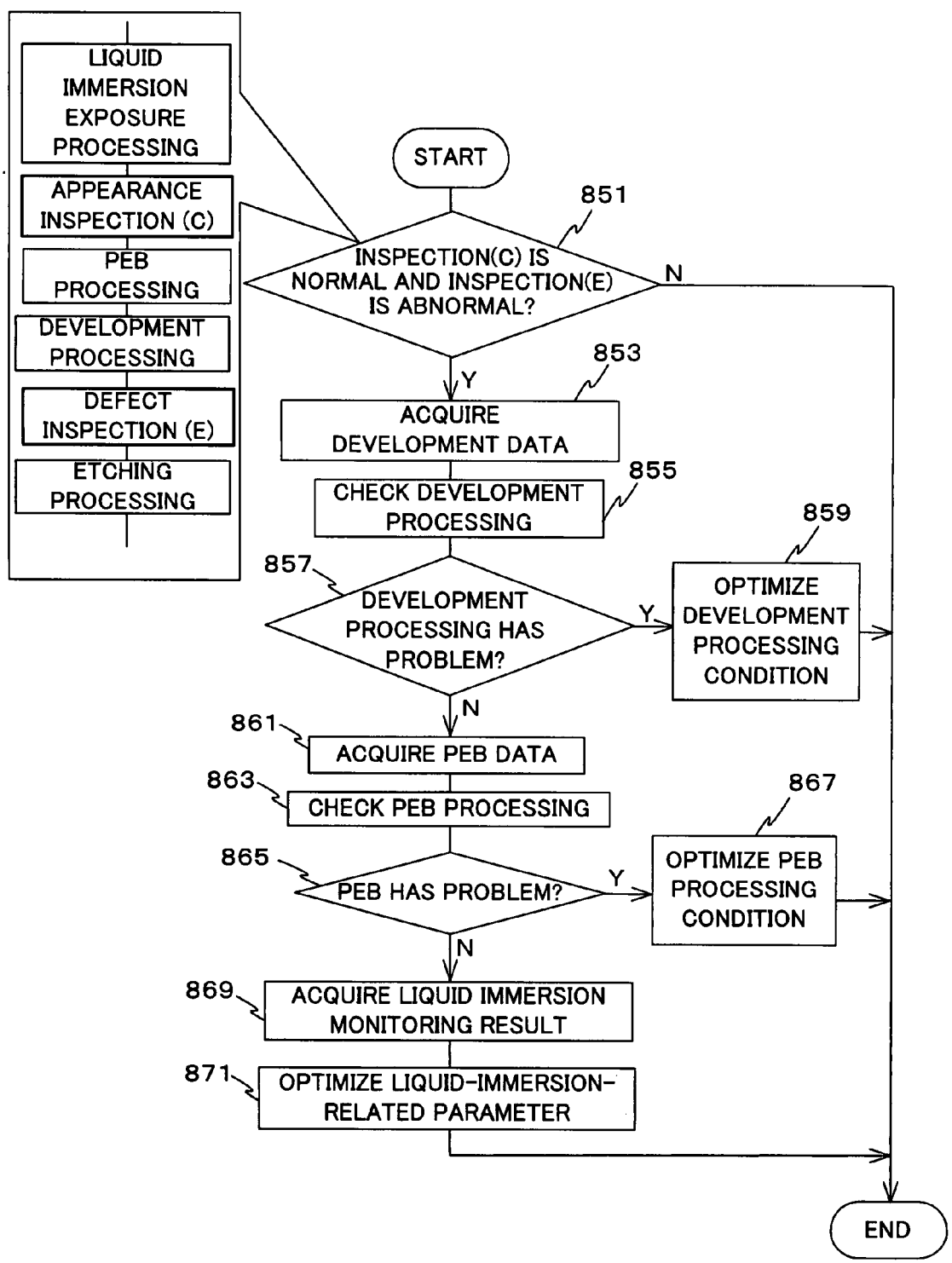
FIG. 39 is a flowchart of analytical processing in optimization of liquid-immersion-exposure-related processing conditions (No. 3)

Next, the case will be described where optimization of processing conditions of liquid immersion exposure (No. 3) is performed. Herein, as is shown in FIG. 39, optimization of the processing conditions is performed based on results of appearance inspection (C) of wafer W before a PEB processing and pattern defect inspection (E) of wafer W after a development processing. That is, optimization of processing conditions is performed in accordance with the difference in detection results between before and after the PEB processing and the development processing. In this case, host 600 selects the subitem (selection): wafer appearance inspection (foreign substance and/or remaining liquid inspection) (appearance inspection (C)) in the main item: wafer measurement and/or inspection processing (C) and the subitem (selection): pattern defect inspection in the main item: wafer measurement and/or inspection processing (E) (defect inspection (E)), and creates processing procedure.

As is shown in FIG. 39, first, in step 851, the judgment is made of whether or not a result of inspection (C) is normal and a result of inspection (E) is abnormal. When the judgment is denied, the processing is finished. In step 853, data of processing state of a development processing of C/D 110 of track 200B is acquired. In step 855, based on the acquired data of processing state of the development processing of C/D 110, the development processing is checked. In step 857, whether or not there is any problem in the development processing of C/D 110 is judged. When the judgment is affirmed, the procedure proceeds to step 859, in which the processing conditions of the development processing are optimized. After step 859 ends, the processing is finished. On the other hand, when the judgment in step 857 is denied, the procedure proceeds to step 861, in which data of processing state of the PEB processing is acquired from C/D 110 of track 200B.

In the next step 863, whether or not there is any problem in the processing state of the PEB processing of C/D 110 is judged. When the judgment is affirmed, the procedure proceeds to step 867, the processing conditions of the PEB processing are optimized so that the occurrence frequency of pattern defect is reduced. When the judgment is denied, the procedure proceeds to step 869, in which data of liquid immersion monitoring results is acquired from exposure apparatus 101. In the next step, step 871, the liquid-immersion-related parameters are optimized so that the occurrence frequency of pattern defect is reduced.

That is, in this optimization processing, the processing state is selected in the order of the development processing, the PEB processing and the liquid immersion exposure processing, in accordance with the difference in detection results between before and after the PEB processing and the development processing, and the processing conditions of the processing that is judged to have a problem are optimized.

(7) Optimization of Processing Conditions of Liquid Immersion Exposure (No. 4)

Figure 40:
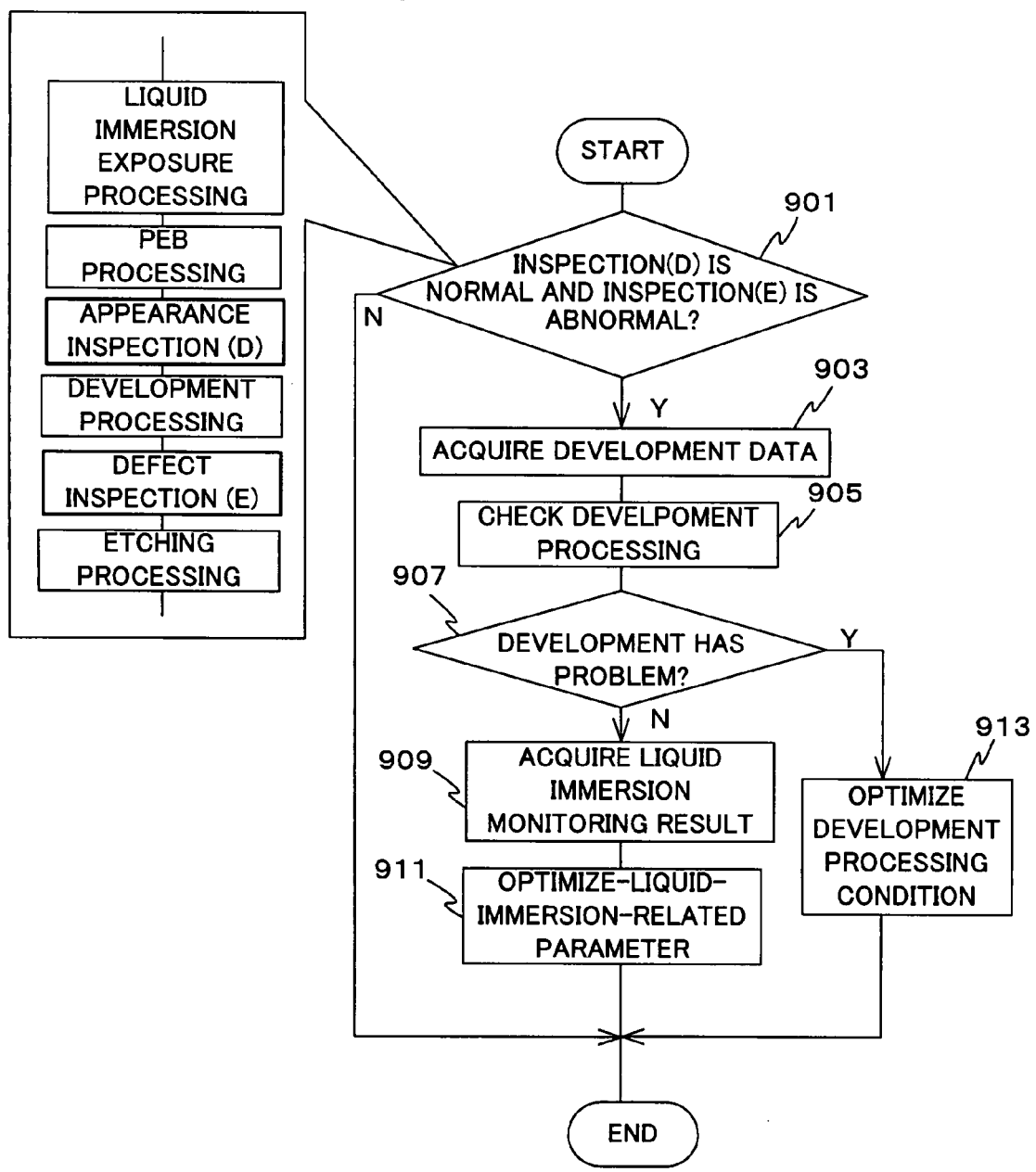
FIG. 40 is a flowchart of analytical processing in optimization of liquid-immersion-exposure-related processing conditions (No. 4)

Next, the case will be described where optimization of processing conditions of liquid immersion exposure (No. 4) is performed. Herein, as is shown in FIG. 40, the processing conditions are optimized based on the difference in appearance inspection results before and after a development processing. In this case, host 600 selects the subitem (selection): appearance inspection in the main item: wafer measurement and/or inspection processing (D) before the development processing (appearance inspection (D)) and the subitem (selection): pattern defect inspection in the main item: wafer measurement and/or inspection processing (E) after the development processing (defect inspection (E)), and creates processing procedures.

FIG. 40 shows a flowchart of an analytical processing of analytical apparatus 170 in this case. As is shown in FIG. 40, first, in step 901, the judgment is made of whether or not a result of inspection (D) is normal and a result of inspection (E) is abnormal. When the judgment is denied, the processing is finished. In step 903, data of processing state of a development processing of C/D 110 of track 200B is acquired. In the next step, step 905, based on the acquired data of the development processing, the development processing is checked. In the next step, step 907, whether or not there is any problem in the development processing is judged. When the judgment is denied, the procedure proceeds to step 909, in which liquid immersion state data is acquired, and in step 911, the liquid-immersion-related parameters are optimized so that a pattern defect portion disappears. Meanwhile, when the judgment is affirmed, the processing conditions of the development processing are optimized so that the pattern defect portion disappears.

(8) Optimization of Processing Conditions of Liquid Immersion Exposure (No. 5)

Figure 41:
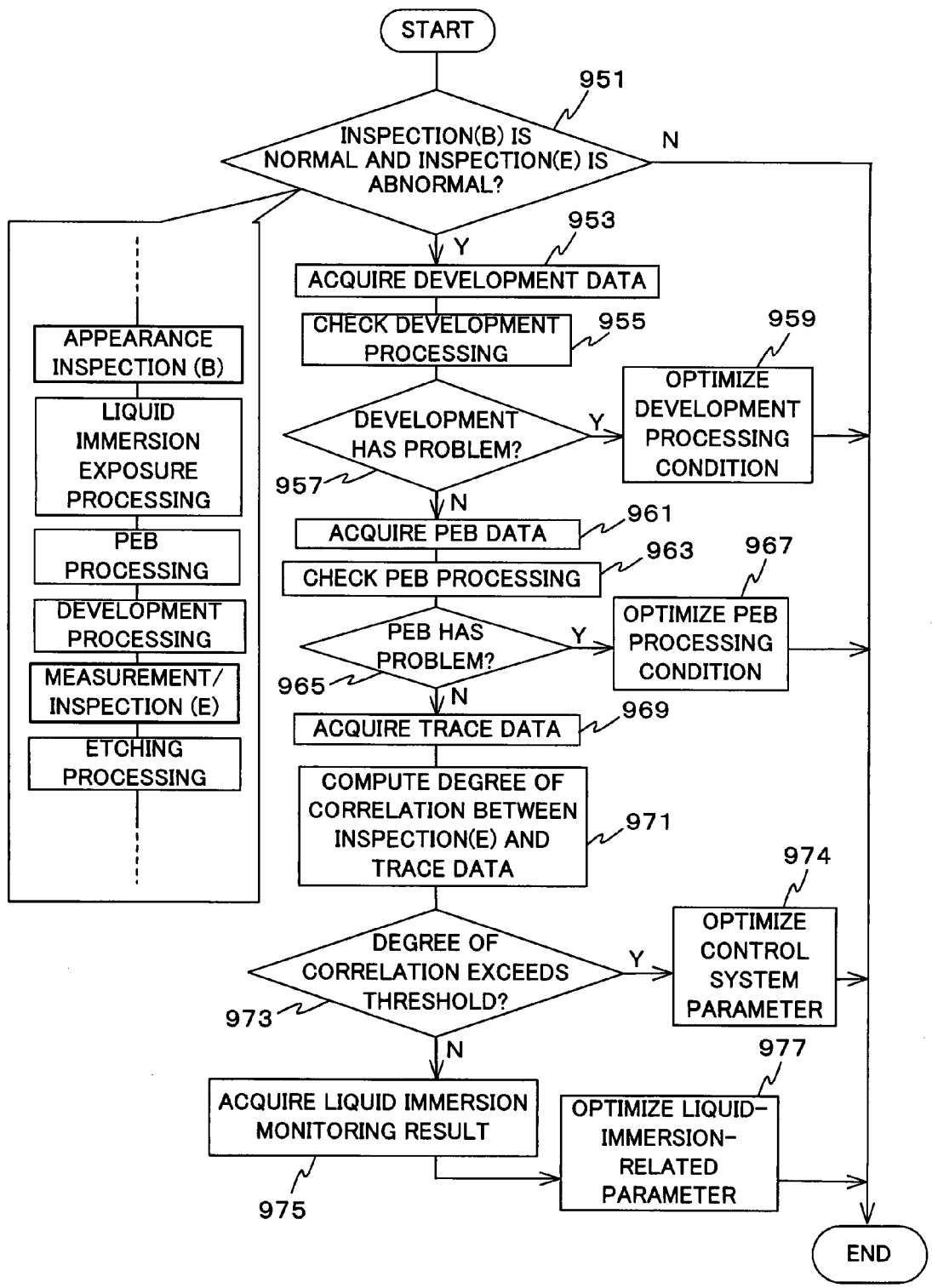
FIG. 41 is a flowchart of analytical processing in optimization of liquid-immersion-exposure-related processing conditions (No. 5)

Next, the case will be described where optimization of processing conditions of liquid immersion exposure (No. 5) is performed. Herein, as is shown in FIG. 41, the processing conditions are optimized based on the difference between measurement and/or inspection results before an exposure processing and measurement and/or inspection results after a development processing. In this case, host 600 selects the subitem (selection): focus pre-measurement in the main item: wafer measurement and/or inspection processing (B) and the subitem (selection): pattern line width measurement in the main item: wafer measurement and/or inspection processing (E), and creates processing procedures.

FIG. 41 shows a flowchart of the analytical processing. As is shown in FIG. 41, first, in step 951, the judgment is made of whether or not a result of inspection (B) is normal and a result of inspection (E) is abnormal. When the judgment is denied, the processing is finished. In step 953, data of processing state of a development processing in C/D 110 of track 200B is acquired. In the next step, step 955, based on the data of processing state of the development processing, the development processing is checked.

In the next step, step 957, whether or not there is any problem in the development processing is judged, and when the judgment is affirmed, the procedure proceeds to step 959, and the processing conditions of the development processing are optimized. When the judgment is denied, the procedure proceeds to step 961, in which data of processing state of a PEB processing is acquired from C/D 110 of track 200B. In step 963, the processing state of the PEB processing is checked. In step 965, whether or not there is any problem in the PEB processing is judged. When the judgment is affirmed, the procedure proceeds to step 967, in which the processing conditions of PEB are optimized. When the judgment is denied, the procedure proceeds to step 969, in which control trace data of various control errors such as an exposure dose, synchronous accuracy, focus, a lens and the like is acquired from exposure apparatus 101.

In the next step, step 971, the degree of correlation between data of inspection result of the portion where a line width is abnormal in inspection (E) and the trace data is computed. In step 973, whether or not the degree of correlation exceeds a threshold is judged. When the judgment is affirmed, the procedure proceeds to step 974, in which control parameters related to the trace data that has the high degree of correlation are optimized. For this optimization, the CD table group is used. Meanwhile, when the judgment is denied, a liquid immersion state defect during exposure is judged to occur due to bubbles, particles or the like, and the procedure proceeds to step 975, in which data of liquid immersion monitoring results is acquired from exposure apparatus 101. In step 977, the liquid-immersion-related parameters are optimized.

(9) Optimization of Processing Conditions of Liquid Immersion Exposure (No. 6)

Next, the case will be described where optimization of processing conditions of liquid immersion exposure (No. 6) is performed. In this case, host 600 selects the subitem (selection): focus pre-measurement in the main item: wafer measurement and/or inspection processing (B) and the subitem (selection): pattern line width measurement in the main item: wafer measurement and/or inspection processing (F), and creates processing procedures.

Figure 42:
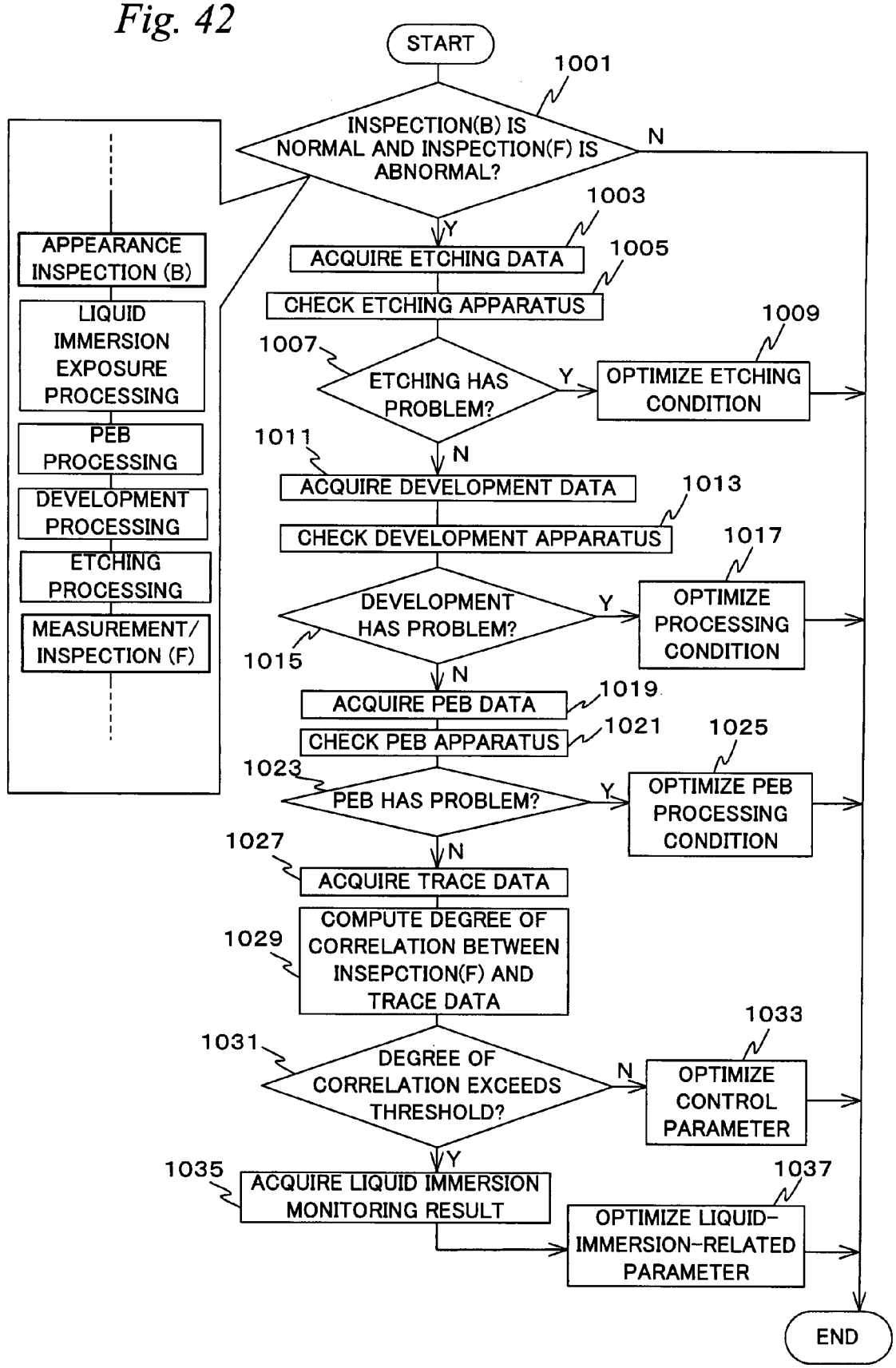
FIG. 42 is a flowchart of analytical processing in optimization of liquid-immersion-exposure-related processing conditions (No. 6)

FIG. 42 shows a flowchart of a processing of analytical apparatus 170 that performs this optimization. As is shown in FIG. 42, first, in step 1001, the judgment is made of whether or not a result of inspection (B) is normal and a result of inspection (F) is abnormal. When the judgment is denied, the processing is finished because the optimization does not have to be performed in particular. Further, in the case the judgment is affirmed, the procedure proceeds to step 1003, in which data of processing state of etching apparatus 930 is acquired. In step 1005, the processing state of etching apparatus 930 is checked. In step 1007, whether or not there is any problem in the etching apparatus is judged. When the judgment is affirmed, the procedure proceeds to step 1009, in which the etching conditions are optimized so that abnormality of pattern line width is solved. When the judgment is denied, the procedure proceeds to step 1011. Since the processings from steps 1011 to 1037 are the same as steps 953 to 977 in FIG. 41, the detailed description will be omitted.

(10) Optimization of Processing Conditions of Liquid Immersion Exposure (No. 7)

Figure 43:
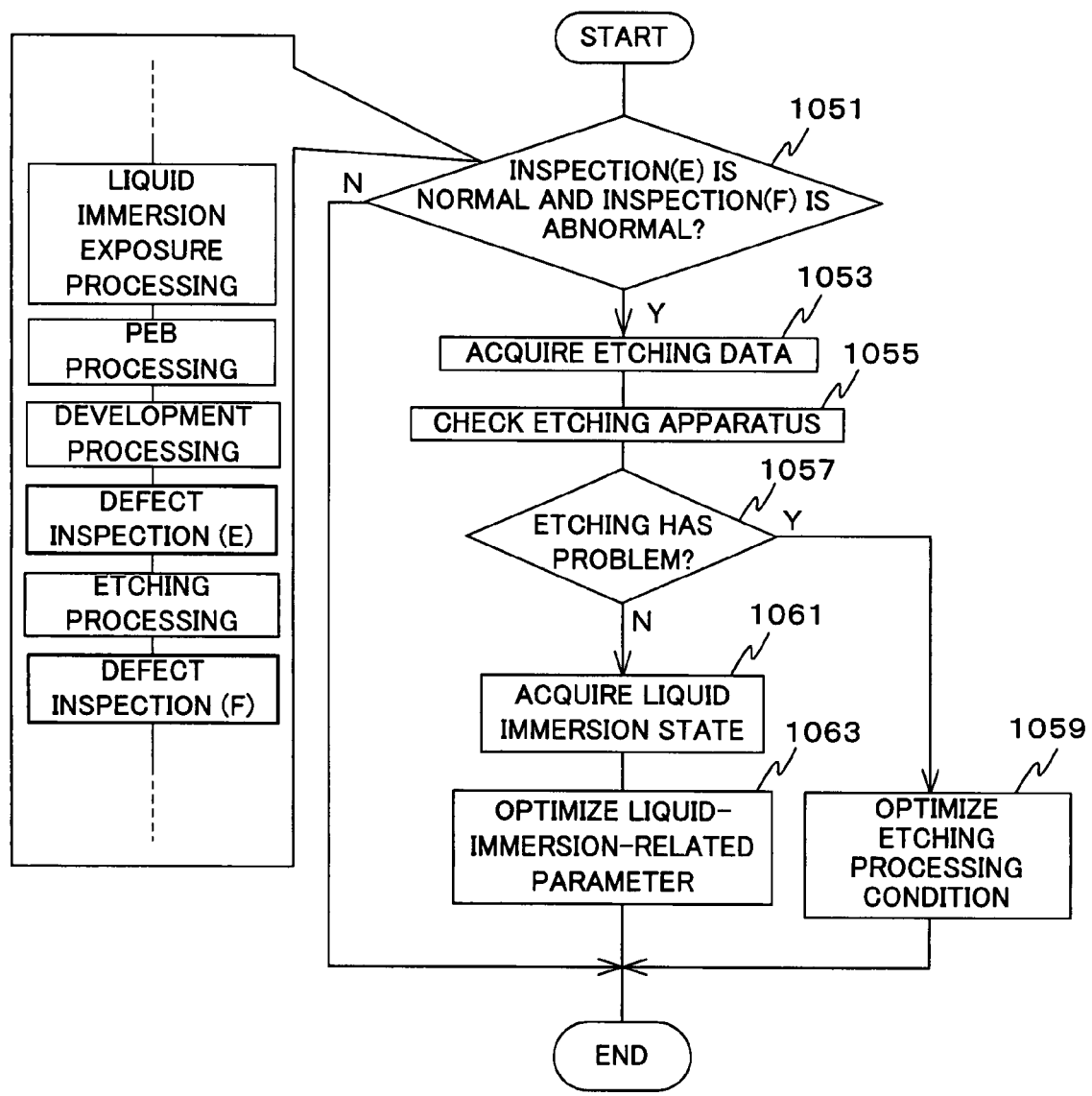
FIG. 43 is a flowchart of analytical processing in optimization of liquid-immersion-exposure-related processing conditions (No. 7)

Next, the case will be described where optimization of processing conditions of liquid immersion exposure (No. 7) is performed. In this case, host 600 selects the subitem (selection): pattern defect inspection in the main item: wafer measurement and/or inspection processing (E) (defect inspection (E)) and the subitem (selection): pattern defect inspection in the main item: wafer measurement and/or inspection processing (F) (defect inspection (F)), and creates processing procedures. As is shown in FIG. 43, first, in step 1051, the judgment is made of whether a result of inspection (E) is normal and a result of inspection (F) is abnormal. When the judgment is denied, the processing is finished.

In step 1053, data of processing state of an etching processing is acquired. In step 1055, the processing state of etching apparatus 930 is checked. In step 1057, whether or not there is any problem in the processing state of etching is judged. When the judgment is denied, deterioration in etching resistance caused by liquid that infiltrates resist is judged to be a factor, and the procedure proceeds to step 1061, in which liquid immersion data is acquired from exposure apparatus 101, and then in step 1063, the liquid-immersion-related-parameters are optimized. On the other hand, the etching processing is judged to have a problem and the judgment in step 1057 is affirmed, the procedure proceeds to step 1059, in which the processing conditions of etching apparatus 940 are optimized.

Incidentally, the liquid-immersion-related parameters include the processing conditions of the liquid removal processing, as is described earlier.

(11) Optimization of Pattern-line-width-related Processing Conditions

Next, the case will be described where optimization of pattern-line-width-related processing conditions is performed. In this case, host 600 selects the subitem (selection): wafer film inspection in the main item: wafer measurement and/or inspection processing (A) and the subitem (selection): pattern line width measurement in the main item: wafer measurement and/or inspection processing (E) or wafer measurement and/or inspection processing (F), and creates processing procedures.

Figure 44:
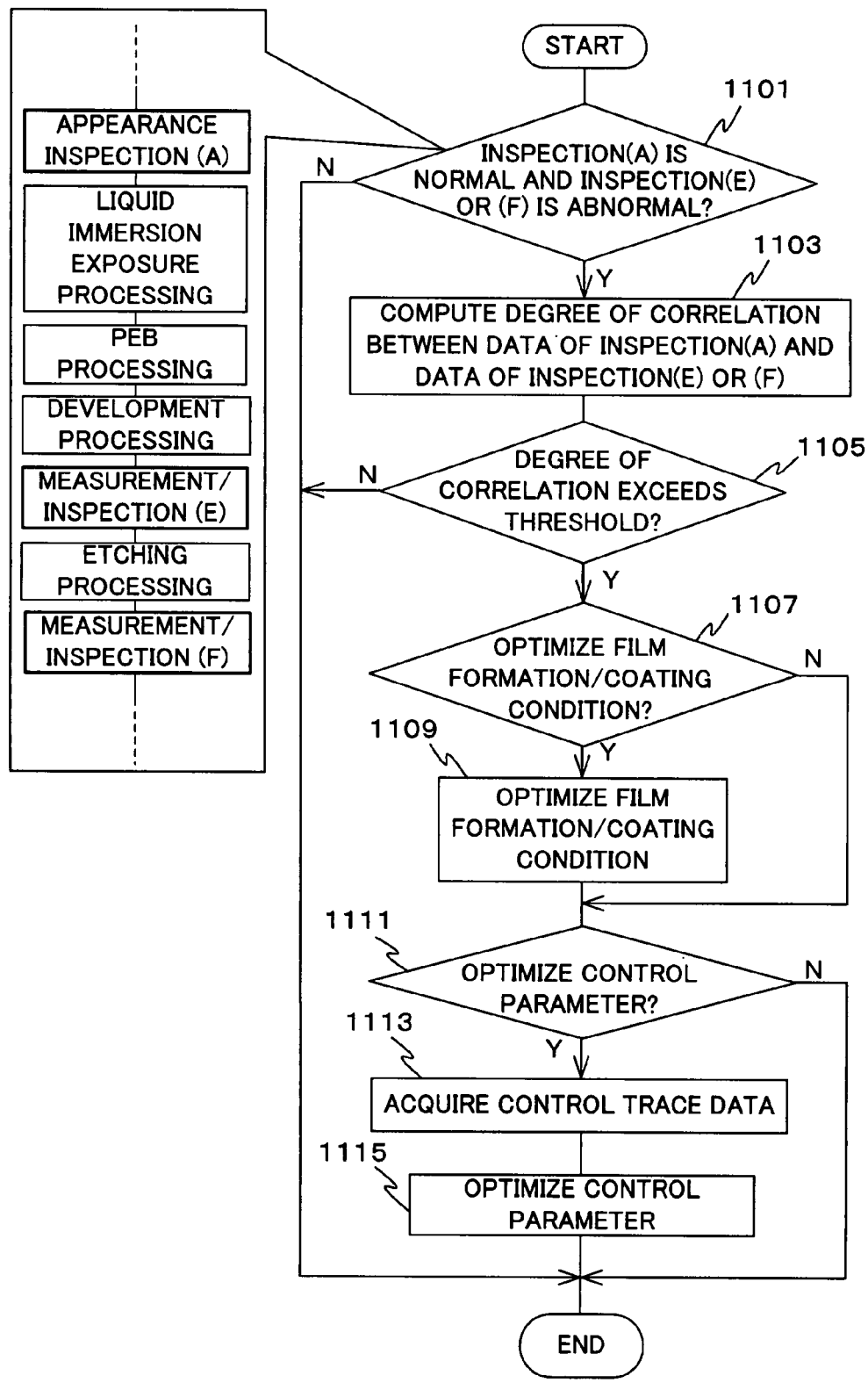
FIG. 44 is a flowchart of analytical processing in optimization of liquid-immersion-exposure-related processing conditions (No. 8)

FIG. 44 shows a flowchart of this analytical processing. As is shown in FIG. 44, first, in step 1101, the judgment is made of whether or not a result of inspection (A) is normal and a result of inspection (E) or inspection (F) is abnormal. When the judgment is denied, the processing is finished, and when the judgment is affirmed, the procedure proceeds to step 1103. In step 1103, the degree of correlation between data of inspection (A) and data of inspection (E) or inspection (F) is computed. In step 1105, whether or not the degree of correlation exceeds a threshold is judged. When the judgment is denied, the processing is finished, and when the judgment is affirmed, the procedure proceeds to step 1107.

In step 1107, the judgment is made of whether or not film formation/coating conditions are set to be optimized. Only in the case the judgment is affirmed, the film formation/coating conditions are optimized in step 1109. In step 1111, whether or not to optimize control parameters is judged. Only in the case the judgment is affirmed, the control trace data of control errors of an exposure dose, synchronous accuracy, focus, a lens and the like is acquired in step 1113, and the control parameters are optimized in step 1115.

(12) Optimization of Pattern-overlay-accuracy-related Processing Conditions (No. 1)

Next, the case will be described where optimization of pattern-overlay-accuracy-related processing conditions (No.1) is performed. In this case, host 600 selects the subitem (selection): alignment pre-measurement in the main item: wafer measurement and/or inspection processing (B) and the subitem (selection): overlay error measurement in the main item: wafer measurement and/or inspection processing (E) or wafer measurement and/or inspection processing (F), and creates processing procedures.

Figure 45:
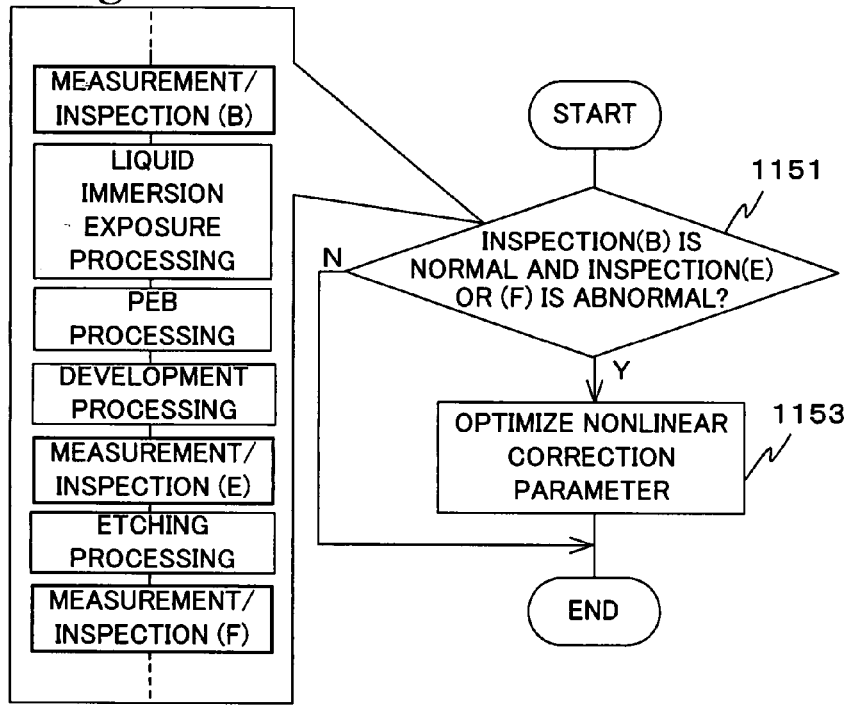
FIG. 45 is a flowchart of analytical processing of optimization of pattern-overlay-accuracy-related processing conditions (No. 1)

FIG. 45 shows a flowchart of this analytical processing. As is shown in FIG. 45, first, in step 1151, the judgment is made of whether or not a result of inspection (B) is normal and a result of inspection (E) or inspection (F) is abnormal. When the judgment is denied, the processing is finished, and when the judgment is affirmed, the nonlinear correction parameters used to correct a nonlinear component of shot array out of the alignment-related parameters are optimized.

(13) Optimization of Pattern-overlay-accuracy-related Processing Conditions (No. 2)

Next, the case will be described where optimization of pattern-overlay-accuracy-related processing conditions (No. 2) is performed. In this case, host 600 selects the subitem (selection): alignment pre-measurement in the main item: wafer measurement and/or inspection processing (B) and the subitem (selection): overlay error measurement in the main item: wafer measurement and/or inspection processing (E) or wafer measurement and/or inspection processing (F), and creates processing procedures.

Figure 46:
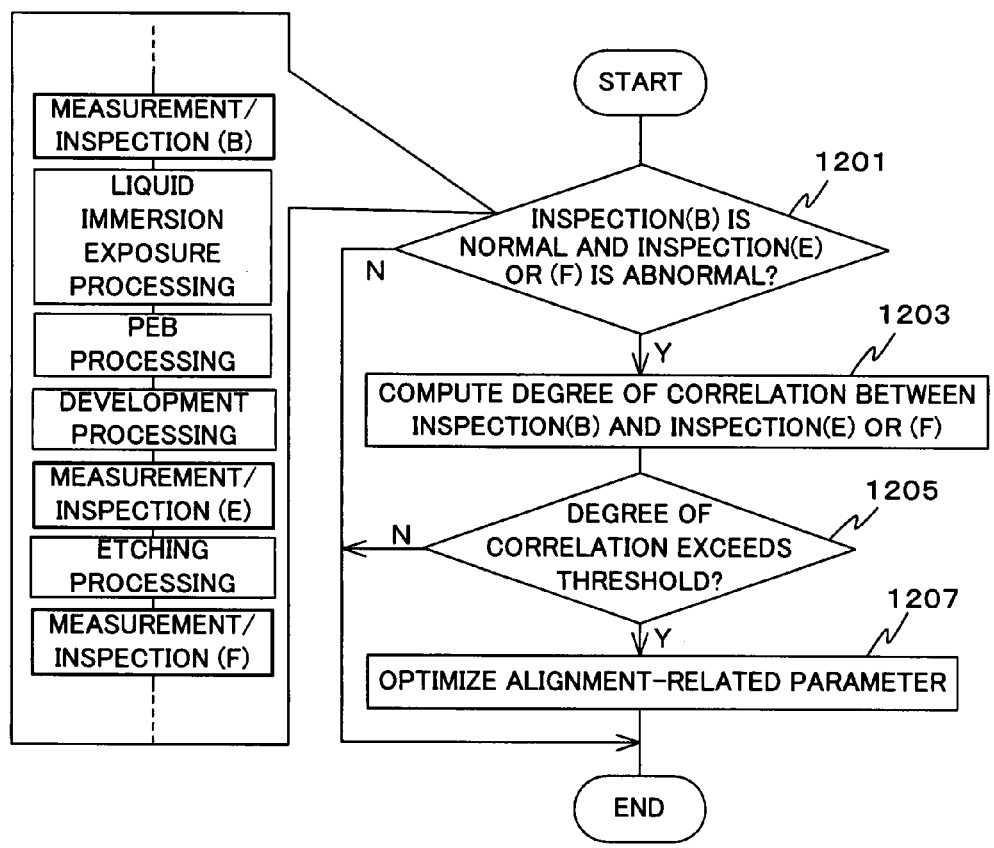
FIG. 46 is a flowchart of analytical processing in optimization of pattern-overlay-accuracy-related processing conditions (No. 2).

FIG. 46 shows a flowchart of this analytical processing. As is shown in FIG. 46, first, in step 1201, the judgment is made of whether or not a result of inspection (B) is normal and a result of inspection (E) or inspection (F) is abnormal. When the judgment is denied, the processing is finished, and when the judgment is affirmed, the degree of correlation between inspection (B) and inspection (E) or inspection (F) is computed in step 1203. In step 1205, whether or not the degree of correlation exceeds a threshold is judged. When the judgment is denied, the processing is finished, and when the judgment is affirmed, the procedure proceeds to step 1207, in which the alignment-related parameters are optimized.

The optimization processings in (1) to (13) described above can be combined as needed. It is effective to combine the processing procedures related to the same system parameters, for example, to combine the optimization related to alignment in (1) and the optimization of overlay error in (13), or the like. However, the optimization in (1) to (13) may be performed in a predetermined order. The procedures can be freely designed in host 600 such as being designed to perform the optimization in (13) after completing the optimization in (1). Since the ultimate purpose of the process is to form a device pattern on wafer W with good accuracy, the processing procedures with which the purpose can be achieved earlier are preferable. For example, the optimization processing that seems to be most effective can preferentially be executed, or the processing of optimizing the processing condition that greatly affects the yield in particular can preferentially be executed.

Incidentally, in the optimization in (1) to (13), two types of measurement and/or inspection results and the optimization results are to be complied as a database in step 413 of FIG. 27. The database can be used in the succeeding processes as the knowledge that has been obtained beforehand. For example, when the similar measurement and/or inspection results are obtained, optimization of parameters can be more efficiently performed by searching which optimization of parameter is effective or not effective and optimizing the parameter according to the searching results. In such a database, the effectiveness of optimization of such a parameter may be analyzable for all wafers, or in the case wafers are processed per lot, the effectiveness may be verifiable with respect to each wafer in a lot.

Further, when referring to such a database, it is also possible that the fluctuation in the processing state of a processing apparatus is sensed beforehand by detecting the tendency and regularity (e.g. periodicity) of two types of measurement and/or inspection results, and the processing contents of the processing apparatus are adjusted in advance so that occurrence of abnormality is anticipated and prevented. Such regularity can be expressed by, for example, a time function. For example, a long-term fluctuation such as focus fluctuation of a projection optical system of an exposure apparatus is expressed in a function that uses the time, the environment (the temperature and humidity) within the plant and the like as variables, referring to the database (trace data in exposure apparatuses 100 and 101). In the case the function has the regularity, a best focus position that is a target value of focus control can be finely adjusted based on the function, and as a consequence, occurrence of abnormality (such as line width abnormality) in the measurement and/or inspection results can be anticipated and prevented. Besides, the alignment-related parameters can also be adjusted so that highly accurate overlay can be realized, by taking into consideration the regularity of measurement results of overlay error, the regularity of mark waveform data and the like. Further, since abnormality that occurs in the measurement and/or inspection at the latter stage can be predicted to some extent from the regularity of the measurement and/or inspection at the former stage, the measurement and/or inspection at the latter stage can be strictly executed.

[Summary]

As is described in detail above, according to the embodiment, two types of measurement and/or inspection result data of measurement and/or inspection processings (e.g. film thickness data and mark waveform data, or appearance inspection data before and after the liquid immersion exposure processing) that are included in a series of processes are collected, the collected two types of measurement and/or inspection result data are compositely combined and analyzed, processing conditions under which processing results to wafer W are favorable are specified by performing optimization based on the analytical results, and the processing conditions (e.g. liquid-immersion-related parameters, control system parameters, and alignment-related parameters of exposure apparatus 100, 101) are optimized, and therefore, more efficient optimization of the processing conditions can be performed than the case where the processing conditions are optimized using only one type of measurement and/or inspection results data.

Further, in the embodiment, in analytical apparatus 170, the processing whose processing conditions are optimized is decided based on the correlation between two types of measurement and/or inspection result data. In this manner, in the case there is the correlation between two types of measurement and/or inspection results, the processing that is effective for optimizing the processing conditions can be specified from among a plurality of processings. For example, in the case there is the correlation between film thickness data and mark waveform data, the film formation/resist coating processing can be specified as the processing that is effective for optimizing the processing conditions.

Further, in the embodiment, in analytical apparatus 170, the processing conditions are optimized based on data related to at least one of the correlation between two types of measurement and/or inspection results and the total of two types of measurement and/or inspection results. Since the processing state of wafer W can be analyzed in detail using the correlation and/or the total of two types of measurement and/or inspection results or the like, more efficient optimization of the processing conditions can be performed than the case where the processing conditions are optimized based on a single measurement and/or inspection result. For example, by analyzing the surface shape of wafer W based on the correlation and/or the total of film thickness data and focus pre-measurement data, efficient optimization of focus-related parameters can be performed.

Further, according to the embodiment, as two types of measurement and/or inspection results, measurement and/or inspection results in the measurement and/or inspection processing that is performed before and after a specific processing (e.g. exposure processing) out of a plurality of processings are used. Further, in analytical apparatus 170, the processing conditions are optimized based on whether or not there is the correlation between two types of measurement and/or inspection results (existence/nonexistence of the correlation between film thickness data and mark waveform data), whether or not an individual measurement and/or inspection result is favorable (a result of anterior inspection is normal and a result of posterior inspection is abnormal), and the like. In this manner, by analyzing the correlation or the difference between the measurement and/or inspection results before and after a certain processing, analysis with respect to each processing can be performed when the processings of plural stages including at least a specific processing are analyzed. Further, analysis of the etching processing or the like can be performed based on the change in measurement and/or inspection results (e.g. difference between a pattern line width after the development processing and a pattern line width after the etching processing).

Further, in the embodiment, in the case abnormality is not detected in an anterior measurement and/or inspection processing that is performed before a specific processing (such as the exposure processing, the PEB processing, the development processing, or the etching processing) and abnormality is detected in a posterior measurement and/or inspection processing after the specific processing, analytical apparatus 170 optimizes processing conditions of a substrate processing that is performed prior to the posterior measurement and/or inspection processing.

In this case, in the case abnormality is not detected in an anterior measurement and/or inspection processing that is performed before a specific processing and abnormality is detected in a posterior measurement and/or inspections processing after the specific processing, and also there is the correlation between measurement and/or inspection result data of the anterior measurement and/or inspection processing and measurement and/or inspection result data of the posterior measurement and/or inspection processing, analytical apparatus 170 optimizes processing conditions of the anterior measurement and/or inspection processing. This is because in the case there is the correlation between measurement and/or inspection processings before and after a certain processing and abnormality is detected only in the latter measurement and/or inspection processing, it is considered that abnormality can be detected in the former measurement and/or inspection processing.

Further, according to the embodiment, in the case abnormality is not detected in an anterior measurement and/or inspection processing before a specific processing and abnormality is detected in a posterior measurement and/or inspection processing after the specific processing, analytical apparatus 170 acquires data related to processing state of the processing that has been performed before the posterior measurement and/or inspection processing (e.g. trace data of exposure apparatus 100, 101), and optimizes processing conditions based on the acquired data. Thus, based on the processing state of the processing before the posterior measurement and/or inspection processing including the specific processing that has a high possibility of being a cause of abnormality in the posterior measurement and/or inspection processing, whether or not the processing is the cause of abnormality can efficiently be identified.

Further, according to the embodiment, it is possible to analyze data related to processing state of a specific processing and optimize its processing conditions. That is, by analyzing a factor in the order of proximity to the measurement and/or inspection processing that has the highest possibility of being a factor of abnormality, it becomes possible to identify the factor of abnormality earlier.

However, it is also possible to further optimize processing conditions of a substrate processing that is performed after the. That is, even if abnormality is detected in the posterior measurement and/or inspection processing and a factor of the abnormality exists in the processing other than the posterior measurement and/or inspection processing, in the case the abnormality can be covered by the subsequent processing to some extent, processing conditions of the subsequent processing that is performed after the posterior measurement and/or inspection processing may be optimized so as to cover the abnormality. For example, in the case the entire line width of a device pattern is thin because of an exposure dose or focus in exposure apparatus 100 or 101, processing conditions of the development processing or the etching processing can be optimized so that the line width of a device pattern (e.g. a pattern that is formed by a positive resist portion that remains after development) by a formed resist image or etching image (image formed after etching) becomes thick, for example, the processing time can be shortened.

Further, according to the embodiment, while a series of processes are performed to a plurality of wafers W, a relation between two types of measurement and/or inspection result data and information on optimization results of processing conditions is registered in a database. By referring to the database, the processing conditions that have the high correlativity with two types of measurement and/or inspection results can be grasped in advance. Analytical apparatus 170 can preferentially optimize the processing conditions having the high correlativity based on the database.

Further, according to the embodiment, while a series of processes are performed to a plurality of wafers, the regularity of data related to measurement and/or inspection results is extracted. Then, when optimizing processing conditions, the extracted regularity is taken into consideration. Thus, optimization of the processing conditions can be performed.

In the embodiment, the optimization processing of several specific processing conditions has been described.

For example, in the embodiment, in the case there is the correlation between film thickness data of films that are formed on wafer W by the film formation/resist coating processing and waveform data of the wafer marks on wafer W, at least one of a measurement condition of the wafer marks in the alignment pre-measurement and a film formation/coating condition can be optimized so that the measurement results of the wafer marks on wafer W are not affected by the thickness of films.

Further, in the embodiment, in the case there is the correlation between film thickness data of films on wafer W and surface shape data of the exposed surface of wafer W, a film formation/coating condition or focus-related parameters (e.g. a selection state of a focus sensor) can be optimized.

Further, in the embodiment, in the case a foreign substance is not detected in appearance inspection (B) on wafer W before the exposure processing and a foreign substance is detected in appearance inspection (C) on wafer W after the exposure processing, and also there is the correlation between these inspection data, an inspection condition of foreign substances on wafer W before the exposure processing can be optimized.

Further, in the embodiment, in the case a result of appearance inspection of films formed on wafer W by the film formation processing is normal and a result of appearance inspection of the films on wafer W after the exposure processing is abnormal, it is possible to acquire trace data of control error of the exposure processing and optimize a processing condition of at least one of the exposure processing and the liquid removable processing based on the acquired trace data.

Further, in the case a result of appearance inspection of wafer W before the PEB processing is normal and a result of appearance inspection of wafer W after the PEB processing is abnormal, data of processing state of the PEB processing is acquired. Then, based on the acquired data of processing state, the PEB processing is checked. In the case the judgment is made as a result of this check that a factor of abnormality in appearance inspection of wafer W is not the PEB processing, at least one of a processing condition of the foreign substance inspection processing of wafer W before the PEB processing, a processing condition of the exposure processing and a processing condition of the liquid removal processing can be optimized.

Further, in the embodiment, in the case a result of appearance inspection before the PEB processing is normal and a result of pattern defect inspection after the development processing is abnormal, data of processing state of the development processing and the postbake processing is acquired. Then, in the case the judgment is made that neither the development processing nor the postbake processing is a factor of abnormality in the appearance inspection result based on the acquired data, at least one of a processing condition of the foreign substance inspection processing of the wafer before and after postbake processing, a processing condition of the exposure processing and a processing condition of the liquid removal processing can be optimized.

Further, in the embodiment, in the case shot flatness of the exposed surface of wafer W before the exposure processing is normal and a measurement result of a pattern line width of wafer W after the development processing or the etching processing is abnormal, data of processing state of at least one of the development processing, the postbake processing and the exposure processing is acquired and analyzed, and in the case the judgment is made that none of the etching processing, the postbake processing and the exposure processing is a factor of abnormality of the pattern line width, at least one of a processing condition of the exposure processing and a processing condition of the liquid removal processing can be optimized.

Further, in the embodiment, in the case a measurement result of a pattern line width on wafer W after the development processing is normal and a measurement result of a pattern line width on wafer W after the etching processing is abnormal, a processing state of the etching processing is analyzed, and in the case the judgment is made that the etching processing is not a factor of abnormality of a pattern line width, at least one of a processing condition of the exposure processing and a processing condition of the liquid removal processing can be optimized.

Further, in the embodiment, based on the correlativity between a change in inspection result of films on wafer W and a measurement result of variation in a pattern line width after the development processing or the etching processing, at least one of a film formation/coating condition and a processing condition of the exposure processing can be optimized.

Further, in the embodiment, in the case a result of alignment pre-measurement before the exposure processing is normal and a measurement result of overlay error of a pattern on wafer W after the development processing or the etching processing is abnormal, a processing condition of wafer alignment is optimized, and alignment-related parameters can be optimized based on the correlativity between an alignment pre-measurement result used for alignment of wafer W before the exposure processing and overlay error data of a pattern on wafer W after the development processing or the etching processing.

Host 600 can execute these optimization processing procedures in combination. In this case, host 600 can judge whether to perform liquid immersion exposure or dry exposure, and based on the judgment result, change the processing procedures.

Further, in the embodiment, since a processing content of at least part of a plurality of processings is adjusted in accordance with data related to whether the exposure processing is performed by liquid immersion exposure or dry exposure, relevant processing conditions can be appropriately adjusted in accordance with the exposure that has been performed to a wafer, and the adjustment results can be notified to a relevant processing apparatus.

In this case, in the adjustment process, at least one of an inspection item, inspection sensitivity and an inspection condition of the inspection processing can be switched depending on liquid immersion exposure or dry exposure. For example, in the case the exposure processing is performed by liquid immersion exposure, at least one of a defect inspection to a pattern defect peculiar to liquid immersion exposure, an abnormal inspection of abnormality of wafer W due to liquid used in liquid immersion exposure, and a remaining liquid inspection of liquid that adheres on wafer W after liquid immersion exposure is added as an inspection item of the inspection processing.

Further, in the embodiment, the pattern defect peculiar to liquid immersion exposure includes a pattern defect due to a stain adhering to an optical element of the projection optical system that comes into contact with liquid, bubbles or a foreign substance in liquid, and the appearance inspection of wafer W includes an inspection related to a watermark, a stain due to elution of material such as a resist film formed on wafer W into liquid, and peeling of a resist film or the like on wafer W, and the remaining liquid inspection includes a foreign substance inspection in the remaining liquid on wafer W.

Further, in the case the exposure processing is performed by liquid immersion exposure, the inspection sensitivity of the inspection processing is set slightly higher than that of dry exposure.

The inspection conditions of the inspection processing include at least one of the wavelength of illumination light that illuminates wafer W during the inspection, a detection method, a detection optical system, and a detection algorithm. For example, in the case the exposure processing is performed by liquid immersion exposure, shortening of the wavelength of illumination light, selection of a bright field out of bright and dark fields, selection of an electron beam detection method out of an optical detection method and the electron beam detection method, selection of a confocal system, and selection of an image comparison algorithm or a feature extraction algorithm out of the image comparison algorithm, a design data comparison algorithm and the feature extraction algorithm as a detection method are performed.

Further, in the embodiment, analytical apparatus 170 computes the correlativity between data of monitoring results of a liquid immersion portion during liquid immersion exposure and data of inspection results of the inspection processing. Then, based on the computed correlativity, at least one of an exposure condition in the exposure processing and an inspection condition in the inspection processing is optimized.

Measurement and/or inspection instrument 120 increases the inspection frequency of the appearance inspection of the outer circumference of wafer W. This is because there is the high probability that abnormality occurs in the outer circumference of wafer W in liquid immersion exposure. Meanwhile, by reducing the inspection frequency accordingly for a portion where there is the low probability that abnormality occurs, the decrease in throughput can be prevented.

Further, in the embodiment, analytical apparatus 170 further computes the correlativity between a period of time when each point on wafer W is immersed in liquid (liquid immersion time) and data of inspection results of the inspection processing. Then, based on the correlativity, at least one of an exposure route on wafer W, a film formation condition to wafer W and a liquid removal condition on wafer W after liquid immersion exposure is adjusted.

Further, according to the embodiment, in the case the exposure processing is performed by liquid immersion exposure, an inspection processing of a topcoat film that protects a resist film coated o wafer W from liquid is added to the inspection contents.

Further, in the embodiment, data of inspection results of the inspection processing and the like is registered in a database, and based on the database, information on occurrence frequency of abnormality at each point in wafer W is computed. Then, measurement and/or inspection instrument 120 increases or decreases the inspection frequency at each point in wafer W based on the information on occurrence frequency of abnormality.

Incidentally, the process window may be changed between liquid immersion exposure and dry exposure. Since the depth of focus is different between dry exposure apparatus 100 and liquid immersion exposure apparatus 101, even in the case the same device pattern is transferred, the range of settable exposure dose and focus is different, and therefore, the process window is preferably controlled separately.

Incidentally, analytical apparatus 170 does not have to be independent, and may also be equipped in host 600, exposure apparatuses 100 and 101, track 200, measurement and/or inspection instrument 120, and each apparatus (910, 920, 930 or 940) of device manufacturing apparatus group 910. By the analytical apparatus being equipped in the apparatuses described above, the exposure apparatus, the track, the measurement and/or inspection instrument, and the device manufacturing apparatus can have the ability to optimize the processing conditions by itself.

Incidentally, in the embodiment above, although the case of a transmissive type reticle R has been described, reticle R is not limited to the transmissive type but may be a reflective type.

The unit that monitors a liquid immersion state is not limited to the one described above. Any unit can be employed as far as the unit can observe a liquid immersion state of a liquid immersion area corresponding to exposure area IA.

Further, in the embodiment above, the case has been described where light source for illumination 15 is installed in the area adjacent to the liquid immersion area for illuminating the liquid immersion area. However, the present invention is not limited to this, and instead of light source for illumination 15, for example, a light-emitting device may also be arranged on base material 261, or when a line sensor that has the sensitivity to exposure light EL is used as a line sensor of liquid immersion monitor 260, the liquid immersion area may also be illuminated using exposure light EL.

Further, in the embodiment above, measurement and/or inspection instrument 120 is placed inline outside the track within exposure cell 700, but measurement and/or inspection instrument 120 may be placed inline within track 200, or placed offline outside exposure cell 700.

Further, in the embodiment above, measurement and/or inspection instruments that perform the measurement and/or inspection processings performed at the respective stages, that is, a measurement and/or inspection instrument that performs a appearance inspection of wafer W that has been exposed by liquid immersion exposure, a measurement and/or inspection instrument that performs an appearance inspection of wafer W to which the PEB processing has been performed, a measurement and/or inspection instrument that performs a pattern inspection of wafer W to which the development processing has been performed, and the like may also be different measurement and/or inspection instruments respectively.

Further, in the embodiment above, removal unit T may also perform the processing not only to wafer W after the exposure processing but also to wafer W before the exposure processing. That is, removal unit T may also be used for removing foreign substances such as particles adhering to wafer W before exposure processing.

Further, in the embodiment above, the case has been described where an object that is subject to exposure in exposure apparatus 100 or exposure apparatus main section S is a semiconductor wafer for manufacturing a semiconductor. However, the present invention is not limited to this, and for example, the object may be a glass substrate for a display device, a ceramic wafer for a thin film magnetic head, an original plate (synthetic silica glass, silicon wafer) of a mask or a reticle used in an exposure apparatus, or the like. In other words, exposure apparatus 100 or exposure apparatus mains section S is not limited to an exposure apparatus for manufacturing semiconductor devices, but may be exposure apparatuses such as an exposure apparatus for manufacturing liquid crystal display devices, an exposure apparatus for manufacturing displays, an exposure apparatus for manufacturing thin film magnetic heads, an exposure apparatus for manufacturing imaging devices, or an exposure apparatus for manufacturing reticles or masks.

Moreover, the shape of an object that is subject to exposure in exposure apparatus 100 or exposure apparatus main section S is not limited to a circular shape, but may be, for example, a rectangular shape. In this case, base material 261 of liquid immersion monitor 260 that has also a rectangular shape is used.

Further, in the embodiment above, exposure apparatus 100 or exposure apparatus main section S may be a scanning exposure apparatus (so-called scanning stepper) that exposes a pattern that is formed on reticle R on wafer W while synchronously moving reticle R and wafer W in a scanning direction, or a projection exposure apparatus by a step-and-repeat method that exposes a pattern formed on reticle R in one time in a state where reticle R and wafer W are made static and sequentially performs step movement of wafer W. Moreover, exposure apparatus 100 or exposure apparatus main section S may be an exposure apparatus by a step-and-stitch method.

Further, exposure apparatus 100 or exposure apparatus main section S may be a twin-stage-type exposure apparatus that is equipped with a plurality of wafer stages (e.g. refer to Kokai (Japanese Unexamined Patent Application Publication) Nos. 10-163099 and 10-214783 (the corresponding U.S. Pat. No. 6,590,634), and Kohyo (published Japanese translation of International Publication for Patent Application) No. 2000-505958 (the corresponding U.S. Pat. No. 5,969,441)). Besides, various processing apparatuses can have a tandem configuration that is equipped with two processing sections so as to null the dead time.

Incidentally, in exposure apparatus 100 or exposure apparatus main section S in the embodiment above, a light-transmissive type mask (reticle), which is a light-transmissive substrate on which a predetermined light-shielding pattern (or a phase pattern or a light attenuation pattern) is formed, is used. Instead of this mask, however, as is disclosed in, for example, U.S. Pat. No. 6,778,257, an electron mask (which is also called a variable shaped mask, and includes, for example, a DMD (Digital Micromirror Device) that is a type of a non-emission type image display device (which is also called a spatial light modulator) or the like) on which a light-transmitting pattern, a reflection pattern, or an light-emitting pattern is formed according to electronic data of the pattern that is to be exposed may also be used. Further, the exposure apparatus may also be an exposure apparatus that forms a device pattern on wafer W by forming the interference fringe on wafer W, as is disclosed in the pamphlet of International Publication No. 2001/035168.

Further, exposure apparatus main section S may be a liquid immersion exposure apparatus that performs exposure in a state where the entire surface of wafer W is immersed in liquid (e.g. refer to Kokai (Japanese Unexamined Patent Application Publication) Nos. 06-124873 and 10-303114, and the U.S. Pat. No. 5,825,043).

Incidentally, the above disclosures of the various publications (including the pamphlets of the International Publications) and the U.S. Patent descriptions related to exposure apparatuses and the like that are cited in the embodiment and modified examples described above are each incorporated herein by reference.

Further, in the embodiment above, the local liquid immersion type exposure apparatus is exemplified, but part of the substrate processing method and the substrate processing system, for example, the substrate processing method and the substrate processing system that optimize the inspection conditions based on at least one of a film formation status of films that are formed by the film forming apparatus and a film formation condition of the film forming apparatus can also be applied to a non-liquid-immersion type exposure apparatus. Accordingly, the type of exposure apparatus is not limited to a liquid immersion type.

Further, in the embodiment above, the programs related to the present invention are each recorded in a flash memory, but may be recorded in another information recoding medium (such as CD, magnet-optical disk, DVD, memory card, USB memory, or diskette). Further, the programs related to the present invention may also be transferred to each flash memory via a network (such as LAN, intranet or internet).

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An adjustment method in which a processing condition of a substrate processing from amongst a plurality of substrate processings that are performed in series and that include a measurement and/or inspection processing is adjusted, the method comprising:
    a collection process of collecting information on at least two types of measurement and/or inspection results obtained from at least one substrate;
    an optimization process of optimizing a processing condition of at least one of the plurality of substrate processings based on the collected information on the at least two types of measurement and/or inspection results, the optimization process determining the substrate processing to be optimized based on information as to whether a correlation exists between the collected information on the at least two types of measurement and/or inspection results; and
    a transmission process of transmitting information on the optimized processing condition to an apparatus that performs the processing associated with the optimized substrate processing.

2. The adjustment method according to claim 1, wherein the plurality of substrate processings include a film formation processing of forming a film on the substrate and an exposure processing of forming a pattern on the substrate by exposing the substrate,
    the information on the at least two types of measurement and/or inspection results includes first information on a measurement result of a thickness of the film formed on the substrate by the film formation processing and second information on a measurement result of an alignment mark formed on a base of the substrate before the exposure processing,
    the processing condition to be optimized includes at least one of a processing condition related to an alignment condition of the substrate in the exposure processing and a film formation condition of the film on the substrate, and
    in the optimization process, in the case there is a correlation between the first information and the second information, at least one of a measurement condition of the alignment mark and a film formation condition is optimized so that a measurement result of the alignment mark of the substrate is not affected by the thickness of the film.

3. A substrate processing method, comprising:
    an adjustment process of adjusting a processing condition of a substrate processing using the adjustment method according to claim 2.

4. The adjustment method according to claim 1, wherein the plurality of substrate processings include a film formation processing of forming a film on the substrate and an exposure processing of transferring a pattern to the substrate via a projection optical system,
    the information on the at least two types of measurement and/or inspection results includes first information on a measurement result of a thickness of the film formed on the substrate by the film formation processing and second information on a measurement result of a surface shape of an exposed surface of the substrate in the exposure processing,
    the processing condition to be optimized includes at least one of a processing condition related to focus of the substrate with respect to the projection optical system in the exposure processing and a film formation condition of the film on the substrate, and in the optimization process, in the case there is a correlation between the first information and the second information, the film formation condition is optimized, and the processing condition related to focus is optimized based on the first information and the second information.

5. A substrate processing method, comprising:
an adjustment process of adjusting a processing condition of a substrate processing using the adjustment method according to claim 4.

6. The adjustment method according to claim 1, further comprising:
a storage process of storing a causal relation between the information on the at least two types of measurement and/or inspection results and information on an optimization result of the processing condition; and
an extraction process of extracting a processing condition that has high correlativity with the measurement and/or inspection results based on the storage result, the storage process and the extraction process being performed while performing the plurality of substrate processings to a plurality of substrates, wherein
in the optimization process, the extracted processing condition is preferentially optimized.

7. The adjustment method according to claim 1, further comprising:
an extraction process of extracting regularity of information on the measurement and/or inspection results, while performing the plurality of substrate processings to a plurality of substrates, wherein
in the optimization process, the processing condition is optimized based on the extracted regularity.

8. The adjustment method according to claim 1, wherein the plurality of substrate processings include a film formation processing of forming a film on the substrate and an exposure processing of forming a pattern on the substrate by exposing the substrate,
the information on the at least two types of measurement and/or inspection results includes first information on a foreign substance inspection result on the substrate before the exposure processing and second information on a foreign substance inspection result on the substrate after the exposure processing, and
in the optimization process, in the case a foreign substance is not detected in the first information and a foreign substance is detected in the second information and also there is a correlation between the first information and the second information, an inspection condition of a foreign substance on the substrate before the exposure processing is optimized.

9. A substrate processing method, comprising:
an adjustment process of adjusting a processing condition of a substrate processing using the adjustment method according to claim 8.

10. A substrate processing apparatus that performs a substrate processing according to transmitted information using the adjustment method according to claim 1.

11. An adjustment method in which a processing condition of a substrate processing from amongst a plurality of substrate processings that are performed in series and that include a measurement and/or inspection processing is adjusted, the method comprising:
a collection process of collecting information on a measurement and/or inspection result, in a measurement and/or inspection processing performed before and after at least one specific processing of the plurality of substrate processings, obtained from at least one substrate;
an optimization process of optimizing a processing condition of at least one of the plurality of substrate processings based on the collected information; and
a transmission process of transmitting information on the optimized processing condition to an apparatus that performs the processing associated with the optimized substrate processing,
wherein, in the optimization process, one of the processing conditions is optimized based on information on at least one of a correlation, quality and change of a measurement and/or inspection result in the measurement and/or inspection processing performed before and after the at least one specific processing.

12. The adjustment method according to claim 11, wherein in the optimization process, in the case abnormality is not detected in an anterior measurement and/or inspection processing before the specific processing and abnormality is detected in a posterior measurement and/or inspection processing after the specific processing, a processing condition of a substrate processing that is performed before the posterior measurement and/or inspection processing is optimized.

13. The adjustment method according to claim 12, wherein in the optimization process, in the case abnormality is not detected in the anterior measurement and/or inspection processing before the specific processing and abnormality is detected in the posterior measurement and/or inspection processing after the specific processing and also there is a correlation between information on a measurement and/or inspection result of the anterior measurement and/or inspection processing and information on a measurement and/or inspection result of the posterior measurement and/or inspection processing, a processing condition of the anterior measurement and/or inspection processing is optimized.

14. The adjustment method according to claim 12, wherein in the optimization process, in the case abnormality is not detected in the anterior measurement and/or inspection processing before the specific processing and abnormality is detected in the posterior measurement and/or inspection processing after the specific processing, information on a processing state of a substrate processing that is performed before the posterior measurement and/or inspection processing is acquired, and the processing condition is optimized based on the acquired information.

15. The adjustment method according to claim 14, wherein information on a processing state of the specific processing is preferentially analyzed and a processing condition of the specific processing is optimized.

16. The adjustment method according to claim 12, wherein in the optimization process, a processing condition of a substrate processing that is performed after the posterior measurement and/or inspection processing is also optimized further.

17. An adjustment method, in which a processing condition of a substrate processing from amongst a plurality of substrate processings that are performed in series and that include a measurement and/or inspection processing is adjusted, the method comprising:
a collection process of collecting information on at least two types of measurement and/or inspection results obtained from at least one substrate;
an optimization process of optimizing a processing condition of at least one of the plurality of substrate processings based on the collected information on the at least two types of measurement and/or inspection results; and a transmission process of transmitting information on the optimized processing condition to an apparatus that performs the processing associated with the optimized substrate processing, wherein the plurality of substrate processings include a film formation processing of forming a film on the substrate, an exposure processing of forming a pattern on the substrate by liquid immersion exposure and a removal processing of liquid on the substrate, the information on the at least two types of measurement and/or inspection results includes first information on an inspection result before the exposure processing of a film formed on the substrate by the film formation processing, and second information on an inspection result of a foreign substance on the substrate after the exposure processing, and in the optimization process, in the case the first information is normal and the second information is abnormal, information on a processing state of the exposure processing is acquired, and a processing condition of at least one of the exposure processing and the removal processing is optimized based on the acquired information.

18. A substrate processing method, comprising:
an adjustment process of adjusting a processing condition of a substrate processing using the adjustment method according to claim 17.

19. A substrate processing method in which a plurality of substrate processings that include an exposure processing of forming a pattern on a substrate by exposing the substrate and an inspection processing of inspecting the substrate afterward are performed, the method comprising:
an acquisition process of acquiring information as to whether the exposure processing has been performed by liquid immersion exposure or dry exposure; and
an adjustment process of adjusting a processing condition of a substrate processing using the adjustment method according to claim 18, in the case the exposure processing is judged to have been performed by liquid immersion exposure based on the acquired information.

20. An adjustment method in which a processing condition of a substrate processing from amongst a plurality of substrate processings that are performed in series and that include a measurement and/or inspection processing is adjusted, the method comprising:
a collection process of collecting information on at least two types of measurement and/or inspection results obtained from at least one substrate;
an optimization process of optimizing a processing condition of at least one of the plurality of substrate processings based on the collected information on the at least two types of measurement and/or inspection results; and
a transmission process of transmitting information on the optimized processing condition to an apparatus that performs the processing associated with the optimized substrate processing,
wherein the plurality of substrate processings include a film formation processing of forming a film on the substrate, an exposure processing of forming a pattern on the substrate by liquid immersion exposure, a removal processing of liquid on the substrate and a postbake processing to the substrate,
the information on the at least two types of measurement and/or inspection results includes first information on a foreign substance inspection result of the substrate before the postbake processing and second information on a foreign substance inspection result of the substrate after the postbake processing, in the case the first information is normal and the second information is abnormal, information on a processing state of the postbake processing is acquired, and in the optimization process, in the case the postbake processing is judged not to be a factor of abnormality in the second information based on the acquired information, at least one of a processing condition of the foreign substance inspection processing of the substrate before the postbake processing, a processing condition of the exposure processing and a processing condition of the liquid removal processing is optimized.

21. A substrate processing method, comprising:
an adjustment process of adjusting a processing condition of a substrate processing using the adjustment method according to claim 20.

22. A substrate processing method in which a plurality of substrate processings that include an exposure processing of forming a pattern on a substrate by exposing the substrate and an inspection processing of inspecting the substrate afterward are performed, the method comprising:
an acquisition process of acquiring information as to whether the exposure processing has been performed by liquid immersion exposure or dry exposure; and
an adjustment process of adjusting a processing condition of a substrate processing using the adjustment method according to claim 20, in the case the exposure processing is judged to have been performed by liquid immersion exposure based on the acquired information.

23. An adjustment method in which a processing condition of a substrate processing from amongst a plurality of substrate processings that are performed in series and that include a measurement and/or inspection processing is adjusted, the method comprising:
a collection process of collecting information on at least two types of measurement and/or inspection results obtained from at least one substrate;
an optimization process of optimizing a processing condition of at least one of the plurality of substrate processings based on the collected information on the at least two types of measurement and/or inspection results; and
a transmission process of transmitting information on the optimized processing condition to an apparatus that performs the processing associated with the optimized substrate processing,
wherein the plurality of substrate processings include a film formation processing of forming a film on the substrate, an exposure processing of forming a pattern on the substrate by liquid immersion exposure, a removal processing of liquid on the substrate, a postbake processing to the substrate and a development processing to the substrate,
the information on the at least two types of measurement and/or inspection results includes first information on a foreign substance inspection result of the substrate before the postbake processing and second information on a pattern inspection result of the substrate after the development processing,
in the case the first information is normal and the second information is abnormal, information on a processing state of the development processing and the postbake processing is acquired, and
in the optimization process, in the case the development processing and the postbake processing are judged not to be a factor of abnormality in the second information based on the acquired information, at least one of an inspection condition of the substrate before and after the postbake processing, a processing condition of the exposure processing and a processing condition of the liquid removal processing is optimized.

24. A substrate processing method, comprising:
an adjustment process of adjusting a processing condition of a substrate processing using the adjustment method according to claim 23.

25. A substrate processing method in which a plurality of substrate processings that include an exposure processing of forming a pattern on a substrate by exposing the substrate and an inspection processing of inspecting the substrate afterward are performed, the method comprising:
an acquisition process of acquiring information as to whether the exposure processing has been performed by liquid immersion exposure or dry exposure; and
an adjustment process of adjusting a processing condition of a substrate processing using the adjustment method according to claim 23, in the case the exposure processing is judged to have been performed by liquid immersion exposure based on the acquired information.

26. An adjustment method in which a processing condition of a substrate processing from amongst a plurality of substrate processings that are performed in series and that include a measurement and/or inspection processing is adjusted, the method comprising:
a collection process of collecting information on at least two types of measurement and/or inspection results obtained from at least one substrate;
an optimization process of optimizing a processing condition of at least one of the plurality of substrate processings based on the collected information on the at least two types of measurement and/or inspection results; and
a transmission process of transmitting information on the optimized processing condition to an apparatus that performs the processing associated with the optimized substrate processing,
wherein the plurality of substrate processings include a film formation processing of forming a film on the substrate, an exposure processing of forming a pattern on the substrate by liquid immersion exposure, a removal processing of liquid on the substrate, a postbake processing to the substrate and a development processing to the substrate,
the information on the at least two types of measurement and/or inspection results includes first information on a foreign substance inspection result of the substrate before the development processing and second information on a pattern inspection result of the substrate after the development processing,
in the case the first information is normal and the second information is abnormal, information on a processing state of the development processing is acquired, and
in the optimization process, in the case the development processing is judged not to be a factor of abnormality in the second information based on the acquired information, at least one of a measurement and/or inspection condition of the measurement and/or inspection before the development processing, a processing condition of the exposure processing and a processing condition of the liquid removal processing is optimized.

27. A substrate processing method, comprising:
an adjustment process of adjusting a processing condition of a substrate processing using the adjustment method according to claim 26.

28. A substrate processing method in which a plurality of substrate processings that include an exposure processing of forming a pattern on a substrate by exposing the substrate and an inspection processing of inspecting the substrate afterward are performed, the method comprising:
an acquisition process of acquiring information as to whether the exposure processing has been performed by liquid immersion exposure or dry exposure; and
an adjustment process of adjusting a processing condition of a substrate processing using the adjustment method according to claim 26, in the case the exposure processing is judged to have been performed by liquid immersion exposure based on the acquired information.

29. An adjustment method in which a processing condition of a substrate processing from amongst a plurality of substrate processings that are performed in series and that include a measurement and/or inspection processing is adjusted, the method comprising:
a collection process of collecting information on at least two types of measurement and/or inspection results obtained from at least one substrate;
an optimization process of optimizing a processing condition of at least one of the plurality of substrate processings based on the collected information on the at least two types of measurement and/or inspection results; and
a transmission process of transmitting information on the optimized processing condition to an apparatus that performs the processing associated with the optimized substrate processing,
wherein the plurality of substrate processings include a film formation processing of forming a film on the substrate, an exposure processing of forming a pattern on the substrate by liquid immersion exposure, a removal processing of liquid on the substrate, a postbake processing to the substrate, a development processing to the substrate and an etching processing to the substrate,
the information on the at least two types of measurement and/or inspection results includes first information on a measurement result of a surface shape of an exposed surface of the substrate before the exposure processing, and second information on a measurement result of a size of a pattern on the substrate after the development processing or the etching processing,
in the case the first information is normal and the second information is abnormal, information on a processing state of at least one of the development processing, the postbake processing and the exposure processing is acquired and analyzed, and
in the case the development processing, the postbake processing and the etching processing are judged not to be a factor of abnormality in the second information, at least one of a processing condition of the exposure processing and a processing condition of the liquid removal processing is optimized.

30. A substrate processing method, comprising:
an adjustment process of adjusting a processing condition of a substrate processing using the adjustment method according to claim 29.

31. A substrate processing method in which a plurality of substrate processings that include an exposure processing of forming a pattern on a substrate by exposing the substrate and an inspection processing of inspecting the substrate afterward are performed, the method comprising:
an acquisition process of acquiring information as to whether the exposure processing has been performed by liquid immersion exposure or dry exposure; and
an adjustment process of adjusting a processing condition of a substrate processing using the adjustment method according to claim 29, in the case the exposure processing is judged to have been performed by liquid immersion exposure based on the acquired information.

32. An adjustment method in which a processing condition of a substrate processing from amongst a plurality of substrate processings that are performed in series and that include a measurement and/or inspection processing is adjusted, the method comprising:
- a collection process of collecting information on at least two types of measurement and/or inspection results obtained from at least one substrate;
- an optimization process of optimizing a processing condition of at least one of the plurality of substrate processings based on the collected information on the at least two types of measurement and/or inspection results; and
- a transmission process of transmitting information on the optimized processing condition to an apparatus that performs the processing associated with the optimized substrate processing,
- wherein the plurality of substrate processings include a film formation processing of forming a film on the substrate, an exposure processing of forming a pattern on the substrate by liquid immersion exposure, a development processing to the substrate and an etching processing to the substrate,
- the information on the at least two types of measurement and/or inspection results includes first information on a measurement result of a size of a pattern on the substrate after the development processing and second information on a measurement result of a size of the pattern on the substrate after the etching processing,
- in the case the first information is normal and the second information is abnormal, information on a processing state of the etching processing is acquired and analyzed, and
- in the case the etching processing is judged not to be a factor of abnormality in the second information, at least one of a processing condition of the exposure processing and a processing condition of the liquid removal processing is optimized.

33. A substrate processing method, comprising:
an adjustment process of adjusting a processing condition of a substrate processing using the adjustment method according to claim 32.

34. An adjustment method in which a processing condition of a substrate processing from amongst a plurality of substrate processings that are performed in series and that include a measurement and/or inspection processing is adjusted, the method comprising:
- a collection process of collecting information on at least two types of measurement and/or inspection results obtained from at least one substrate;
- an optimization process of optimizing a processing condition of at least one of the plurality of substrate processings based on the collected information on the at least two types of measurement and/or inspection results; and
- a transmission process of transmitting information on the optimized processing condition to an apparatus that performs the processing associated with the optimized substrate processing,
- wherein the plurality of substrate processings include a film formation processing of forming a film on the substrate, an exposure processing of forming a pattern on the substrate by liquid immersion exposure, a postbake processing to the substrate, a development processing to the substrate and an etching processing to the substrate,
- the information on the at least two types of measurement and/or inspection results includes first information on a measurement and/or inspection result before the exposure processing of a film formed on the substrate by the film formation processing, and second information on a measurement result of variation in a size of a pattern on the substrate after the development processing or the etching processing, and
- based on correlativity between the first information and the second information and the change of the first information and the second information, at least one of a film formation/coating condition and a processing condition of the exposure processing is optimized.

35. A substrate processing method, comprising:
an adjustment process of adjusting a processing condition of a substrate processing using the adjustment method according to claim 34.

36. An adjustment method in which a processing condition of a substrate processing from amongst a plurality of substrate processings that are performed in series and that include a measurement and/or inspection processing is adjusted, the method comprising:
- a collection process of collecting information on at least two types of measurement and/or inspection results obtained from at least one substrate;
- an optimization process of optimizing a processing condition of at least one of the plurality of substrate processings based on the collected information on the at least two types of measurement and/or inspection results; and
- a transmission process of transmitting information on the optimized processing condition to an apparatus that performs the processing associated with the optimized substrate processing,
- wherein the plurality of substrate processings include a film formation processing of performing formation or coating of a film on the substrate, and an exposure processing of forming a pattern on the substrate by liquid immersion exposure,
- the information on the at least two types of measurement and/or inspection results includes first information on a measurement result of a processing parameter that is used for alignment of the substrate before the exposure processing, and second information on a measurement result of overlay of a pattern on the substrate after the development processing or the etching processing, and
- in the case the first information is normal and the second information is abnormal, a processing condition of an alignment processing of the substrate is optimized based on correlativity between the first information and second information.

37. A substrate processing method, comprising:
an adjustment process of adjusting a processing condition of a substrate processing using the adjustment method according to claim 36.

* * * * *